(12) United States Patent
Fukui et al.

(10) Patent No.: US 10,916,367 B2
(45) Date of Patent: Feb. 9, 2021

(54) CIRCUIT DEVICE AND POWER CONVERSION DEVICE

(71) Applicant: MITSUBISHI ELECTRIC CORPORATION, Tokyo (JP)

(72) Inventors: Kazuaki Fukui, Tokyo (JP); Koji Nakajima, Tokyo (JP); Shota Sato, Tokyo (JP); Kenta Fujii, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 387 days.

(21) Appl. No.: 16/069,681

(22) PCT Filed: Jan. 10, 2017

(86) PCT No.: PCT/JP2017/000403
§ 371 (c)(1),
(2) Date: Jul. 12, 2018

(87) PCT Pub. No.: WO2017/126357
PCT Pub. Date: Jul. 27, 2017

(65) Prior Publication Data
US 2019/0019618 A1 Jan. 17, 2019

(30) Foreign Application Priority Data

Jan. 21, 2016 (JP) .................................. 2016-010052

(51) Int. Cl.
*H01F 27/00* (2006.01)
*H01F 27/28* (2006.01)
(Continued)

(52) U.S. Cl.
CPC ......... *H01F 27/2876* (2013.01); *H01F 27/22* (2013.01); *H01F 27/2804* (2013.01);
(Continued)

(58) Field of Classification Search
CPC .. H01F 27/2876; H01F 27/22; H01F 27/2804; H01F 2027/2819;
(Continued)

(56) References Cited

U.S. PATENT DOCUMENTS 5,929,733 A * 7/1999 Anzawa ............. H01F 17/0013
336/200
6,000,128 A * 12/1999 Umeno ............... H01F 27/2804
29/605

(Continued)

FOREIGN PATENT DOCUMENTS

CN 204614643 U 9/2015
JP 2002-015927 A 1/2002

(Continued)

OTHER PUBLICATIONS

Office Action dated Apr. 23, 2020, issued in Chinese Patent Application No. 201780037770.5, 15 pages including 8 pages of English translation.

(Continued)

*Primary Examiner* — Anatoly Vortman
*Assistant Examiner* — Zhengfu J Feng
(74) *Attorney, Agent, or Firm* — Buchanan Ingersoll & Rooney PC

(57) ABSTRACT

A printed circuit board includes at least one of a first coil pattern disposed on a first main surface and a second coil pattern disposed on a second main surface. The first coil pattern includes a first portion arranged between a first core portion and a second core portion. The second coil pattern includes a third portion arranged between the first core portion and the second core portion. A first heat transfer member is mounted on at least one of the first portion and (Continued)

the third portion. Therefore, temperature increase of at least one of the first portion and the third portion can be suppressed.

18 Claims, 51 Drawing Sheets

(51) Int. Cl.
H01F 27/22 (2006.01)
H05K 1/02 (2006.01)
H05K 1/16 (2006.01)
H05K 7/14 (2006.01)
H02M 3/335 (2006.01)

(52) U.S. Cl.
CPC .......... H05K 1/0206 (2013.01); H05K 1/165 (2013.01); H05K 7/1427 (2013.01); H01F 2027/2809 (2013.01); H01F 2027/2819 (2013.01); H02M 3/33569 (2013.01)

(58) Field of Classification Search
CPC .......... H01F 2027/2809; H05K 1/0206; H05K 1/165; H05K 7/1427; H02M 3/33569
USPC ........................................................ 361/717
See application file for complete search history.

(56) References Cited

U.S. PATENT DOCUMENTS

| | | | |
|---|---|---|---|
| 2002/0003715 A1* | 1/2002 | Matsumoto | H01F 27/2804 363/147 |
| 2010/0164670 A1* | 7/2010 | Nakahori | H05K 1/165 336/200 |
| 2011/0102121 A1* | 5/2011 | Otsuka | H01F 27/06 336/192 |
| 2012/0161911 A1 | 6/2012 | Moiseev et al. | |
| 2012/0195005 A1* | 8/2012 | Asano | H01F 27/22 361/710 |
| 2015/0116963 A1* | 4/2015 | Hachiya | H01F 27/02 336/55 |
| 2016/0035481 A1* | 2/2016 | Hachiya | H05K 1/165 336/61 |
| 2018/0047497 A1* | 2/2018 | Miyakawa | H01F 17/06 |

FOREIGN PATENT DOCUMENTS

| | | |
|---|---|---|
| JP | 2008-4823 A | 1/2008 |
| JP | 2008-54449 A | 3/2008 |
| JP | 2010-109309 A | 5/2010 |
| JP | 2012-134424 A | 7/2012 |
| JP | 2012-156461 | 8/2012 |
| JP | 2013-150414 A | 8/2013 |
| JP | 2014-138079 A | 7/2014 |
| JP | 2014-192517 A | 10/2014 |
| JP | 2014-199908 A | 10/2014 |
| JP | 2014-199909 A | 10/2014 |
| JP | 2014-207406 A | 10/2014 |
| JP | 2015-133440 A | 7/2015 |

OTHER PUBLICATIONS

Office Action dated Sep. 25, 2019, by the Chinese Patent Office in corresponding Chinese Patent Application No. 201780006828.X and English translation of the Office Action. (16 pages).
International Search Report (Form PCT/ISA/210) dated Jun. 6, 2017, by the Japan Patent Office as the International Searching Authority for International Application No. PCT/JP2017/009795. (5 pages).
Written Opinion (Form PCT/ISA/237) dated Jun. 6, 2017, by the Japan Patent Office as the International Searching Authority for International Application No. PCT/JP2017/009795. (7 pages).
International Search Report (PCT/ISA/210) dated Mar. 21, 2017, by the Japan Patent Office as the International Searching Authority for International Application No. PCT/JP2017/000403.
Written Opinion (PCT/ISA/237) dated Mar. 21, 2017, by the Japan Patent Office as the International Searching Authority for International Application No. PCT/JP2017/000403.

* cited by examiner

CIRCUIT DEVICE AND POWER CONVERSION DEVICE

TECHNICAL FIELD

The present invention relates to a circuit device and a power conversion device.

BACKGROUND ART

Power conversion devices such as DC-DC converters have conventionally been known (see PTD 1). A power conversion device described in PTD 1 includes a circuit device including a printed circuit board provided with a coil pattern and a ferrite core. The core includes a first core portion and a second core portion. The coil pattern surrounds part of the core. Part of the coil pattern is arranged between the first core portion and the second core portion. The coil pattern is formed of a thin conductor layer. When large current flows through the coil pattern, the temperature of the coil pattern increases. The temperature increase of the coil pattern may degrade the characteristics of a component disposed in the vicinity of the coil pattern and cause malfunction of the component disposed in the vicinity of the coil pattern. Then, in the circuit device described in PTD 1, the coil pattern is thermally connected to a heat dissipator through thermal vias, thereby suppressing temperature increase of the coil pattern.

Part of the coil pattern, however, is arranged between the first core portion and the second core portion. The first core portion and the second core portion prevent this part of the coil pattern from being thermally connected to the heat dissipator through thermal vias. In the power conversion device described in PTD 1, it is therefore difficult to suppress temperature increase of the part of the coil pattern that is arranged between the first core portion and the second core portion.

CITATION LIST

Patent Document

PTD 1: Japanese Patent Laying-Open No. 2014-199909

SUMMARY OF INVENTION

Technical Problem

An object of the present invention is to provide a circuit device and a power conversion device in which temperature increase of a portion of a coil pattern that is arranged between a first core portion and a second core portion can be suppressed.

Solution to Problem

A circuit device and a power conversion device of the present invention includes a printed circuit board and a core. The printed circuit board has a first main surface and a second main surface opposite to the first main surface. The core includes a first core portion positioned over the first main surface and spaced away from the first main surface and a second core portion positioned over the second main surface and spaced away from the second main surface. The core includes a through portion passing between the first main surface and the second main surface. The printed circuit board includes at least one of a first coil pattern disposed on the first main surface and a second coil pattern disposed on the second main surface. The at least one of the first coil pattern and the second coil pattern surrounds the through portion of the core with half a turn or more. The first coil pattern includes a first portion arranged between the first core portion and the second core portion and a second portion exposed from at least one of the first core portion and the second core portion in a plain view from a direction vertical to the first main surface. The second coil pattern includes a third portion arranged between the first core portion and the second core portion and a fourth portion exposed from at least one of the first core portion and the second core portion in a plain view from a direction vertical to the second main surface. A first heat transfer member is disposed on at least one of the first portion and the third portion. The circuit device and the power conversion device of the present invention includes the first heat transfer member on the at least one of the first portion and the third portion. The first heat transfer member is mounted on the at least one of the first portion and the second portion. The first heat transfer member has a cross-sectional area larger than the at least one of the first portion and the third portion in a cross section crossing a direction in which current flows in the at least one of the first coil pattern and the second coil pattern.

Advantageous Effects of Invention

In the circuit device and the power conversion device of the present invention, the first heat transfer member has a cross-sectional area larger than at least one of the first portion and the third portion, in a cross section crossing a direction in which current flows in at least one of the first coil pattern and the second coil pattern. The first heat transfer member therefore has a lower electrical resistance and a lower thermal resistance than at least one of the first portion and the third portion. Heat generated in at least one of the first portion and the third portion can be suppressed. In addition, heat generated in at least one of the first portion and the third portion can be dissipated with low thermal resistance to the outside of the circuit device. In the circuit device and the power conversion device according to the present invention, temperature increase of at least one of the first portion and the third portion can be suppressed.

DESCRIPTION OF EMBODIMENTS

Figure 1:
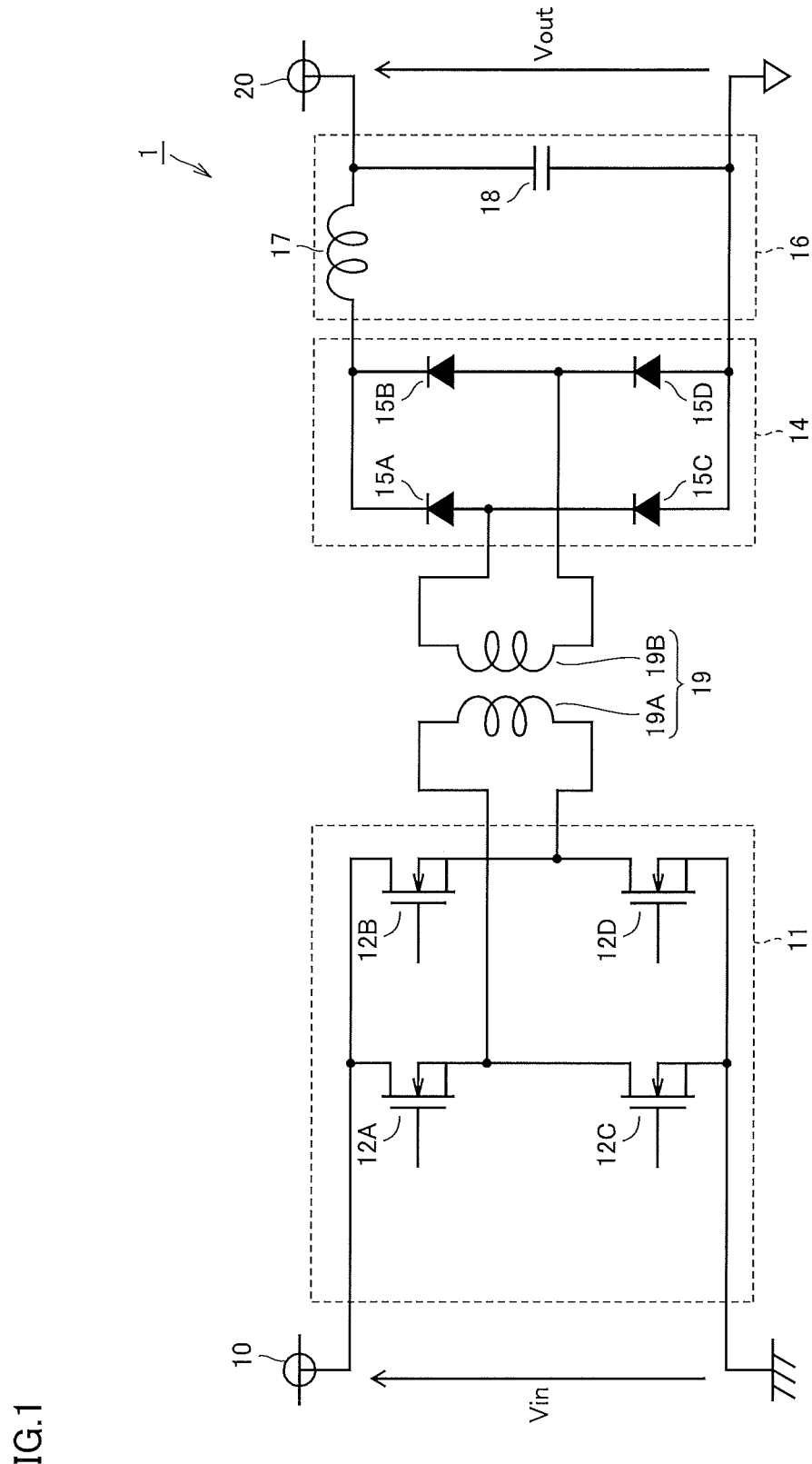
FIG. 1 is a circuit diagram of a power conversion device according to a first embodiment of the present invention.

Embodiments of the present invention will be described below. It is noted that the same components are denoted with the same reference numerals and a description thereof will not be repeated.

First Embodiment

Referring to FIG. 1, an exemplary circuit configuration of a power conversion device 1 of the present embodiment will be described. Power conversion device 1 of the present embodiment may be a DC-DC converter for automobiles. Power conversion device 1 includes an input terminal 10, an inverter circuit 11 connected to input terminal 10, a transformer 19 connected to inverter circuit 11, a rectifying circuit 14 connected to transformer 19, a smoothing circuit 16 connected to rectifying circuit 14, and an output terminal 20 connected to smoothing circuit 16.

Inverter circuit 11 includes primary-side switching elements 12A, 12B, 12C, 12D. Transformer 19 is configured with a primary-side coil conductor 19A connected to inverter circuit 11 and a secondary-side coil conductor 19B magnetically coupled to primary-side coil conductor 19A. Secondary-side coil conductor 19B is connected to rectifying circuit 14. Rectifying circuit 14 includes secondary-side switching elements 15A, 15B, 15C, 15D. Smoothing circuit 16 includes a smoothing coil 17 and a capacitor 18. Primary-side switching elements 12A, 12B, 12C, 12D and secondary-side switching elements 15A, 15B, 15C, 15D may be, for example, MOSFETs (Metal Oxide Semiconductor Field Effect Transistors), IGBTs (Insulated Gate Bipolar Transistors), or rectifying elements, such as diodes.

Power conversion device 1 of the present embodiment may convert, for example, DC (direct current) voltage of about 100 V to about 600 V input to input terminal 10 into DC voltage of about 12 V to about 16 V and output the converted voltage from output terminal 20. Specifically, a high DC voltage input to input terminal 10 is converted by inverter circuit 11 into a first AC (alternating current) voltage. The first AC voltage is converted by transformer 19 into a second AC voltage lower than the first AC voltage. The second AC voltage is rectified by rectifying circuit 14. Smoothing circuit 16 smooths the voltage output from rectifying circuit 14 and outputs a low DC voltage to output terminal 20.

Figure 2:
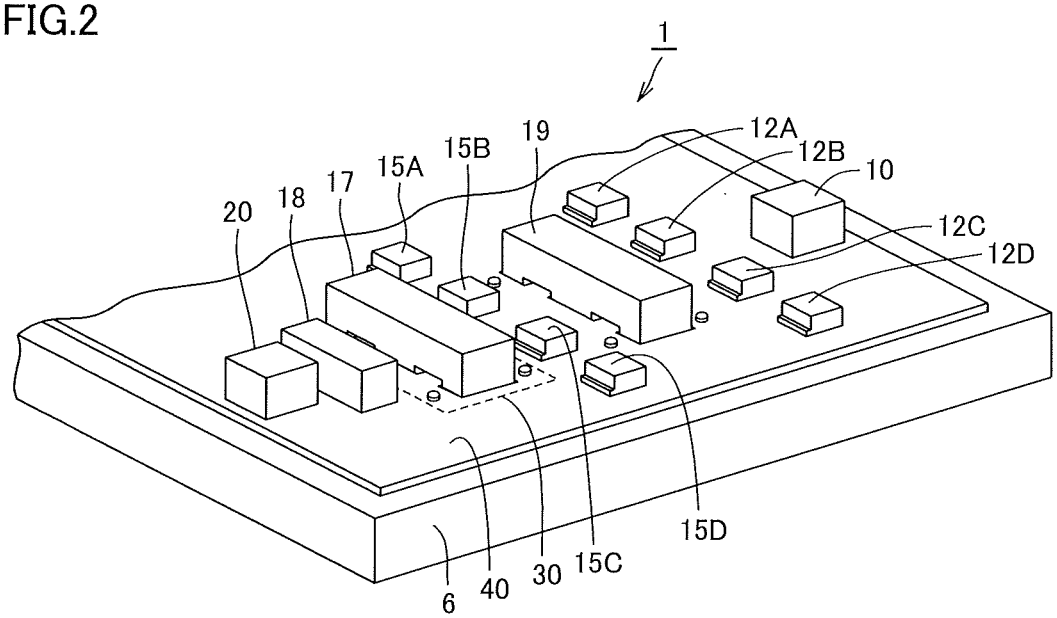
FIG. 2 is a schematic perspective view of the power conversion device according to the first embodiment of the present invention.

Referring to FIG. 2, an exemplary structure of power conversion device 1 of the present embodiment will be described. Input terminal 10, primary-side switching elements 12A, 12B, 12C, 12D, transformer 19, secondary-side switching elements 15A, 15B, 15C, 15D, smoothing coil 17, capacitor 18, and output terminal 20 are mounted on a printed circuit board 40. A region of power conversion device 1 that includes smoothing coil 17 may be a circuit device 30 of the present embodiment. Printed circuit board 40 is installed on a heat dissipator 6. Heat dissipator 6 may form a part of a housing accommodating printed circuit board 40 or may not form a part of the housing. Power conversion device 1 including circuit device 30 may be covered with a lid (not shown) that forms a part of the housing accommodating printed circuit board 40.

Referring to FIG. 3 to FIG. 15, circuit device 30 of the present embodiment will be described. Circuit device 30 of the present embodiment mainly includes printed circuit board 40 and a core 45. Printed circuit board 40 includes at least one of a first coil pattern 50 and a second coil pattern 55. Circuit device 30 of the present embodiment mainly includes at least one of first heat transfer members 70, 71 and first heat transfer members 73, 74. Circuit device 30 of the present embodiment may further include a third coil pattern 60, heat dissipator 6, and second heat transfer members 80, 80a. Printed circuit board 40 may further include thermal vias 81, 82, 83a, 83b, 84a, 84b.

Printed circuit board 40 has a first main surface 40a and a second main surface 40b on the opposite side to first main surface 40a. Printed circuit board 40 may be a multilayer board including a multilayered coil pattern (first coil pattern 50, second coil pattern 55, a first internal coil pattern 61, a second internal coil pattern 65). In the present embodiment, coil patterns of four layers including first coil pattern 50, first internal coil pattern 61, second internal coil pattern 65, and second coil pattern 55 are layered in printed circuit board 40. In the present embodiment, printed circuit board 40 is a four-layer board. Printed circuit board 40 may be a glass epoxy board, such as FR-4 board.

In the present embodiment, printed circuit board 40 may include a first base layer 40c, a second base layer 40d, and a third base layer 40e. First base layer 40c may be thinner than second base layer 40d. Forming first base layer 40c thinner than second base layer 40d may reduce thermal resistance of printed circuit board 40 (first base layer 40c) between first internal coil pattern 61 and first coil pattern 50. Third base layer 40e may be thinner than second base layer 40d. Forming third base layer 40e thinner than second base layer 40d may reduce thermal resistance of printed circuit board 40 (third base layer 40e) between second internal coil pattern 65 and second coil pattern 55.

Printed circuit board 40 may have a first through hole 41, a second through hole 42, and a third through hole 43 passing between first main surface 40a and second main surface 40b. First through hole 41 receives a first leg 47a of second core portion 47. Second through hole 42 receives a second leg 47b of second core portion 47. Third through hole 43 receives a third leg 47c of second core portion 47. Printed circuit board 40 may have holes 40h, 40i, 40j, 40k passing between first main surface 40a and second main surface 40b. Hole 40h receives a mounting member 77a. Hole 40i receives a mounting member 77b. Hole 40j receives a mounting member 77c. Hole 40k receives a mounting member 77d.

Core 45 includes a first core portion 46 and a second core portion 47. First core portion 46 is positioned over first main surface 40a of printed circuit board 40 and is spaced away from first main surface 40a. Second core portion 47 is positioned over second main surface 40b of printed circuit board 40 and is spaced away from second main surface 40b. A part of printed circuit board 40 is arranged between first core portion 46 and second core portion 47. First core portion 46 is fitted in a first concave portion 6e of heat dissipator 6. Second core portion 47 may be disposed on first core portion 46. Core 45 may be an EI core. First core portion 46 may be I-shaped, and second core portion 47 may be E-shaped. Core 45 may be an EE, U, EER, or ER core. Second core portion 47 may be pressed toward first core portion 46 by a lid (not shown) or a pressure member (not shown), such as a spring, mounted on a post supporting the lid. First core portion 46 and second core portion 47 may be formed of ferrite or may be formed of a magnetic material other than ferrite.

In the present embodiment, second core portion 47 may have first leg 47a, second leg 47b, and third leg 47c. Second leg 47b may be positioned between first leg 47a and third leg 47c. First leg 47a of second core portion 47 may pass through first through hole 41 from the second main surface 40b side. Second leg 47b of second core portion 47 may pass through second through hole 42 from the second main surface 40b side. Third leg 47c of second core portion 47 may pass through third through hole 43 from the second main surface 40b side. Core 45 includes a through portion (47b) passing between first main surface 40a and second main surface 40b. Through portion (47b) of core 45 may be second leg 47b of second core portion 47. First leg 47a and third leg 47c of second core portion 47 may be in contact with the main surface of first core portion 46. Second leg 47b of second core portion 47 may be in contact with the main surface of first core portion 46. Second leg 47b may have a length equal to first leg 47a and third leg 47c or may have a length shorter than first leg 47a and third leg 47c.

Referring to FIG. 6 to FIG. 8 and FIG. 13, first coil pattern 50 is disposed on first main surface 40a of printed circuit board 40. First coil pattern 50 is formed of a thin conductor layer having a thickness of about 100 μm. First coil pattern 50 is formed of a material having a lower electrical resistivity and a lower thermal resistivity than first base layer 40c, second base layer 40d, and third base layer 40e of printed circuit board 40. First coil pattern 50 may be formed of, for example, copper.

First coil pattern 50 surrounds a part of core 45. Specifically, first coil pattern 50 surrounds the through portion (47b) of core 45. "First coil pattern 50 surrounds the through portion (47b) of core 45" means that first coil pattern 50 is wound around the through portion (47b) of core 45 with half a turn or more. In the present embodiment, first coil pattern 50 is wound around the through portion (47b) of core 45 with about one turn.

First coil pattern 50 includes a first portion 51 arranged between first core portion 46 and second core portion 47. First coil pattern 50 includes a second portion 52 exposing from at least one of first core portion 46 and second core portion 47 in a plain view from a direction vertical to first main surface 40a. Second portion 52 of first coil pattern 50 may be exposed from first core portion 46 and second core portion 47 in a plain view from a direction vertical to first main surface 40a. Second portion 52 of first coil pattern 50 may be a portion that is not arranged between first core portion 46 and second core portion 47.

Referring to FIG. 5, FIG. 6, and FIG. 11 to FIG. 13, second coil pattern 55 is disposed on second main surface 40b of printed circuit board 40. Second coil pattern 55 is formed of a thin conductor layer having a thickness of about 100 μm. Second coil pattern 55 is formed of a material having a lower electrical resistivity and a lower thermal resistivity than first base layer 40c, second base layer 40d, and third base layer 40e of printed circuit board 40. Second coil pattern 55 may be formed of, for example, copper.

Second coil pattern 55 surrounds a part of core 45. Specifically, second coil pattern 55 surrounds the through portion (47b) of core 45. "Second coil pattern 55 surrounds the through portion (47b) of core 45" means that second coil pattern 55 is wound around the through portion (47b) of core 45 with half a turn or more. In the present embodiment, second coil pattern 55 is wound around the through portion (47b) of core 45 with about one turn. In a plain view from a direction vertical to first main surface 40a of printed circuit board 40, at least a part of second coil pattern 55 may overlap first coil pattern 50.

Second coil pattern 55 includes a third portion 56 arranged between first core portion 46 and second core portion 47. Second coil pattern 55 includes a fourth portion 57 exposing from at least one of first core portion 46 and second core portion 47 in a plain view from a direction vertical to second main surface 40b. Fourth portion 57 of second coil pattern 55 may be exposed from first core portion 46 and second core portion 47 in a plain view from a direction vertical to second main surface 40b. Fourth portion 57 of second coil pattern 55 may be a portion that is not arranged between first core portion 46 and second core portion 47.

Referring to FIG. 6, FIG. 9, FIG. 10, and FIG. 13, third coil pattern 60 may be disposed inside printed circuit board 40. Third coil pattern 60 may be formed with a plurality of coil patterns (first internal coil pattern 61, second internal coil pattern 65) layered on each other. Third coil pattern 60 may include a first internal coil pattern 61 and a second internal coil pattern 65. First internal coil pattern 61 and second internal coil pattern 65 are each formed of a thin conductor layer having a thickness of about 100 μm. First internal coil pattern 61 and second internal coil pattern 65 are formed of a material having a lower electrical resistivity and a lower thermal resistivity than first base layer 40c, second base layer 40d, and third base layer 40e of printed circuit board 40. First internal coil pattern 61 and second internal coil pattern 65 may be formed of, for example, copper.

Each of first internal coil pattern 61 and second internal coil pattern 65 that constitute third coil pattern 60 surrounds a part of core 45. Specifically, each of first internal coil pattern 61 and second internal coil pattern 65 that constitute third coil pattern 60 surrounds the through portion (47b) of core 45. "Each of first internal coil pattern 61 and second internal coil pattern 65 surrounds the through portion (47b) of core 45" means that each of first internal coil pattern 61 and second internal coil pattern 65 is wound around the through portion (47b) of core 45 with half a turn or more. In the present embodiment, each of first internal coil pattern 61 and second internal coil pattern 65 is wound around the through portion (47b) of core 45 with about one turn. In a plain view from a direction vertical to first main surface 40a of printed circuit board 40, at least a part of third coil pattern 60 may overlap first coil pattern 50 and second coil pattern 55. First coil pattern 50, second coil pattern 55, and third coil pattern 60 are layered on each other.

Figure 6:
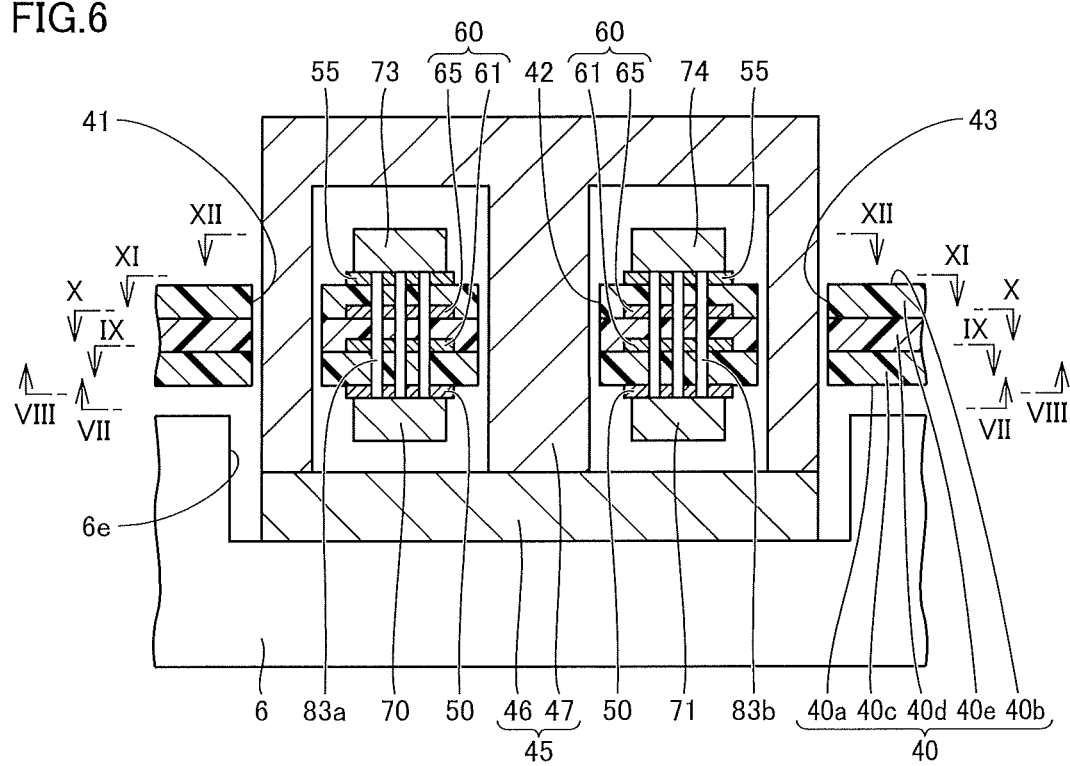
FIG. 6 is a schematic cross-sectional view taken along line VI-VI shown in FIG. 5 of the circuit device according to the first embodiment of the present invention.
Figure 7:
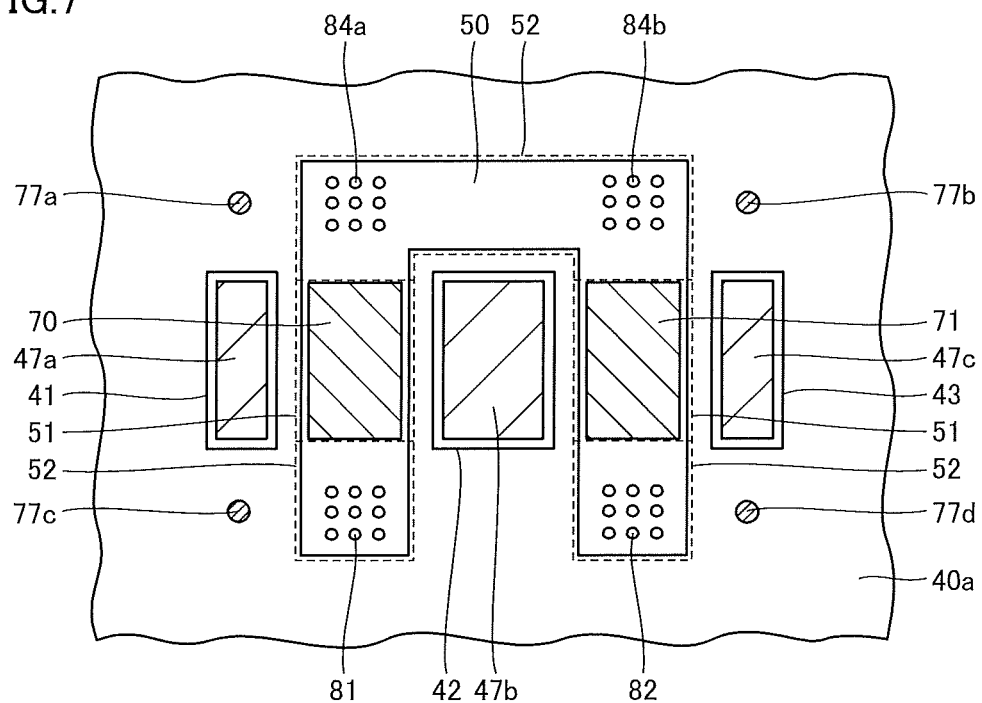
FIG. 7 is a schematic cross-sectional view taken along line VII-VII shown in FIG. 6 of the circuit device according to the first embodiment of the present invention.
Figure 8:
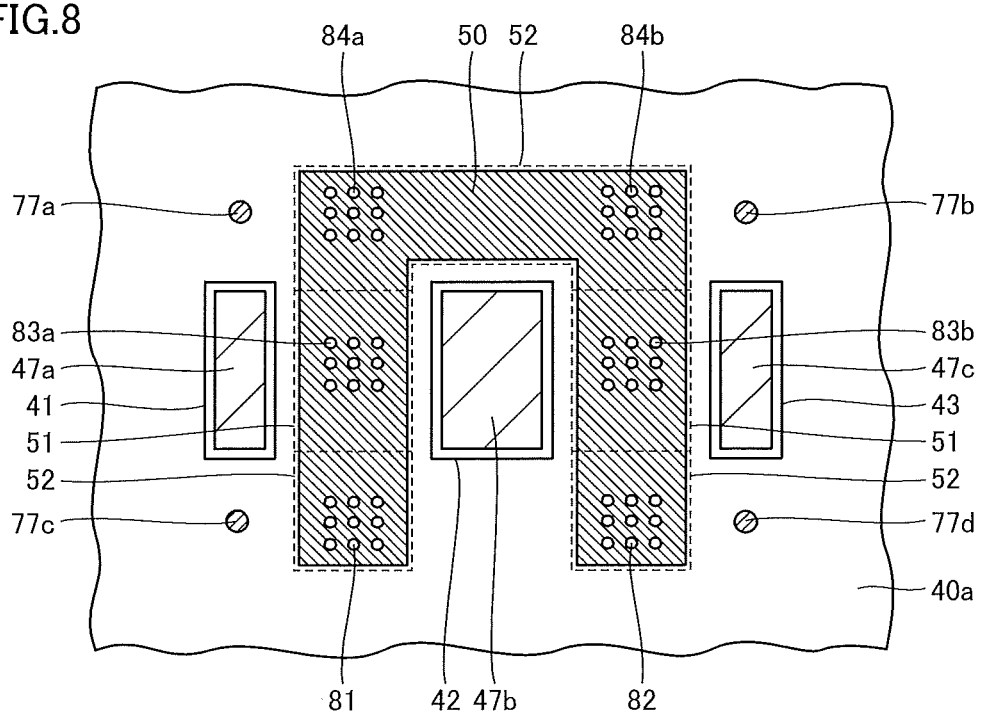
FIG. 8 is a schematic cross-sectional view taken along line VIII-VIII shown in FIG. 6 of the circuit device according to the first embodiment of the present invention.
Figure 9:
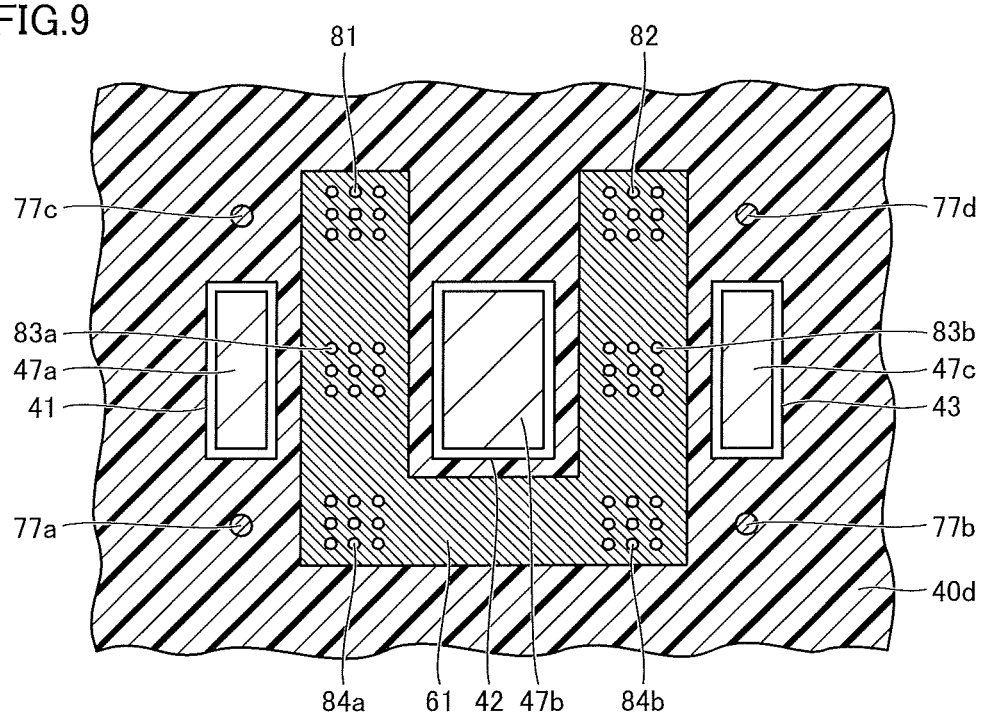
FIG. 9 is a schematic cross-sectional view taken along line IX-IX shown in FIG. 6 of the circuit device according to the first embodiment of the present invention.
Figure 10:
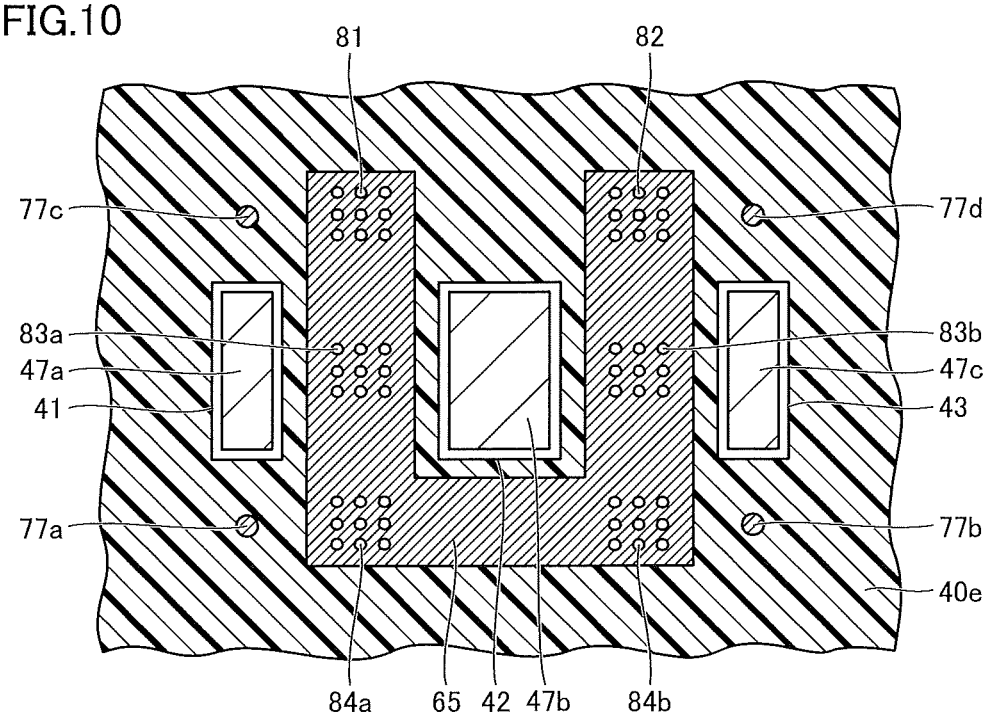
FIG. 10 is a schematic cross-sectional view taken along line X-X shown in FIG. 6 of the circuit device according to the first embodiment of the present invention.
Figure 11:
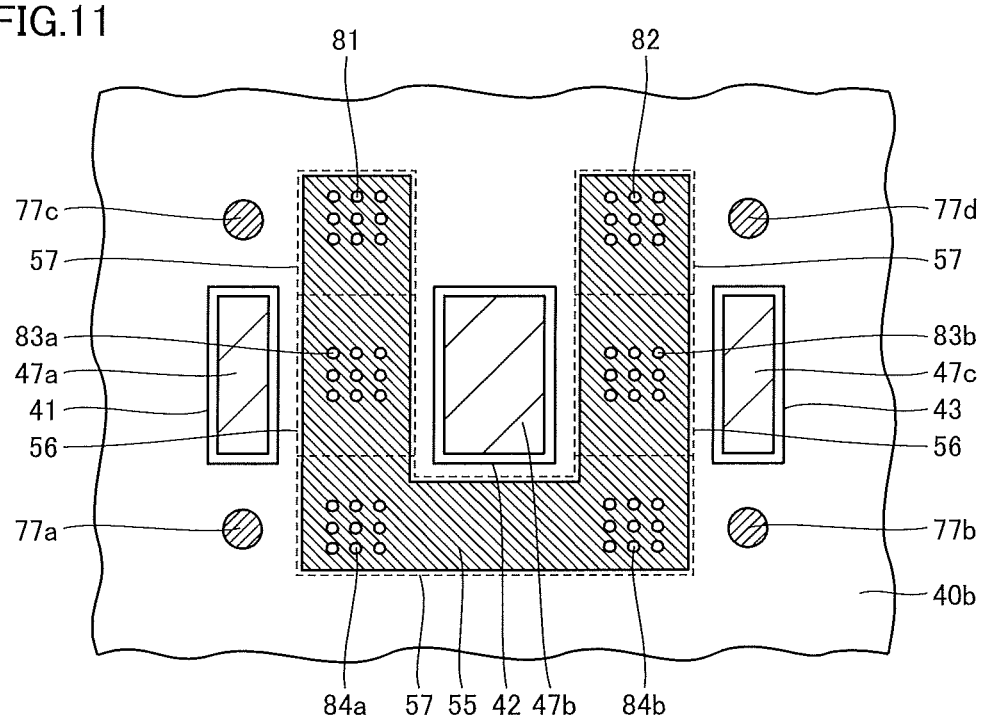
FIG. 11 is a schematic cross-sectional view taken along line XI-XI shown in FIG. 6 of the circuit device according to the first embodiment of the present invention.
Figure 13:
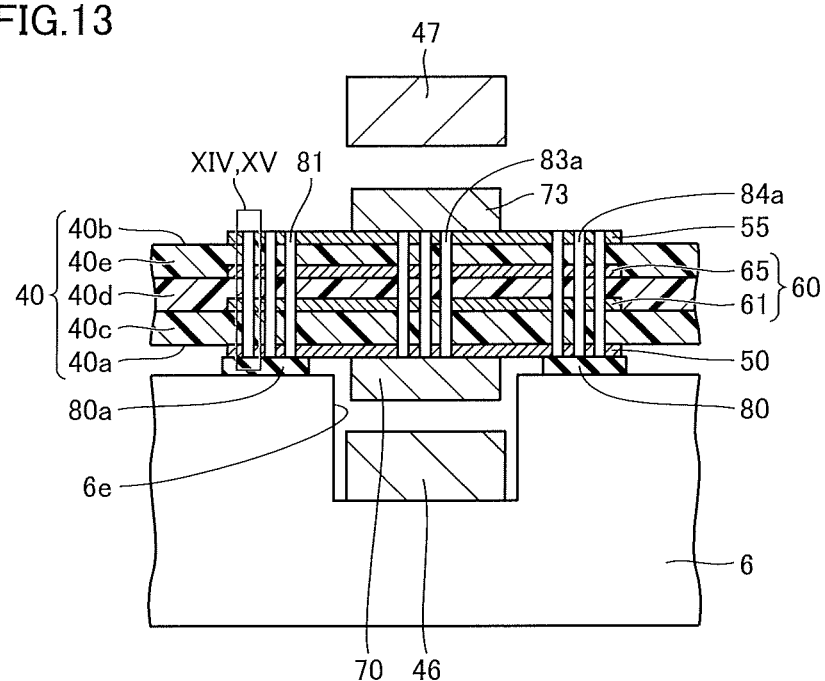
FIG. 13 is a schematic cross-sectional view taken along line XIII-XIII shown in FIG. 5 of the circuit device according to the first embodiment of the present invention.

Referring to FIG. 6, FIG. 7, and FIG. 13, first heat transfer members 70, 71 are disposed on first portion 51 of first coil pattern 50. Specifically, first heat transfer members 70, 71 may be mounted on first portion 51 of first coil pattern 50 using solder or conductive adhesive material. First heat transfer members 70, 71 may have a rectangular parallelepiped shape. First heat transfer members 70, 71 each may be mounted on first portion 51 of first coil pattern 50 using solder or conductive adhesive material at both ends or the center thereof. First heat transfer members 70, 71 are electrically and thermally connected to first portion 51 of first coil pattern 50. First heat transfer members 70, 71 have an electrical resistance and a thermal resistance lower than first portion 51 of first coil pattern 50. The electrical resistance of first heat transfer members 70, 71 may be one half or less, preferably one-fifth or less, further preferably one-tenth or less the electrical resistance of first portion 51 of first coil pattern 50. The thermal resistance of first heat transfer members 70, 71 is one half or less, preferably one-fifth or less, further preferably one-tenth or less the thermal resistance of first portion 51 of first coil pattern 50.

First heat transfer members 70, 71 may be made of metal, such as copper or copper alloy, and have a rectangular parallelepiped shape. First heat transfer members 70, 71 may have a cross-sectional area larger than first portion 51 of first coil pattern 50 in a cross section orthogonal to the longitudinal direction of first coil pattern 50. In the present description, the longitudinal direction of first coil pattern 50 means the direction in which current flows in first coil pattern 50. The cross-sectional area of first heat transfer members 70, 71 may be twice or more, preferably five times or more, further preferably 10 times or more the cross-sectional area of first portion 51 of first coil pattern 50. First heat transfer members 70, 71 may have a width equal to or smaller than the width of first coil pattern 50 (the length in the lateral direction of first coil pattern 50). The width of first heat transfer members 70, 71 may be 30% or more, preferably 50% or more, further preferably 70% or more of the width of first portion 51 of first coil pattern 50. First heat transfer member 70 may be disposed between thermal via 81 and thermal via 84a. First heat transfer member 71 may be disposed between thermal via 82 and thermal via 84b. First heat transfer members 70, 71 may be accommodated in first concave portion 6e of heat dissipator 6.

Figure 12:
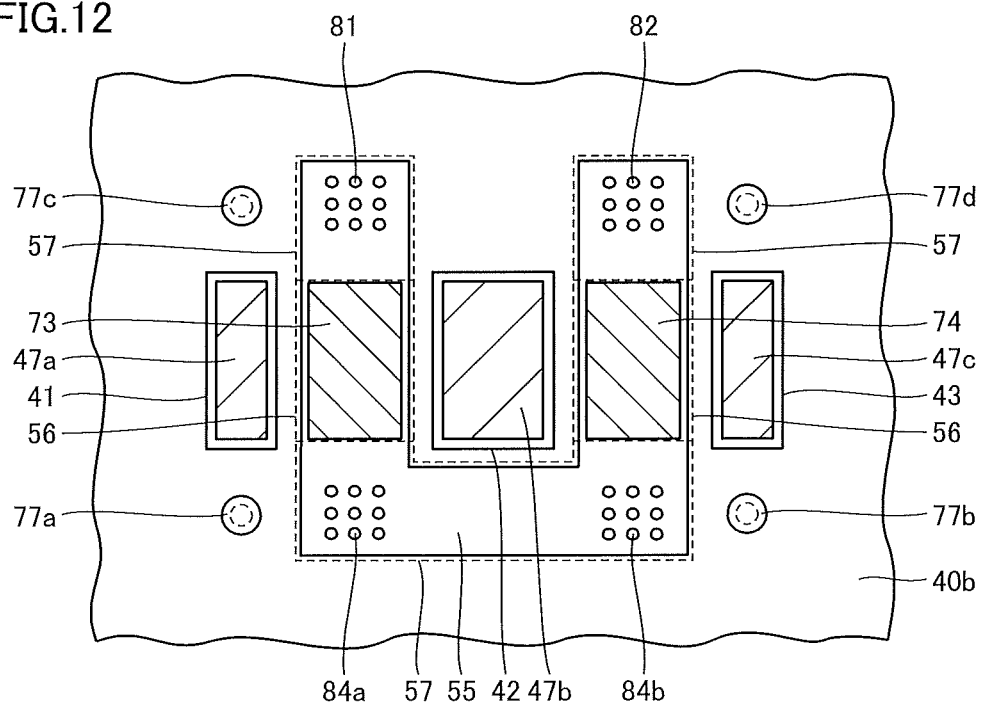
FIG. 12 is a schematic cross-sectional view taken along line XII-XII shown in FIG. 6 of the circuit device according to the first embodiment of the present invention.

Referring to FIG. 6, FIG. 12, and FIG. 13, first heat transfer members 73, 74 are disposed on third portion 56 of second coil pattern 55. Specifically, first heat transfer members 73, 74 may be mounted on third portion 56 of second coil pattern 55 using solder or conductive adhesive material. First heat transfer members 73, 74 may have a rectangular parallelepiped shape. First heat transfer members 73, 74 each may be mounted on third portion 56 of second coil pattern 55 using solder or conductive adhesive material at both ends and the center thereof. First heat transfer members 73, 74 are electrically and thermally connected to third portion 56 of second coil pattern 55. First heat transfer members 73, 74 have an electrical resistance and a thermal resistance lower than third portion 56 of second coil pattern 55. The electrical resistance of first heat transfer members 73, 74 may be one half or less, preferably one-fifth or less, further preferably one-tenth or less the electrical resistance of third portion 56 of second coil pattern 55. The thermal resistance of first heat transfer members 73, 74 may be one half or less, preferably one-fifth or less, further preferably one-tenth or less the thermal resistance of third portion 56 of second coil pattern 55.

First heat transfer members 73, 74 may be made of metal, such as copper or copper alloy, and have a rectangular parallelepiped shape. First heat transfer members 73, 74 may have a cross-sectional area larger than third portion 56 of second coil pattern 55 in a cross section crossing the longitudinal direction of second coil pattern 55. The cross-sectional area of first heat transfer members 73, 74 may be twice or more, preferably five times or more, further preferably 10 times or more the cross-sectional area of third portion 56 of second coil pattern 55. First heat transfer members 73, 74 may have a width equal to or smaller than the width (the length in the lateral direction of second coil pattern 55) of second coil pattern 55. The width of first heat transfer members 73, 74 may be 30% or more, preferably 50% or more, further preferably 70% or more of the width of third portion 56 of second coil pattern 55. First heat transfer member 73 may be disposed between thermal via 81 and thermal via 84a. First heat transfer member 74 may be disposed between thermal via 82 and thermal via 84b.

First heat transfer members 70, 71, 73, 74 may be formed of metal, such as copper or copper alloy, or carbon. First heat transfer members 70, 71, 73, 74 may be formed of a member having high electrical conductivity, high thermal conductivity, and high rigidity, such as a copper plate. First heat transfer members 70, 71, 73, 74 may have a thermal conductivity of 60 W/(m·K) or higher. First heat transfer members 70, 71, 73, 74 may have an electrical resistivity of $7 \times 10^{-8}$ Ω·m or lower. First heat transfer members 70, 71, 73, 74 may have a coating film of enamel, polyurethane, or the like on their surfaces. The coating film of enamel, polyurethane, or the like protects first heat transfer members 70, 71, 73, 74. This coating film may be partially removed, then first heat transfer members 70, 71 may be soldered to first coil pattern 50, and first heat transfer members 73, 74 may be soldered to second coil pattern 55. First heat transfer members 70, 71, 73, 74 are spaced away from core 45 and heat dissipator 6 and may be electrically insulated from core 45 and heat dissipator 6.

Figure 3:
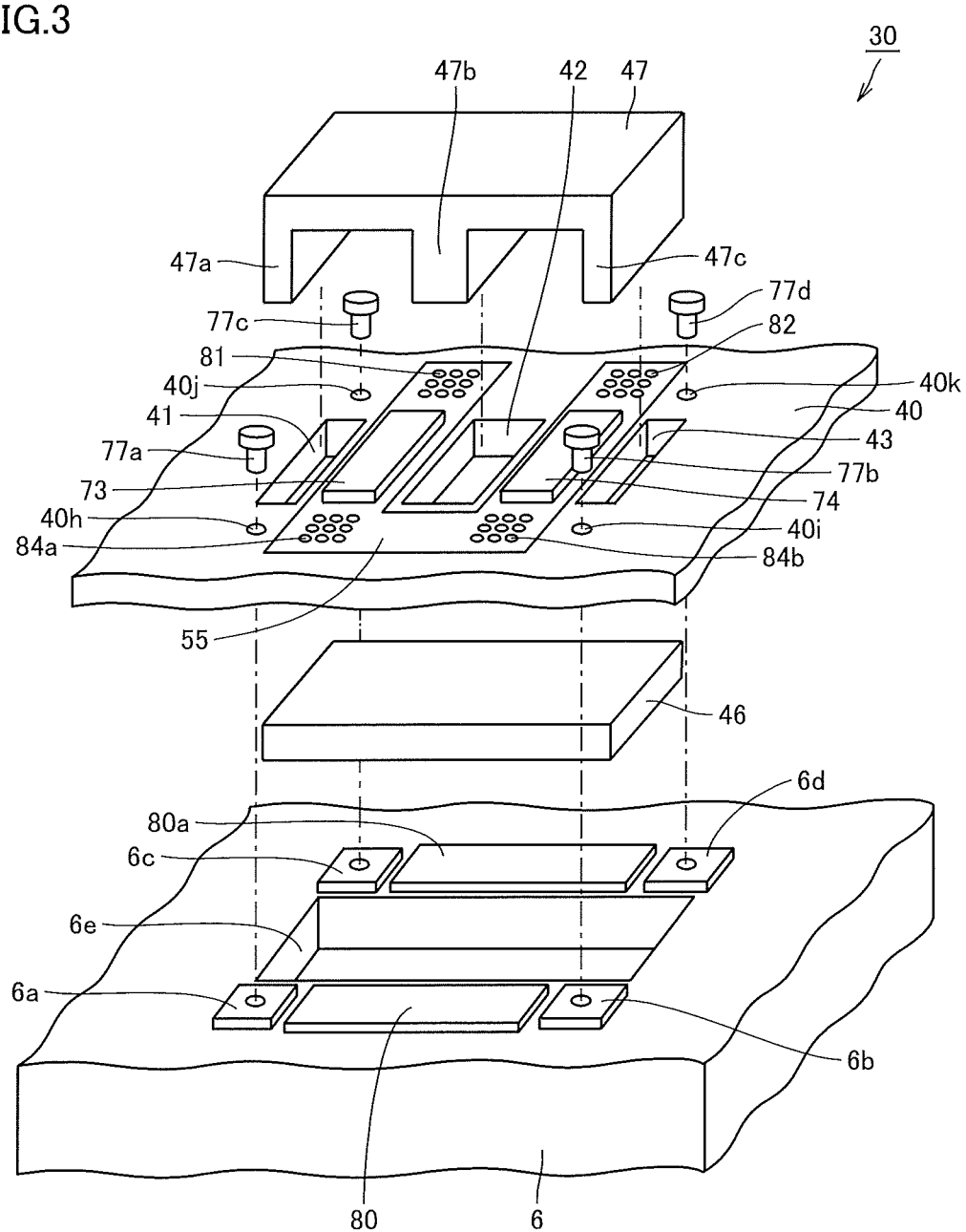
FIG. 3 is a schematic perspective view of a circuit device according to the first embodiment of the present invention.
Figure 4:
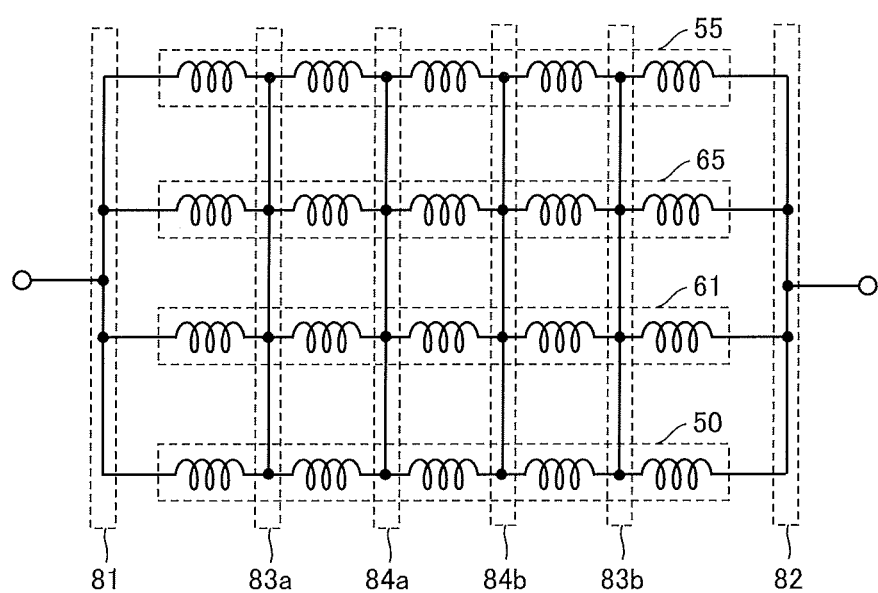
FIG. 4 is a coil connection diagram of the circuit device according to the first embodiment of the present invention.
Figure 5:
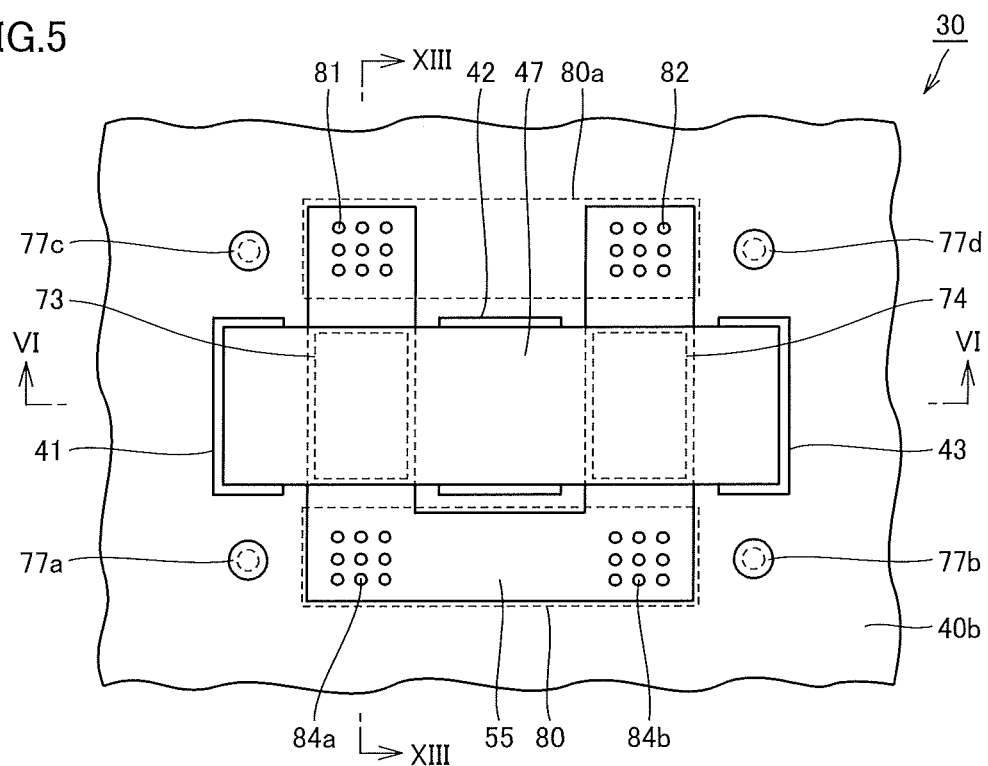
FIG. 5 is a schematic plan view of the circuit device according to the first embodiment of the present invention.

Referring to FIG. 3, FIG. 6, and FIG. 13, circuit device 30 of the present embodiment may include heat dissipator 6. Heat dissipator 6 may be thermally connected to first coil pattern 50. Heat dissipator 6 may be formed of a metal material, such as iron, aluminum, iron alloy, or aluminum alloy. Preferably, heat dissipator 6 may be formed of a high thermal conductive material, such as aluminum or aluminum alloy. Heat dissipator 6 is thermally connected to first coil pattern 50. Specifically, second heat transfer members 80, 80a are in surface contact with first coil pattern 50. Heat dissipator 6 is in surface contact with second heat transfer members 80, 80a. Heat dissipator 6 is thus connected to first coil pattern 50 with low thermal resistance through second heat transfer members 80, 80a. When heat dissipator 6 is made of a material having electrical insulation properties, heat dissipator 6 may be in direct contact with first coil pattern 50.

Heat dissipator 6 may be thermally connected to second coil pattern 55 and third coil pattern 60. Specifically, thermal vias 81, 82, 83a, 83b, 84a, 84b thermally connect second coil pattern 55 and third coil pattern 60 to second heat transfer members 80, 80a. Heat dissipator 6 is in surface contact with second heat transfer members 80, 80a. Heat dissipator 6 thus may be connected to second coil pattern 55 and third coil pattern 60 with a low thermal resistance through thermal vias 81, 82, 83a, 83b, 84a, 84b and second heat transfer members 80, 80a.

Printed circuit board 40 may be mounted on heat dissipator 6 using mounting members 77a, 77b, 77c, 77d. Heat dissipator 6 may include convex portions 6a, 6b, 6c, 6d. Convex portions 6a, 6b, 6c, 6d may ensure electrical insulation between heat dissipator 6 and a portion of printed circuit board 40 in which convex portions 6a, 6b, 6c, 6d are not disposed. Convex portions 6a, 6b, 6c, 6d may have respective holes receiving mounting members 77a, 77b, 77c, 77d. Mounting members 77a, 77b, 77c, 77d may respectively pass through holes 40h, 40i, 40j, 40k of printed circuit board 40 and be respectively received by the holes in convex portions 6a, 6b, 6c, 6d.

Mounting members 77a, 77b, 77c, 77d may be, for example, screws or rivets. Mounting members 77a and 77b may be disposed along the longitudinal direction of second heat transfer member 80 such that second heat transfer member 80 is arranged therebetween. Mounting members 77a and 77b may be disposed along the longitudinal direction of first coil pattern 50 such that second portion 52 of first coil pattern 50 is arranged therebetween. Mounting members 77a and 77b may be arranged along the longitudinal direction of first coil pattern 50 such that the central portion in the longitudinal direction of first coil pattern 50 is arranged therebetween. Mounting member 77a may be disposed adjacent to thermal via 84a. Mounting member 77b may be disposed adjacent to thermal via 84b.

Mounting members 77c and 77d may be disposed along the longitudinal direction of second heat transfer member 80a such that second heat transfer member 80a is arranged therebetween. Mounting member 77c may be disposed adjacent to thermal via 81. Mounting member 77c may be disposed adjacent to one end portion of first coil pattern 50. Mounting member 77c may be disposed adjacent to one end portion of second coil pattern 55. Mounting member 77d may be disposed adjacent to thermal via 82. Mounting member 77d may be disposed adjacent to the other end portion of first coil pattern 50. Mounting member 77d may be disposed adjacent to the other end portion of second coil pattern 55.

The shortest distance from mounting members 77a, 77b, 77c, 77d to each of first coil pattern 50, second coil pattern 55, and third coil pattern 60 may be 0.5 mm to 1.0 mm. Mounting members 77a, 77b, 77c, 77d are spaced away from first coil pattern 50, second coil pattern 55, third coil pattern 60, and first heat transfer members 70, 71, 73, 74 and may be electrically insulated from first coil pattern 50, second coil pattern 55, third coil pattern 60, and first heat transfer members 70, 71, 73, 74.

Referring to FIG. 3 and FIG. 5 to FIG. 13, circuit device 30 of the present embodiment may include second heat transfer members 80, 80a having electrical insulation properties between heat dissipator 6 and first coil pattern 50. Second heat transfer members 80, 80a may be in surface contact with heat dissipator 6 and second portion 52 of first coil pattern 50. Second heat transfer members 80, 80a electrically insulate second portion 52 of first coil pattern 50 exposed from core 45, from heat dissipator 6. Second heat transfer members 80, 80a transfer heat generated in first coil pattern 50 to heat dissipator 6 with low thermal resistance.

Second heat transfer members 80, 80a have a thermal conductivity higher than first base layer 40c, second base layer 40d, and third base layer 40e of printed circuit board 40. The thermal conductivity of second heat transfer members 80, 80a may be preferably twice or more, further preferably four times or more the thermal conductivity of first base layer 40c, second base layer 40d, and third base layer 40e of printed circuit board 40. When printed circuit board 40 is mounted on heat dissipator 6, second heat transfer members 80, 80a may be crushed by printed circuit board 40. Second heat transfer members 80, 80a crushed by printed circuit board 40 have an even lower thermal resistance. Second heat transfer members 80, 80a may be silicone rubber sheets.

Second heat transfer member 80 may extend along the longitudinal direction of first coil pattern 50 on second portion 52 of first coil pattern 50. Second portion 52 of first coil pattern 50 having second heat transfer member 80 disposed thereon may be the central portion in the longitudinal direction of first coil pattern 50. Second heat transfer member 80 may be positioned between mounting member 77a and mounting member 77b. Second heat transfer member 80a may extend so as to connect both ends of first coil pattern 50 at which thermal vias 81, 82 are positioned. Second heat transfer member 80a may be positioned between mounting member 77c and mounting member 77d.

Figure 14:
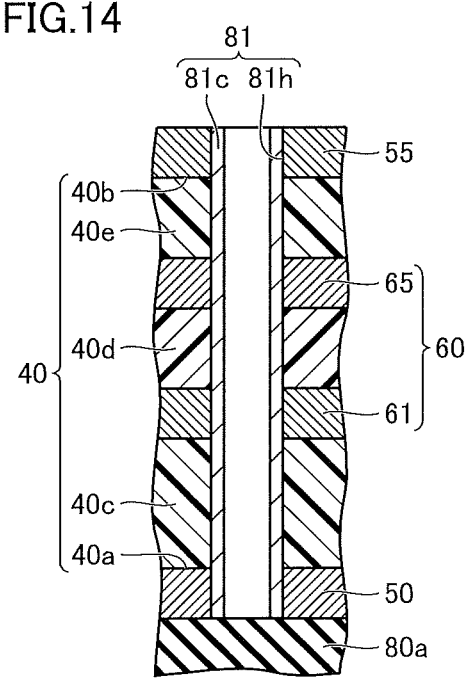
FIG. 14 is a schematic enlarged cross-sectional view of a region XIV shown in FIG. 13 of the circuit device according to the first embodiment of the present invention.

Referring to FIG. 3 and FIG. 5 to FIG. 13, in circuit device 30 of the present embodiment, printed circuit board 40 may include thermal vias 81, 82, 83a, 83b, 84a, 84b. Thermal vias 81, 82, 83a, 83b, 84a, 84b have a thermal conductivity higher than first base layer 40c, second base layer 40d, and third base layer 40e of printed circuit board 40. Referring to FIG. 14, thermal via 81 may include a through hole 81h passing between first main surface 40a and second main surface 40b of printed circuit board 40 and a heat transfer film 81c on the surface of through hole 81h.

Figure 15:
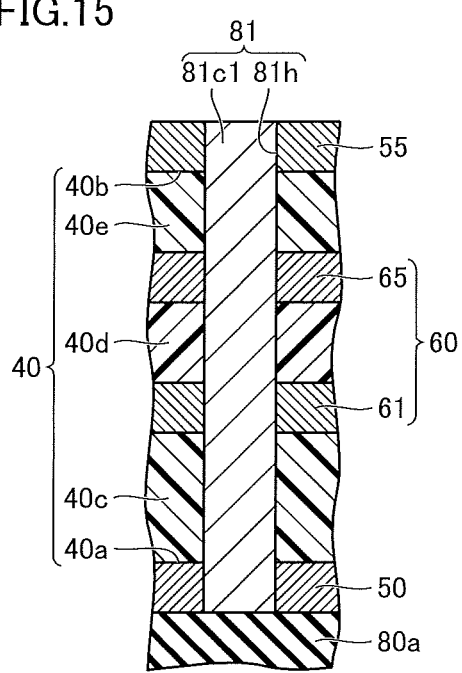
FIG. 15 is a schematic enlarged cross-sectional view of a region XV shown in FIG. 13 of the circuit device according to the first embodiment of the present invention.

Referring to FIG. 15, thermal via 81 may include through hole 81h passing between first main surface 40a and second main surface 40b of printed circuit board 40 and a heat transfer element 81c1 filled in through hole 81h. Heat transfer film 81c and heat transfer element 81c1 have a thermal conductivity higher than first base layer 40c, second base layer 40d, and third base layer 40e of printed circuit board 40. Heat transfer film 81c and heat transfer element 81c1 may further have electrical conductivity. Heat transfer film 81c and heat transfer element 81c1 may be formed of, for example, copper. Each of thermal vias 82, 83a, 83b, 84a, 84b may have a similar configuration to thermal via 81.

Thermal vias 83a, 83b are each disposed in a region arranged between first core portion 46 and second core portion 47 in printed circuit board 40. Thermal vias 83a, 83b pass through between first main surface 40a and second main surface 40b of printed circuit board 40 and thermally connect first portion 51 of first coil pattern 50, third portion 56 of second coil pattern 55, and a portion of third coil pattern 60 that is arranged between first core portion 46 and second core portion 47. Thermal vias 83a, 83b may have electrical conductivity and may have electrical insulation properties. Thermal vias 83a, 83b may electrically connect first portion 51 of first coil pattern 50, third portion 56 of second coil pattern 55, and a portion of third coil pattern 60 that is arranged between first core portion 46 and second core portion 47.

Thermal vias 81, 82 are each disposed in a region exposed from at least one of first core portion 46 and second core portion 47 in printed circuit board 40. Thermal vias 81, 82 each may be disposed in a region exposed from first core portion 46 and second core portion 47 in printed circuit board 40. Thermal via 81 may be disposed adjacent to one end of each of first coil pattern 50, second coil pattern 55, and third coil pattern 60. Thermal via 82 may be disposed adjacent to the other end of each of first coil pattern 50, second coil pattern 55, and third coil pattern 60.

Thermal vias 81, 82 pass through between first main surface 40a and second main surface 40b of printed circuit board 40 and thermally connect second portion 52 of first coil pattern 50, fourth portion 57 of second coil pattern 55, and a portion of third coil pattern 60 that is not arranged between first core portion 46 and second core portion 47. Thermal vias 81, 82 have electrical conductivity. Thermal vias 81, 82 electrically connect second portion 52 of first coil pattern 50, fourth portion 57 of second coil pattern 55, and a portion of third coil pattern 60 that is not arranged between first core portion 46 and second core portion 47.

Thermal vias 84a, 84b are each disposed in a region exposed from at least one of first core portion 46 and second core portion 47 in printed circuit board 40. Thermal vias 84a, 84b each may be disposed in a region exposed from first core portion 46 and second core portion 47 in printed circuit board 40. Thermal via 84a may be disposed at one end of the central portion of each of first coil pattern 50, second coil pattern 55, and third coil pattern 60. Thermal via 84b may be disposed in the other end of the central portion of each of first coil pattern 50, second coil pattern 55, and third coil pattern 60.

Thermal vias 84a, 84b pass through between first main surface 40a and second main surface 40b of printed circuit board 40 and thermally connect second portion 52 of first coil pattern 50, fourth portion 57 of second coil pattern 55, and a portion of third coil pattern 60 that is not arranged between first core portion 46 and second core portion 47. Thermal vias 84a, 84b may have electrical conductivity and may have electrical insulation properties. Thermal vias 84a, 84b may electrically connect second portion 52 of first coil pattern 50, fourth portion 57 of second coil pattern 55, and a portion of third coil pattern 60 that is not arranged between first core portion 46 and second core portion 47.

Referring to FIG. 4 to FIG. 13, a circuit configuration of the coil pattern in circuit device 30 of the present embodiment will be described. In the present embodiment, each of thermal vias 81, 82 has electrical conductivity. Therefore, first coil pattern 50, first internal coil pattern 61, second internal coil pattern 65, and second coil pattern 55 are electrically connected in parallel with each other via thermal vias 81, 82. The coil pattern (first coil pattern 50, second coil pattern 55, third coil pattern 60) in circuit device 30 of the present embodiment has a circuit configuration of one-turn four parallel connection. Each of thermal vias 83a, 83b, 84a, 84b may have electrical conductivity. First coil pattern 50, first internal coil pattern 61, second internal coil pattern 65, and second coil pattern 55 may be electrically connected in parallel with each other through thermal vias 83a, 83b, 84a, 84b.

In a plain view of first main surface 40a and second main surface 40b, first heat transfer members 70, 71, 73, 74 may be disposed so as to overlap thermal vias 83a, 83b. When first heat transfer members 70, 71, 73, 74 are mounted on first coil pattern 50 and second coil pattern 55 by reflow soldering, solder may be partially filled in thermal vias 83a, 83b. The solder filled in thermal vias 83a, 83b can dissipate heat generated in first portion 51 of first coil pattern 50, third portion 56 of second coil pattern 55, first internal coil pattern 61, and second internal coil pattern 65, together with the heat transfer films included in thermal vias 83a, 83b. Therefore, temperature increase of first portion 51 of first coil pattern 50, third portion 56 of second coil pattern 55, first internal coil pattern 61, and second internal coil pattern 65 can be suppressed. Solder may be partially filled in any subsequent thermal vias disposed so as to overlap any subsequent heat transfer members in a plain view of first main surface 40a and second main surface 40b.

A plurality of coil patterns (first coil pattern 50, second coil pattern 55, third coil pattern 60) having substantially the same pattern shape are layered. Thermal vias 81, 82 are electrically connected to all of a plurality of coil patterns (first coil pattern 50, second coil pattern 55, third coil pattern 60). A circuit configuration is thus obtained in which a plurality of coil patterns (first coil pattern 50, second coil pattern 55, third coil pattern 60) are electrically connected in parallel with each other.

The reason why temperature increase of first portion 51 of first coil pattern 50 arranged between first core portion 46 and second core portion 47 can be suppressed in circuit device 30 and power conversion device 1 of the present embodiment will be described.

First heat transfer members 70, 71 are disposed on first portion 51 of first coil pattern 50. First heat transfer members 70, 71 are electrically connected to first portion 51 of first coil pattern 50. Since first heat transfer members 70, 71 have a cross-sectional area larger than, for example, first portion 51 of first coil pattern 50 in a cross section crossing the direction in which current flows in first coil pattern 50, first heat transfer members 70, 71 have an electrical resistance lower than first portion 51 of first coil pattern 50. The electrical resistance of a portion including both of first heat transfer members 70, 71 and first coil pattern 50 is lower than the electrical resistance of first coil pattern 50. For example, when first heat transfer members 70, 71 are made of the same material as first coil pattern 50 and have the same width as first coil pattern 50, and first heat transfer members 70, 71 have a thickness 10 times the thickness of first coil pattern 50, the electrical resistance of the portion including both of first heat transfer members 70, 71 and first portion 51 of first coil pattern 50 is lower than one-tenth of the electrical resistance of first portion 51 of first coil pattern 50.

Therefore, first heat transfer members 70, 71 are disposed on first portion 51 of first coil pattern 50, whereby heat generated in first portion 51 of first coil pattern 50 and first heat transfer members 70, 71 arranged between first core portion 46 and second core portion 47 can be reduced. In circuit device 30 and power conversion device 1 according to the present embodiment, temperature increase of first portion 51 of first coil pattern 50 arranged between first core portion 46 and second core portion 47 can be suppressed.

First heat transfer members 70, 71 are disposed on first portion 51 of first coil pattern 50. First heat transfer members 70, 71 are thermally connected to first portion 51 of first coil pattern 50. Since first heat transfer members 70, 71 have a cross-sectional area larger than, for example, first portion 51 of first coil pattern 50 in a cross section crossing the direction in which current flows in first coil pattern 50, first heat transfer members 70, 71 have a thermal resistance lower than first portion 51 of first coil pattern 50. The thermal resistance of the portion including both of first heat transfer members 70, 71 and first coil pattern 50 is lower than the thermal resistance of first coil pattern 50. For example, when first heat transfer members 70, 71 are made of the same material as first coil pattern 50 and have the same width as first coil pattern 50, and first heat transfer members 70, 71 have a thickness 10 times the thickness of first coil pattern 50, the thermal resistance of the portion including both of first heat transfer members 70, 71 and first portion 51 of first coil pattern 50 is lower than one-tenth of the thermal resistance of first portion 51 of first coil pattern 50.

Therefore, first heat transfer members 70, 71 are disposed on first portion 51 of first coil pattern 50, whereby heat generated in first portion 51 of first coil pattern 50 is less likely to be accumulated in first portion 51 of first coil pattern 50 and first heat transfer members 70, 71 and is spread to second portion 52 of first coil pattern 50 with low thermal resistance.

First heat transfer members 70, 71 on first portion 51 of first coil pattern 50 may have a surface area larger than first portion 51 of first coil pattern 50. First heat transfer members 70, 71 on first portion 51 of first coil pattern 50 can spread heat generated in first portion 51 of first coil pattern 50 to second portion 52 of first coil pattern 50 with low thermal resistance. Therefore, heat generated in first portion 51 of first coil pattern 50 is dissipated from the surfaces of first heat transfer members 70, 71 and the surface of second portion 52 of first coil pattern 50 to the surrounding atmosphere.

As described above, in circuit device 30 and power conversion device 1 of the present embodiment, since first heat transfer members 70, 71 are electrically and thermally connected to first portion 51 of first coil pattern 50, the electrical resistance and the thermal resistance of the portion including both of first heat transfer members 70, 71 and first coil pattern 50 are smaller than the electrical resistance and the thermal resistance of first coil pattern 50. Therefore, heat generated in first portion 51 of first coil pattern 50 arranged between first core portion 46 and second core portion 47 can be reduced. Furthermore, heat generated in first portion 51 of first coil pattern 50 is less likely to be accumulated in first portion 51 of first coil pattern 50 and first heat transfer members 70, 71 and is spread to second portion 52 of first coil pattern 50 with low thermal resistance. In circuit device 30 and power conversion device 1 according to the present embodiment, therefore, temperature increase of first portion 51 of first coil pattern 50 arranged between first core portion 46 and second core portion 47 can be suppressed.

The path for dissipating heat generated in first portion 51 of first coil pattern 50 to the surrounding atmosphere includes the following second heat dissipation path, in addition to the first heat dissipation path including the surfaces of first heat transfer members 70, 71 and the surface of first coil pattern 50 described above. The second heat dissipation path includes first coil pattern 50, second heat transfer members 80, 80a, and heat dissipator 6. Because of first heat transfer members 70, 71, the heat generated in first portion 51 of first coil pattern 50 is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere. Heat generated in first portion 51 of first coil pattern 50 is thus dissipated to the surrounding atmosphere through a plurality of heat dissipation paths. In circuit device 30 and power conversion device 1 according to the present embodiment, temperature increase of first portion 51 of first coil pattern 50 arranged between first core portion 46 and second core portion 47 can be suppressed.

The reason why temperature increase of third portion 56 of second coil pattern 55 arranged between first core portion 46 and second core portion 47 can be suppressed in circuit device 30 and power conversion device 1 of the present embodiment will be described.

First heat transfer members 73, 74 are disposed on third portion 56 of second coil pattern 55. First heat transfer members 73, 74 are electrically connected to third portion 56 of second coil pattern 55. Since first heat transfer members 73, 74 have a cross-sectional area larger than, for example, third portion 56 of second coil pattern 55 in a cross section crossing the direction in which current flows in second coil pattern 55, first heat transfer members 73, 74 have an electrical resistance lower than third portion 56 of second coil pattern 55. The electrical resistance of the portion including both of first heat transfer members 73, 74 and second coil pattern 55 is lower than the electrical resistance of second coil pattern 55. For example, when first heat transfer members 73, 74 are made of the same material as second coil pattern 55 and have the same width as second coil pattern 55, and first heat transfer members 73, 74 have a thickness 10 times the thickness of second coil pattern 55, the electrical resistance of the portion including both of first heat transfer members 73, 74 and third portion 56 of second coil pattern 55 is lower than one-tenth of the electrical resistance of third portion 56 of second coil pattern 55.

Therefore, first heat transfer members 73, 74 are disposed on third portion 56 of second coil pattern 55, whereby heat generated in third portion 56 of second coil pattern 55 and first heat transfer members 73, 74 arranged between first core portion 46 and second core portion 47 can be reduced. In circuit device 30 and power conversion device 1 according to the present embodiment, temperature increase of third portion 56 of second coil pattern 55 arranged between first core portion 46 and second core portion 47 can be suppressed.

First heat transfer members 73, 74 are disposed on third portion 56 of second coil pattern 55. First heat transfer members 73, 74 are thermally connected to third portion 56 of second coil pattern 55. Since first heat transfer members 73, 74 have a cross-sectional area larger than, for example, third portion 56 of second coil pattern 55 in a cross section crossing the direction in which current flows in second coil pattern 55, first heat transfer members 73, 74 have a thermal resistance lower than third portion 56 of second coil pattern 55. The thermal resistance of the portion including both of first heat transfer members 73, 74 and second coil pattern 55 is lower than the thermal resistance of second coil pattern 55. For example, when first heat transfer members 73, 74 are made of the same material as second coil pattern 55 and have the same width as second coil pattern 55, and first heat transfer members 73, 74 have a thickness 10 times the thickness of second coil pattern 55, the thermal resistance of the portion including both of first heat transfer members 73, 74 and third portion 56 of second coil pattern 55 is lower than one-tenth of the thermal resistance of third portion 56 of second coil pattern 55.

Therefore, first heat transfer members 73, 74 are disposed on third portion 56 of second coil pattern 55, whereby heat generated in third portion 56 of second coil pattern 55 is less likely to be accumulated in third portion 56 of second coil pattern 55 and first heat transfer members 73, 74 and is spread to fourth portion 57 of second coil pattern 55 with low thermal resistance.

Furthermore, first heat transfer members 73, 74 on third portion 56 of second coil pattern 55 may have a surface area larger than third portion 56 of second coil pattern 55. First heat transfer members 73, 74 on third portion 56 of second coil pattern 55 can spread heat generated in third portion 56 of second coil pattern 55 to fourth portion 57 of second coil pattern 55 with low thermal resistance. Therefore, heat generated in third portion 56 of second coil pattern 55 is dissipated from the surfaces of first heat transfer members 73, 74 and the surface of fourth portion 57 of second coil pattern 55 to the surrounding atmosphere.

As described above, in circuit device 30 and power conversion device 1 of the present embodiment, first heat transfer members 73, 74 are electrically and thermally connected to third portion 56 of second coil pattern 55, so that the electrical resistance and the thermal resistance of the portion including both of first heat transfer members 73, 74 and second coil pattern 55 are smaller than the electrical resistance and the thermal resistance of second coil pattern 55. This can reduce heat generated in third portion 56 of second coil pattern 55 arranged between first core portion 46 and second core portion 47. In addition, heat generated in third portion 56 of second coil pattern 55 is less likely to be accumulated in third portion 56 of second coil pattern 55 and first heat transfer members 73, 74 and is spread to fourth portion 57 of second coil pattern 55 with low thermal resistance. Accordingly, in circuit device 30 and power conversion device 1 according to the present embodiment, temperature increase of third portion 56 of second coil pattern 55 arranged between first core portion 46 and second core portion 47 can be suppressed.

The path for dissipating heat generated in third portion 56 of second coil pattern 55 to the surrounding atmosphere includes the following second and third heat dissipation paths, in addition to the first heat dissipation path including the surfaces of first heat transfer members 73, 74 and the surface of fourth portion 57 of second coil pattern 55.

The second heat dissipation path includes second coil pattern 55, thermal vias 81, 82, 83a, 83b, 84a, 84b, first coil pattern 50, second heat transfer members 80, 80a, and heat dissipator 6. Because of first heat transfer members 73, 74, heat generated in third portion 56 of second coil pattern 55 is spread to fourth portion 57 of second coil pattern 55 with low thermal resistance. This heat is transferred to first coil pattern 50 through thermal vias 81, 82, 83a, 83b, 84a, 84b. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The third heat dissipation path includes second coil pattern 55, thermal vias 81, 82, 83a, 83b, 84a, 84b, first coil pattern 50, and first heat transfer members 70, 71. Because of first heat transfer members 73, 74, heat generated in third portion 56 of second coil pattern 55 is spread to fourth portion 57 of second coil pattern 55 with low thermal resistance. This heat is transferred to first coil pattern 50 through thermal vias 81, 82, 83a, 83b, 84a, 84b. Because of first heat transfer members 70, 71, this heat is spread to the entire first coil pattern 50 and first heat transfer members 70, 71 with low thermal resistance. Therefore, heat generated in third portion 56 of second coil pattern 55 is dissipated from the surfaces of first heat transfer members 70, 71 and the surface of first coil pattern 50 to the surrounding atmosphere.

In circuit device 30 and power conversion device 1 of the present embodiment, heat generated in third portion 56 of second coil pattern 55 is dissipated to the surrounding atmosphere through a plurality of heat dissipation paths. In circuit device 30 and power conversion device 1 according to the present embodiment, temperature increase of third portion 56 of second coil pattern 55 arranged between first core portion 46 and second core portion 47 can be suppressed.

The reason why temperature increase of the portion of first internal coil pattern 61 that is arranged between first core portion 46 and second core portion 47 can be suppressed in circuit device 30 and power conversion device 1 of the present embodiment will be described below.

As described above, the electrical resistance of the portion including both of first heat transfer members 70, 71 and first coil pattern 50 is smaller than the electrical resistance of first coil pattern 50. The electrical resistance of the portion including both of first heat transfer members 73, 74 and second coil pattern 55 is smaller than the electrical resistance of second coil pattern 55. Therefore, the electrical resistance of the portion including both of first heat transfer members 70, 71 and first coil pattern 50 and the electrical resistance of the portion including both of first heat transfer members 73, 74 and second coil pattern 55 are smaller than the electrical resistance of first internal coil pattern 61. In addition, first coil pattern 50, first internal coil pattern 61, second internal coil pattern 65, and second coil pattern 55 are electrically connected in parallel with each other. Therefore, first heat transfer members 70, 71, 73, 74 can reduce current flowing through first internal coil pattern 61. In circuit device 30 and power conversion device 1 according to the present embodiment, temperature increase of the portion of first internal coil pattern 61 that is arranged between first core portion 46 and second core portion 47 can be suppressed.

The path for dissipating heat generated in the portion of first internal coil pattern 61 that is arranged between first core portion 46 and second core portion 47 to the surrounding atmosphere includes the following first to third heat dissipation paths.

The first heat dissipation path includes first internal coil pattern 61, at least one of thermal vias 81, 82, 83a, 83b, 84a, 84b and first base layer 40c, second base layer 40d, and third base layer 40e of printed circuit board 40, first coil pattern 50, second heat transfer members 80, 80a, and heat dissipator 6. Heat generated in the portion of first internal coil pattern 61 that is arranged between first core portion 46 and second core portion 47 is spread over the entire first internal coil pattern 61. This heat is transferred to first coil pattern 50 through at least one of thermal vias 81, 82, 83a, 83b, 84a, 84b and first base layer 40c, second base layer 40d, and third base layer 40e of printed circuit board 40. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The second heat dissipation path includes first internal coil pattern 61, at least one of thermal vias 81, 82, 83a, 83b, 84a, 84b and first base layer 40c, second base layer 40d, and third base layer 40e of printed circuit board 40, first coil pattern 50, and first heat transfer members 70, 71. Heat generated in the portion of first internal coil pattern 61 that is arranged between first core portion 46 and second core portion 47 is spread over the entire first internal coil pattern 61. This heat is transferred to first coil pattern 50 through at least one of thermal vias 81, 82, 83a, 83b, 84a, 84b and first base layer 40c, second base layer 40d, and third base layer 40e of printed circuit board 40. Because of first heat transfer members 70, 71, this heat is spread to the entire first coil pattern 50 and first heat transfer members 70, 71 with low thermal resistance. Therefore, this heat is dissipated from the surfaces of first heat transfer members 70, 71 and the surface of first coil pattern 50 to the surrounding atmosphere.

The third heat dissipation path includes first internal coil pattern 61, thermal vias 81, 82, 83a, 83b, 84a, 84b, second coil pattern 55, and first heat transfer members 73, 74. Heat generated in the portion of first internal coil pattern 61 that is arranged between first core portion 46 and second core portion 47 is spread over the entire first internal coil pattern 61. This heat is transferred to second coil pattern 55 through thermal vias 81, 82, 83a, 83b, 84a, 84b. Because of first heat transfer members 73, 74, this heat is spread to the entire second coil pattern 55 and first heat transfer members 73, 74 with low thermal resistance. Therefore, this heat is dissipated from the surfaces of first heat transfer members 73, 74 and the surface of second coil pattern 55 to the surrounding atmosphere.

In circuit device 30 and power conversion device 1 of the present embodiment, heat generated in the portion of first internal coil pattern 61 that is arranged between first core portion 46 and second core portion 47 is dissipated to the surrounding atmosphere through a plurality of heat dissipation paths. In circuit device 30 and power conversion device 1 according to the present embodiment, therefore, temperature increase of the portion of first internal coil pattern 61 that is arranged between first core portion 46 and second core portion 47 can be suppressed.

The reason why temperature increase of the portion of second internal coil pattern 65 that is arranged between first core portion 46 and second core portion 47 can be suppressed in circuit device 30 and power conversion device 1 of the present embodiment will be described.

As described above, the electrical resistance of the portion including both of first heat transfer members 70, 71 and first coil pattern 50 is smaller than the electrical resistance of first coil pattern 50. The electrical resistance of the portion including both of first heat transfer members 73, 74 and second coil pattern 55 is smaller than the electrical resistance of second coil pattern 55. Therefore, the electrical resistance of the portion including both of first heat transfer members 70, 71 and first coil pattern 50 and the electrical resistance of the portion including both of first heat transfer members 73, 74 and second coil pattern 55 are smaller than the electrical resistance of second internal coil pattern 65. In addition, first coil pattern 50, first internal coil pattern 61, second internal coil pattern 65, and second coil pattern 55 are electrically connected in parallel with each other. Therefore, first heat transfer members 70, 71, 73, 74 can reduce current flowing through second internal coil pattern 65. In circuit device 30 and power conversion device 1 of the present embodiment, temperature increase of the portion of second internal coil pattern 65 that is arranged between first core portion 46 and second core portion 47 can be suppressed.

The path for dissipating heat generated in the portion of second internal coil pattern 65 that is arranged between first core portion 46 and second core portion 47 to the surrounding atmosphere includes the following first to third heat dissipation paths.

The first heat dissipation path includes second internal coil pattern 65, thermal vias 81, 82, 83a, 83b, 84a, 84b, first coil pattern 50, second heat transfer members 80, 80a, and heat dissipator 6. Heat generated in the portion of second internal coil pattern 65 that is arranged between first core portion 46 and second core portion 47 is spread over the entire second internal coil pattern 65. This heat is transferred to first coil pattern 50 through thermal vias 81, 82, 83a, 83b, 84a, 84b. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The second heat dissipation path includes second internal coil pattern 65, thermal vias 81, 82, 83a, 83b, 84a, 84b, first coil pattern 50, and first heat transfer members 70, 71. Heat generated in the portion of second internal coil pattern 65 that is arranged between first core portion 46 and second core portion 47 is spread over the entire second internal coil pattern 65. This heat is transferred to first coil pattern 50 through thermal vias 81, 82, 83a, 83b, 84a, 84b. Because of first heat transfer members 70, 71, this heat is spread to the entire first coil pattern 50 and first heat transfer members 70, 71 with low thermal resistance. Therefore, this heat is dissipated from the surfaces of first heat transfer members 70, 71 and the surface of first coil pattern 50 to the surrounding atmosphere.

The third heat dissipation path includes second internal coil pattern 65, at least one of thermal vias 81, 82, 83a, 83b, 84a, 84b and first base layer 40c, second base layer 40d, and third base layer 40e of printed circuit board 40, second coil pattern 55, and first heat transfer members 73, 74. Heat generated in the portion of second internal coil pattern 65 that is arranged between first core portion 46 and second core portion 47 is spread over the entire second internal coil pattern 65. This heat is transferred to second coil pattern 55 through at least one of thermal vias 81, 82, 83a, 83b, 84a, 84b and first base layer 40c, second base layer 40d, and third base layer 40e of printed circuit board 40. Because of first heat transfer members 73, 74, this heat is spread to the entire second coil pattern 55 and first heat transfer members 73, 74 with low thermal resistance. Therefore, this heat is dissipated from the surfaces of first heat transfer members 73, 74 and the surface of second coil pattern 55 to the surrounding atmosphere.

In circuit device 30 and power conversion device 1 of the present embodiment, heat generated in the portion of second internal coil pattern 65 that is arranged between first core portion 46 and second core portion 47 is dissipated to the surrounding atmosphere through a plurality of heat dissipation paths. In circuit device 30 and power conversion device 1 according to the present embodiment, therefore, temperature increase of the portion of second internal coil pattern 65 that is arranged between first core portion 46 and second core portion 47 can be suppressed.

The effects of circuit device 30 and power conversion device 1 of the present embodiment will be described.

Power conversion device 1 and circuit device 30 of the present embodiment include printed circuit board 40 and core 45. Printed circuit board 40 has first main surface 40a and second main surface 40b on the opposite side to first main surface 40a. Core 45 includes first core portion 46 positioned over first main surface 40a and spaced away from first main surface 40a and second core portion 47 positioned over second main surface 40b and spaced away from second main surface 40b. Core 45 includes the through portion (47b) passing between first main surface 40a and second main surface 40b. Printed circuit board 40 includes at least one of first coil pattern 50 disposed on first main surface 40a and second coil pattern 55 disposed on second main surface 40b. At least one of first coil pattern 50 and second coil pattern 55 surrounds the through portion (47b) of core 45 with half a turn or more. First coil pattern 50 includes first portion 51 arranged between first core portion 46 and second core portion 47 and second portion 52 exposed from at least one of first core portion 46 and second core portion 47 in a plain view from a direction vertical to first main surface 40a. Second coil pattern 55 includes third portion 56 arranged between first core portion 46 and second core portion 47 and fourth portion 57 exposed from at least one of first core portion 46 and second core portion 47 in a plain view from a direction vertical to second main surface 40b.

Circuit device 30 and power conversion device 1 of the present embodiment includes first heat transfer members 70, 71, 73, 74 on at least one of first portion 51 and third portion 56. First heat transfer members 70, 71, 73, 74 are mounted on at least one of first portion 51 and third portion 56. In a cross section crossing the direction in which current flows in at least one of first coil pattern 50 and second coil pattern 55, first heat transfer members 70, 71, 73, 74 have a cross-sectional area larger than at least one of first portion 51 and the third portion.

Therefore, first heat transfer members 70, 71 have an electrical resistance and a thermal resistance lower than first portion 51 of first coil pattern 50. Since the electrical resistance and the thermal resistance of the portion including both of first heat transfer members 70, 71 and first coil pattern 50 are smaller than the electrical resistance and the thermal resistance of first coil pattern 50, heat generated in first portion 51 of first coil pattern 50 and first heat transfer members 70, 71 arranged between first core portion 46 and second core portion 47 can be reduced. Heat generated in first portion 51 of first coil pattern 50 arranged between first core portion 46 and second core portion 47 can be dissipated to the outside of circuit device 30 with low thermal resistance. In circuit device 30 and power conversion device 1 according to the present embodiment, temperature increase of first portion 51 of first coil pattern 50 arranged between first core portion 46 and second core portion 47 can be suppressed.

First heat transfer members 73, 74 have a lower electrical resistance and a lower thermal resistance than third portion 56 of second coil pattern 55. Since the electrical resistance and the thermal resistance of the portion including both of first heat transfer members 73, 74 and second coil pattern 55 are smaller than the electrical resistance and the thermal resistance of second coil pattern 55, heat generated in third portion 56 of second coil pattern 55 and first heat transfer members 73, 74 arranged between first core portion 46 and second core portion 47 can be reduced. Heat generated in third portion 56 of second coil pattern 55 arranged between first core portion 46 and second core portion 47 can be dissipated to the outside of circuit device 30 with low thermal resistance. In circuit device 30 and power conversion device 1 according to the present embodiment, temperature increase of third portion 56 of second coil pattern 55 arranged between first core portion 46 and second core portion 47 can be suppressed.

Furthermore, since temperature increase of first portion 51 of first coil pattern 50 can be suppressed, temperature increase of circuit device 30 and power conversion device 1 can be suppressed even when first coil pattern 50 is downsized. Since temperature increase of third portion 56 of second coil pattern 55 can be suppressed, temperature increase of circuit device 30 and power conversion device 1 can be suppressed even when second coil pattern 55 is downsized. In circuit device 30 and power conversion device 1 according to the present embodiment, circuit device 30 and power conversion device 1 can be downsized.

Circuit device 30 and power conversion device 1 of the present embodiment may further include heat dissipator 6 thermally connected to at least one of second portion 52 and fourth portion 57. Heat generated in at least one of first portion 51 and third portion 56 can be dissipated to the outside of circuit device 30 with low thermal resistance through heat dissipator 6. In circuit device 30 and power conversion device 1 according to the present embodiment, temperature increase of at least one of first portion 51 and third portion 56 can be further suppressed.

In circuit device 30 and power conversion device 1 of the present embodiment, heat dissipator 6 may form part of a housing accommodating printed circuit board 40. Heat generated in at least one of first portion 51 and third portion 56 can be dissipated to the outside of circuit device 30 with low thermal resistance through heat dissipator 6 that forms part of the housing. In circuit device 30 and power conversion device 1 according to the present embodiment, temperature increase of at least one of first portion 51 and third portion 56 can be further suppressed.

Circuit device 30 and power conversion device 1 of the present embodiment may further include second heat transfer members 80, 80a having electrical insulation properties. Printed circuit board 40 may include first coil pattern 50. Second heat transfer members 80, 80a may be disposed between heat dissipator 6 and first coil pattern 50. Second heat transfer members 80, 80a can transfer heat generated in first portion 51 with low thermal resistance to heat dissipator 6 while electrically insulating first coil pattern 50 from heat dissipator 6. In circuit device 30 and power conversion device 1 of the present embodiment, therefore, temperature increase of first portion 51 can be suppressed. Since heat dissipator 6 is electrically insulated from first coil pattern 50 by second heat transfer members 80, 80a, heat dissipator 6 can be formed of a material having a high thermal conductivity and a high electrical conductivity, such as metal.

Circuit device 30 and power conversion device 1 of the present embodiment may further include a plurality of mounting members 77a, 77b for mounting printed circuit board 40 to heat dissipator 6. Printed circuit board 40 may include first coil pattern 50. A plurality of mounting members 77a, 77b may be disposed along the longitudinal direction of second heat transfer member 80 such that second heat transfer member 80 is arranged therebetween. The longitudinal direction of second heat transfer member 80 may be along the direction in which current flows in first coil pattern 50.

Thus, when printed circuit board 40 is mounted on heat dissipator 6 using mounting members 77a, 77b, second heat transfer member 80 can be in contact with first coil pattern 50 over a large area. The repulsion force in the longitudinal direction of second heat transfer member 80 that is received by printed circuit board 40 when printed circuit board 40 is mounted on heat dissipator 6 using mounting members 77a, 77b is larger than the repulsion force in the lateral direction of second heat transfer member 80. Since a plurality of mounting members 77a, 77b are disposed along the longitudinal direction of second heat transfer member 80 such that second heat transfer member 80 is arranged therebetween, warpage of printed circuit board 40 receiving the repulsion force from second heat transfer member 80 can be prevented. This further ensures that second heat transfer member 80 is in contact with first coil pattern 50 over a large area. In circuit device 30 and power conversion device 1 according to the present embodiment, temperature increase of first coil pattern 50 can be further suppressed.

When printed circuit board 40 is mounted on heat dissipator 6 using mounting members 77a, 77b, second heat transfer member 80 can be crushed by printed circuit board 40. Second heat transfer member 80 crushed by printed circuit board 40 has an even lower thermal resistance. In circuit device 30 and power conversion device 1 according to the present embodiment, temperature increase of first coil pattern 50 can be further suppressed.

In circuit device 30 and power conversion device 1 of the present embodiment, printed circuit board 40 may include first coil pattern 50 and at least one of second coil pattern 55 and third coil pattern 60 inside printed circuit board 40. At least one of second coil pattern 55 and third coil pattern 60 may surround the through portion (47b) of core 45 with half a turn or more. Printed circuit board 40 may include thermal vias 81, 82, 83*a*, 83*b*, 84*a*, 84*b*. Thermal vias 81, 82, 83*a*, 83*b*, 84*a*, 84*b* may connect at least one of second coil pattern 55 and third coil pattern 60 to first coil pattern 50. Thermal vias 81, 82, 83*a*, 83*b*, 84*a*, 84*b* thermally connect at least one of second coil pattern 55 and third coil pattern 60 to first coil pattern 50.

In circuit device 30 and power conversion device 1 according to the present embodiment, therefore, heat generated in at least one of second coil pattern 55 on second main surface 40*b* and third coil pattern 60 inside printed circuit board 40 can be dissipated from the surfaces of first heat transfer members 70, 71 and the surface of first coil pattern 50 to the outside of circuit device 30 with low thermal resistance. Circuit device 30 and power conversion device 1 of the present embodiment includes at least one of second coil pattern 55 and third coil pattern 60 inside printed circuit board 40, in addition to first coil pattern 50. Therefore, a variety of circuit configurations can be implemented.

In circuit device 30 and power conversion device 1 of the present embodiment, thermal vias 83*a*, 83*b* may connect at least one of second coil pattern 55 and third coil pattern 60 to first portion 51 of first coil pattern 50. Heat generated in the portion arranged between first core portion 46 and second core portion 47 of at least one of second coil pattern 55 on second main surface 40*b* and third coil pattern 60 inside printed circuit board 40 is transferred to first heat transfer members 70, 71 thermally connected to first portion 51 of first coil pattern 50 and second portion 52 of first coil pattern 50, with low thermal resistance. In circuit device 30 and power conversion device 1 according to the present embodiment, this heat can be dissipated from the surfaces of first heat transfer members 70, 71 and the surface of first coil pattern 50 to the outside of circuit device 30 with low thermal resistance.

Modifications of circuit device 30 of the present embodiment will be described. In a first modification, heat dissipator 6 may be disposed above second main surface 40*b* of printed circuit board 40. In a second modification, heat dissipator 6 above second main surface 40*b* of printed circuit board 40 may be a lid that forms part of the housing accommodating printed circuit board 40. In a third modification, heat generated from first coil pattern 50, second coil pattern 55, and third coil pattern 60 (first internal coil pattern 61, second internal coil pattern 65) may be transferred to the lid and dissipated from the lid to the outside of circuit device 30. In a fourth modification, circuit device 30 may include one of first heat transfer member 70 and first heat transfer member 71.

Second Embodiment

Referring to FIG. 16 to FIG. 26, a circuit device 30*a* of a second embodiment will be described. Circuit device 30*a* of the present embodiment has a similar configuration to circuit device 30 of first embodiment, except the following points.

Figure 16:
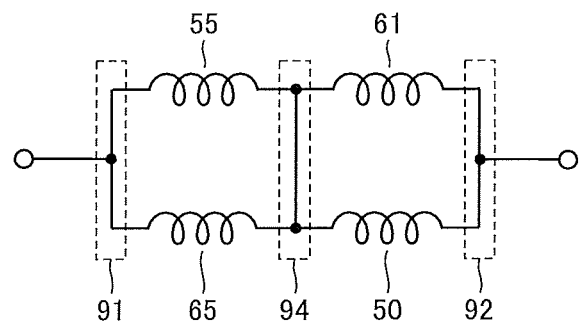
FIG. 16 is a coil connection diagram of a circuit device according to a second embodiment of the present invention.
Figure 17:
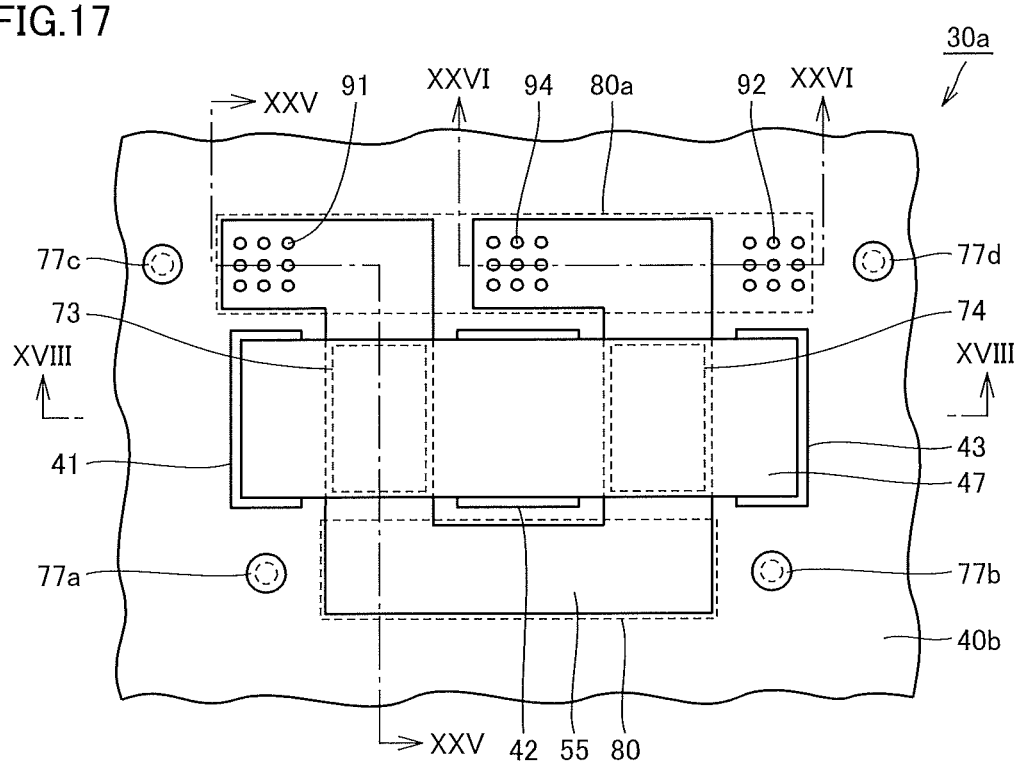
FIG. 17 is a schematic plan view of the circuit device according to the second embodiment of the present invention.
Figure 18:
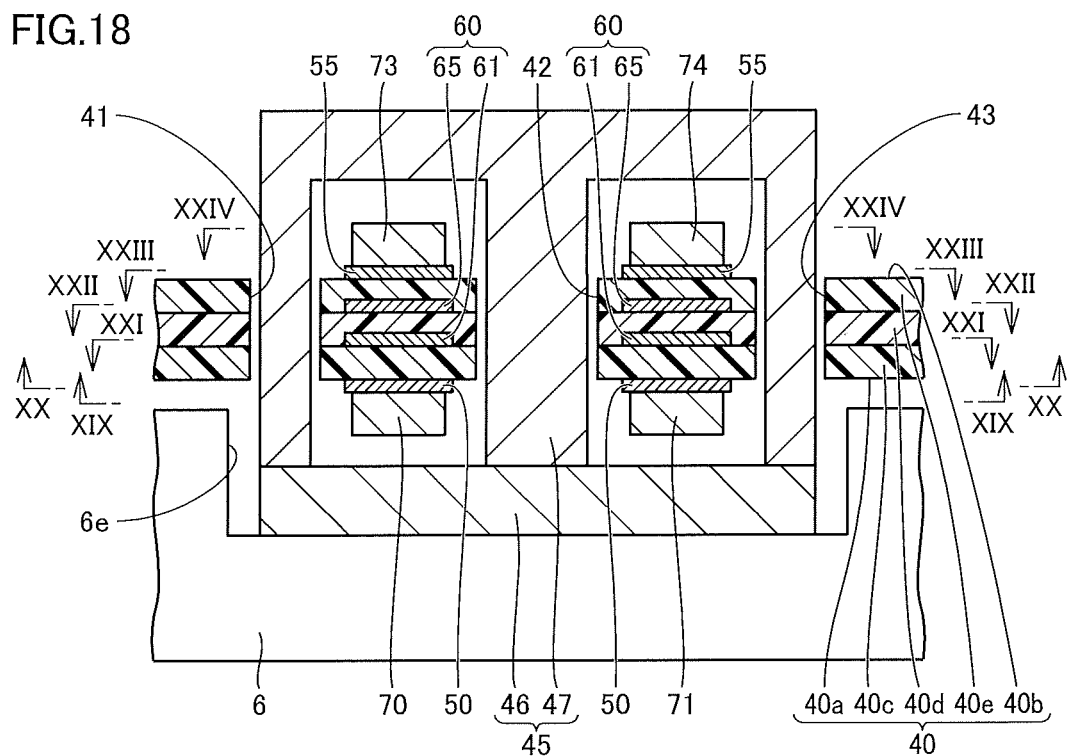
FIG. 18 is a schematic cross-sectional view taken along line XVIII-XVIII shown in FIG. 17 of the circuit device according to the second embodiment of the present invention.
Figure 19:
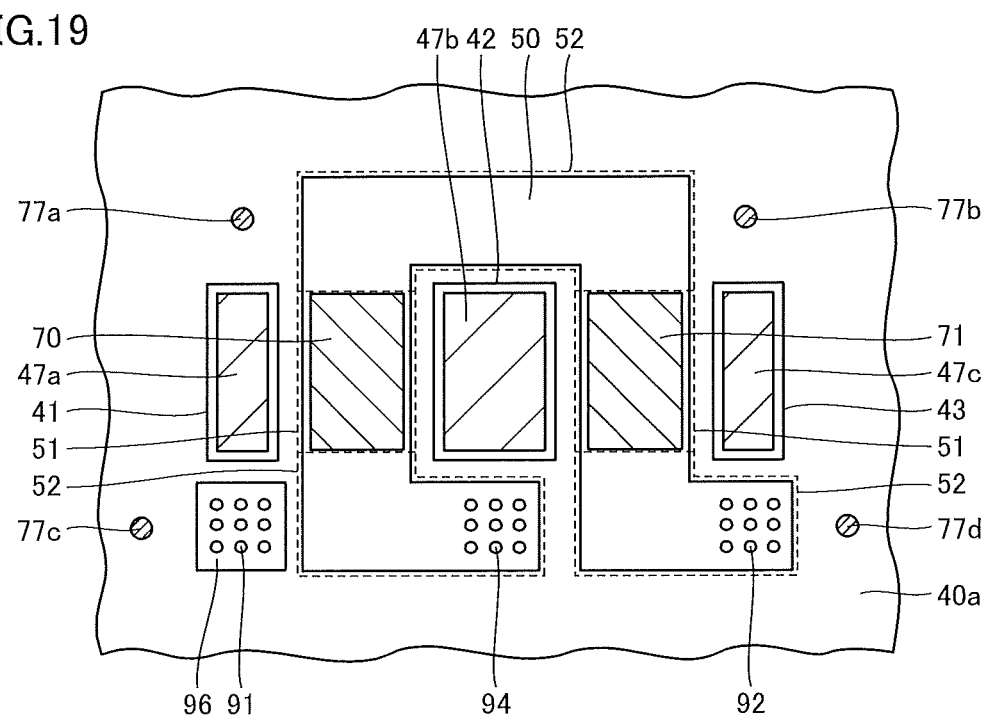
FIG. 19 is a schematic cross-sectional view taken along line XIX-XIX shown in FIG. 18 of the circuit device according to the second embodiment of the present invention.
Figure 20:
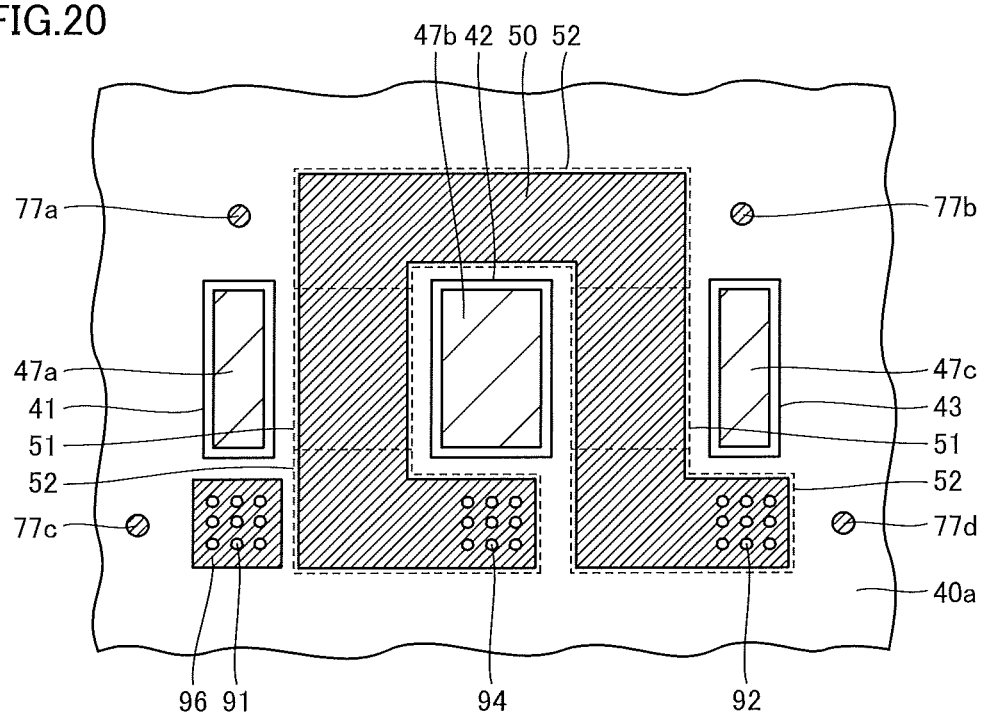
FIG. 20 is a schematic cross-sectional view taken along line XX-XX shown in FIG. 18 of the circuit device according to the second embodiment of the present invention.

Referring to FIG. 16, the coil pattern in circuit device 30*a* of the present embodiment has a circuit configuration of two-turn two-parallel connection. Printed circuit board 40 of circuit device 30*a* of the present embodiment includes thermal vias 91, 92, 94. Each of thermal vias 91, 92, 94 may have a similar configuration to thermal via 81 in the first embodiment. Each of thermal vias 91, 92, 94 has electrical conductivity. Second coil pattern 55 and second internal coil pattern 65 are electrically connected in parallel through thermal vias 91, 94 to form a first parallel circuit. First coil pattern 50 and first internal coil pattern 61 are electrically connected in parallel through thermal vias 92, 94 to form a second parallel circuit. The first parallel circuit and the second parallel circuit are electrically connected in series through thermal via 94.

Referring to FIG. 17 and FIG. 19 to FIG. 26, each of thermal vias 91, 92, 94 passes from first main surface 40*a* to second main surface 40*b* of printed circuit board 40. Thermal via 91 is electrically and thermally connected to second coil pattern 55 and second internal coil pattern 65 but is not electrically and thermally connected to first coil pattern 50 or first internal coil pattern 61. Thermal via 92 is electrically and thermally connected to first coil pattern 50 and first internal coil pattern 61 but is not electrically and thermally connected to second coil pattern 55 or second internal coil pattern 65. Thermal via 94 is electrically and thermally connected to first coil pattern 50, second coil pattern 55, first internal coil pattern 61, and second internal coil pattern 65.

Printed circuit board 40 includes a first thermal pad 96 disposed on first main surface 40*a* and spaced away from first coil pattern 50. First thermal pad 96 may be disposed adjacent to first leg 47*a* of second core portion 47. First thermal pad 96 may be formed of a material having a thermal resistivity lower than that of first base layer 40*c*, second base layer 40*d*, and third base layer 40*e* of printed circuit board 40. First thermal pad 96 may be formed of, for example, copper. Thermal via 91 may thermally connect at least one of second coil pattern 55 and third coil pattern 60 (second internal coil pattern 65) to first thermal pad 96. In the present embodiment, thermal via 91 thermally connects second coil pattern 55 and second internal coil pattern 65 to first thermal pad 96.

Second heat transfer member 80*a* may extend so as to connect thermal via 91 and thermal via 92. Second heat transfer member 80*a* is in surface contact with first thermal pad 96 and thermally connected to first thermal pad 96. First thermal pad 96 is thermally connected to heat dissipator 6. Specifically, first thermal pad 96 is in surface contact with second heat transfer member 80*a*. Second heat transfer member 80*a* is in surface contact with heat dissipator 6. First thermal pad 96 is thus connected to heat dissipator 6 with low thermal resistance through second heat transfer member 80*a*.

Referring to FIG. 19, FIG. 20, FIG. 25, and FIG. 26, the path for dissipating heat generated in first portion 51 of first coil pattern 50 to the surrounding atmosphere includes the following first to third heat dissipation paths.

The first heat dissipation path includes the surfaces of first heat transfer members 70, 71 and the surface of first coil pattern 50. Because of first heat transfer members 70, 71, heat generated in first portion 51 of first coil pattern 50 is spread to first heat transfer members 70, 71 and second portion 52 of first coil pattern 50 with low thermal resistance. This heat is dissipated from the surfaces of first heat transfer members 70, 71 and the surface of second portion 52 of first coil pattern 50 to the surrounding atmosphere.

The second heat dissipation path includes first coil pattern 50, second heat transfer members 80, 80*a*, and heat dissipator 6. Because of first heat transfer members 70, 71, heat generated in first portion 51 of first coil pattern 50 is spread to second portion 52 of first coil pattern 50 with low thermal resistance. First coil pattern 50 is in surface contact with second heat transfer members 80, 80*a*. Second heat transfer members 80, 80*a* are in surface contact with heat dissipator 6. Therefore, this heat is transferred with low thermal resistance to heat dissipator 6 and dissipated from heat dissipator 6 to the surrounding atmosphere.

The third heat dissipation path includes printed circuit board 40, first thermal pad 96, second heat transfer member 80a, and heat dissipator 6. Part of heat generated in first portion 51 of first coil pattern 50 is transferred in the inside of printed circuit board 40 and further transferred to first thermal pad 96. First thermal pad 96 is in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

In circuit device 30a of the present embodiment, heat generated in first portion 51 of first coil pattern 50 is dissipated to the surrounding atmosphere through a plurality of heat dissipation paths. In circuit device 30a according to the present embodiment, temperature increase of first portion 51 of first coil pattern 50 arranged between first core portion 46 and second core portion 47 can be suppressed.

Referring to FIG. 23 to FIG. 26, the path for dissipating heat generated in third portion 56 of second coil pattern 55 to the surrounding atmosphere includes the following first to fourth heat dissipation paths.

The first heat dissipation path includes the surfaces of first heat transfer members 73, 74 and the surface of second coil pattern 55. Because of first heat transfer members 73, 74, heat generated in third portion 56 of second coil pattern 55 is spread to first heat transfer members 73, 74 and fourth portion 57 of second coil pattern 55 with low thermal resistance. This heat is dissipated from the surfaces of first heat transfer members 73, 74 and the surface of fourth portion 57 of second coil pattern 55 to the surrounding atmosphere.

The second heat dissipation path includes second coil pattern 55, thermal via 94, first coil pattern 50, second heat transfer members 80, 80a, and heat dissipator 6. Because of first heat transfer members 73, 74, heat generated in third portion 56 of second coil pattern 55 is spread to fourth portion 57 of second coil pattern 55 with low thermal resistance. This heat is transferred to first coil pattern 50 through thermal via 94. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The third heat dissipation path includes second coil pattern 55, thermal via 94, first coil pattern 50, and first heat transfer members 70, 71. Heat generated in third portion 56 of second coil pattern 55 is spread to fourth portion 57 of second coil pattern 55 with low thermal resistance. This heat is transferred to first coil pattern 50 through thermal via 94. Because of first heat transfer members 70, 71, this heat is spread to the entire first coil pattern 50 and first heat transfer members 70, 71 with low thermal resistance. Heat generated in third portion 56 of second coil pattern 55 is thus dissipated from the surfaces of first heat transfer members 70, 71 and the surface of first coil pattern 50 to the surrounding atmosphere.

The fourth heat dissipation path includes second coil pattern 55, thermal via 91, first thermal pad 96, second heat transfer member 80a, and heat dissipator 6. Because of first heat transfer members 73, 74, heat generated in third portion 56 of second coil pattern 55 is spread to fourth portion 57 of second coil pattern 55 with low thermal resistance. This heat is transferred to first thermal pad 96 through thermal via 91. First thermal pad 96 is in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

In circuit device 30a of the present embodiment, heat generated in third portion 56 of second coil pattern 55 is dissipated to the surrounding atmosphere through a plurality of heat dissipation paths. In circuit device 30a according to the present embodiment, temperature increase of third portion 56 of second coil pattern 55 arranged between first core portion 46 and second core portion 47 can be suppressed.

Figure 21:
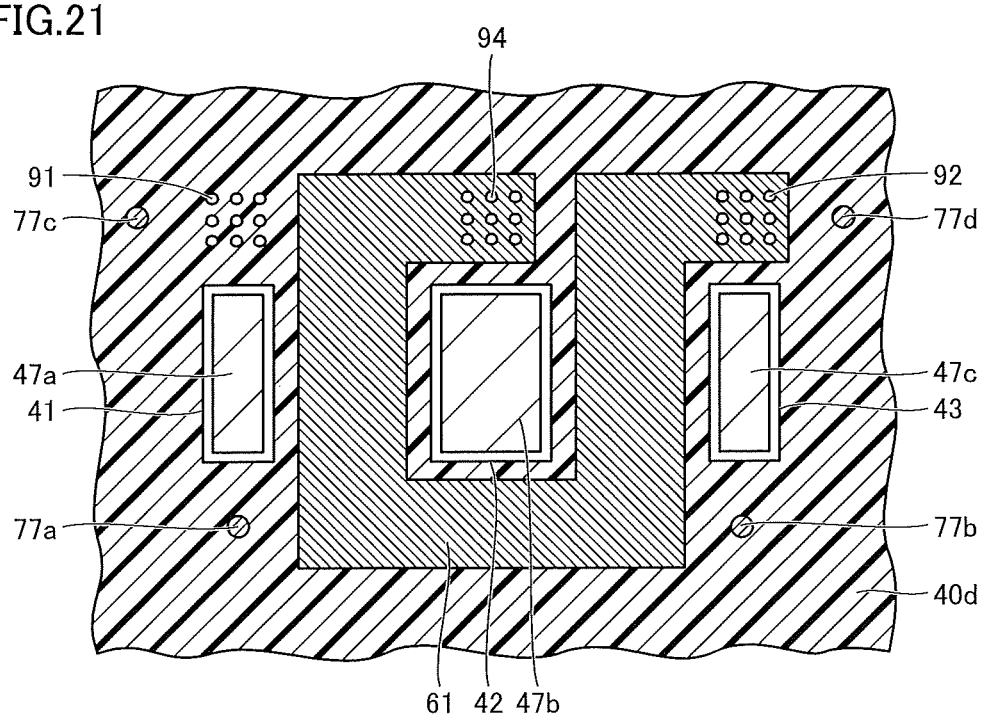
FIG. 21 is a schematic cross-sectional view taken along line XXI-XXI shown in FIG. 18 of the circuit device according to the second embodiment of the present invention.
Figure 25:
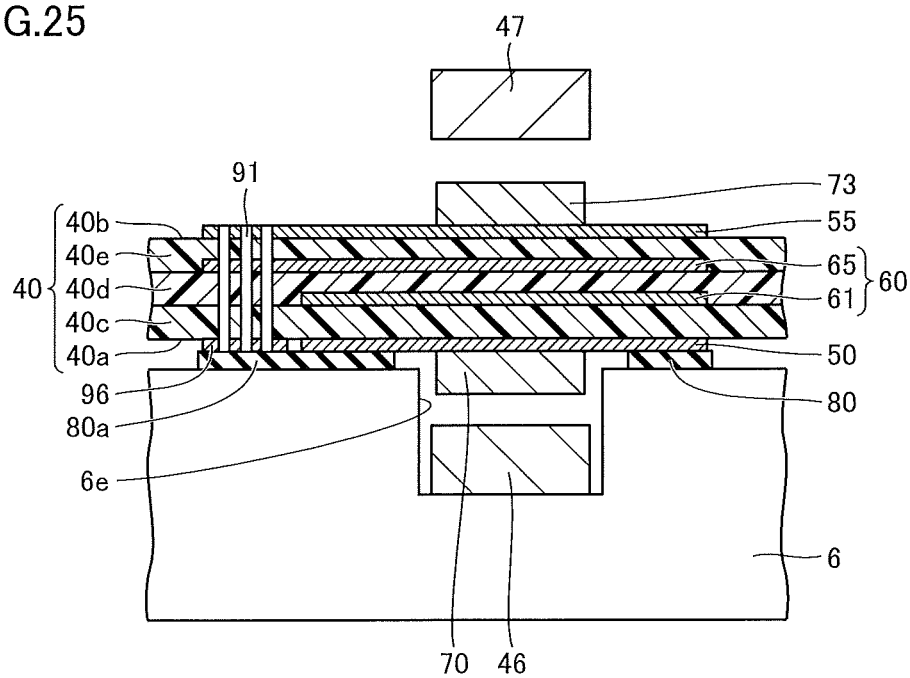
FIG. 25 is a schematic cross-sectional view taken along line XXV-XXV shown in FIG. 17 of the circuit device according to the second embodiment of the present invention.
Figure 26:
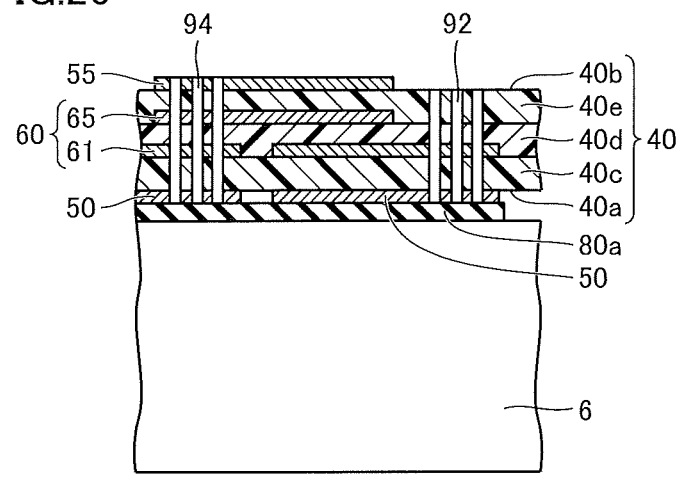
FIG. 26 is a schematic cross-sectional view taken along line XXVI-XXVI shown in FIG. 17 of the circuit device according to the second embodiment of the present invention.

Referring to FIG. 21, FIG. 25, and FIG. 26, the path for dissipating heat generated in the portion of first internal coil pattern 61 that is arranged between first core portion 46 and second core portion 47 to the surrounding atmosphere includes the following first to third heat dissipation paths.

The first heat dissipation path includes first internal coil pattern 61, at least one of thermal vias 92, 94 and printed circuit board 40, first coil pattern 50, second heat transfer members 80, 80a, and heat dissipator 6. Heat generated in the portion of first internal coil pattern 61 that is arranged between first core portion 46 and second core portion 47 is spread over the entire first internal coil pattern 61. This heat is transferred to first coil pattern 50 through at least one of thermal vias 92, 94 and printed circuit board 40. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The second heat dissipation path includes first internal coil pattern 61, at least one of thermal vias 92, 94 and printed circuit board 40, first coil pattern 50, and first heat transfer members 70, 71. Heat generated in the portion of first internal coil pattern 61 that is arranged between first core portion 46 and second core portion 47 is spread over the entire first internal coil pattern 61. This heat is transferred to first coil pattern 50 through at least one of thermal vias 92, 94 and printed circuit board 40. Because of first heat transfer members 70, 71, this heat is spread to the entire first coil pattern 50 and first heat transfer members 70, 71 with low thermal resistance. Therefore, this heat is dissipated from the surfaces of first heat transfer members 70, 71 and the surface of first coil pattern 50 to the surrounding atmosphere.

The third heat dissipation path includes first internal coil pattern 61, thermal via 94, second coil pattern 55, and first heat transfer members 73, 74. Heat generated in the portion of first internal coil pattern 61 that is arranged between first core portion 46 and second core portion 47 is spread over the entire first internal coil pattern 61. This heat is transferred to second coil pattern 55 through thermal via 94. Because of first heat transfer members 73, 74, this heat is spread to the entire second coil pattern 55 and first heat transfer members 73, 74 with low thermal resistance. Therefore, this heat is dissipated from the surfaces of first heat transfer members 73, 74 and the surface of second coil pattern 55 to the surrounding atmosphere.

In circuit device 30a of the present embodiment, heat generated in the portion of first internal coil pattern 61 that is arranged between first core portion 46 and second core portion 47 is dissipated to the surrounding atmosphere through a plurality of heat dissipation paths. In circuit device 30a according to the present embodiment, temperature increase of the portion of first internal coil pattern 61 that is arranged between first core portion 46 and second core portion 47 can be suppressed.

Figure 22:
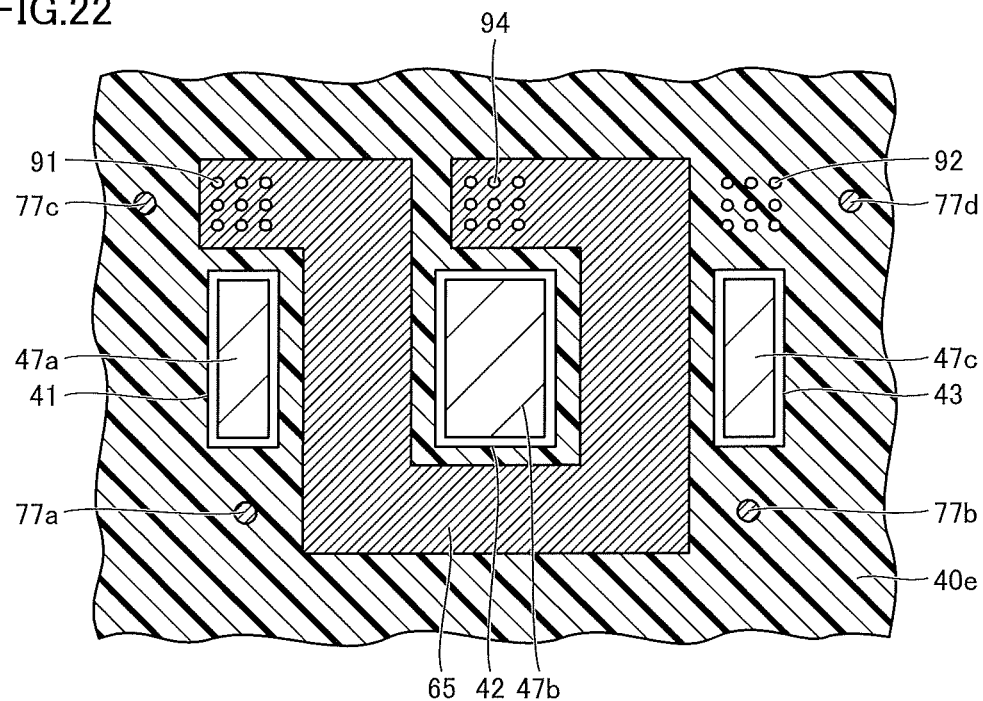
FIG. 22 is a schematic cross-sectional view taken along line XXII-XXII shown in FIG. 18 of the circuit device according to the second embodiment of the present invention.
Figure 23:
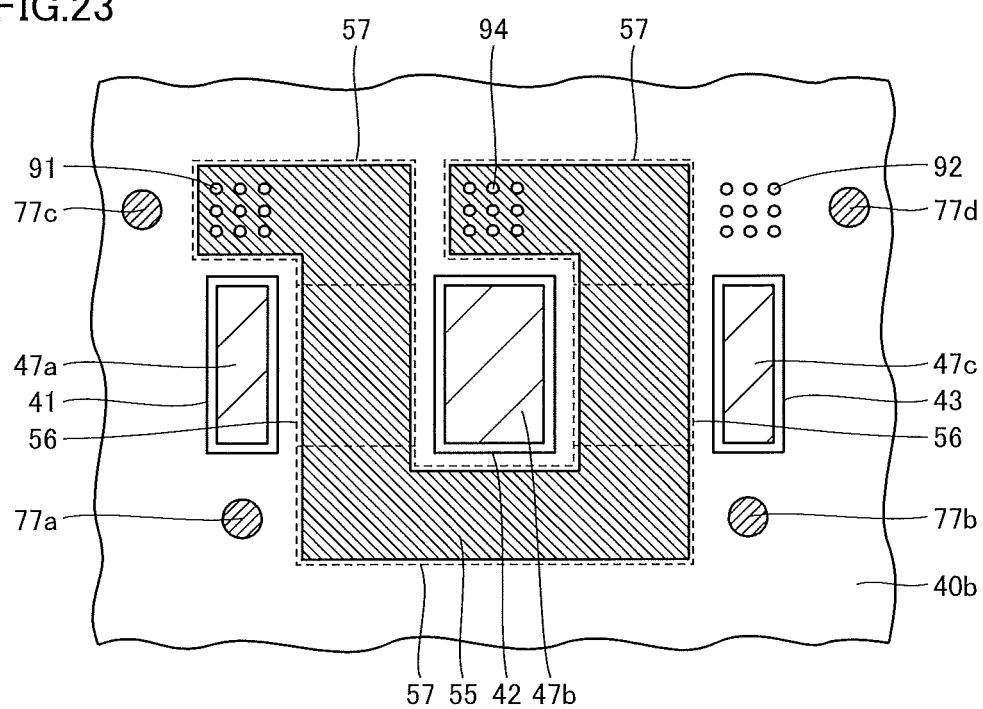
FIG. 23 is a schematic cross-sectional view taken along line XXIII-XXIII shown in FIG. 18 of the circuit device according to the second embodiment of the present invention.
Figure 24:
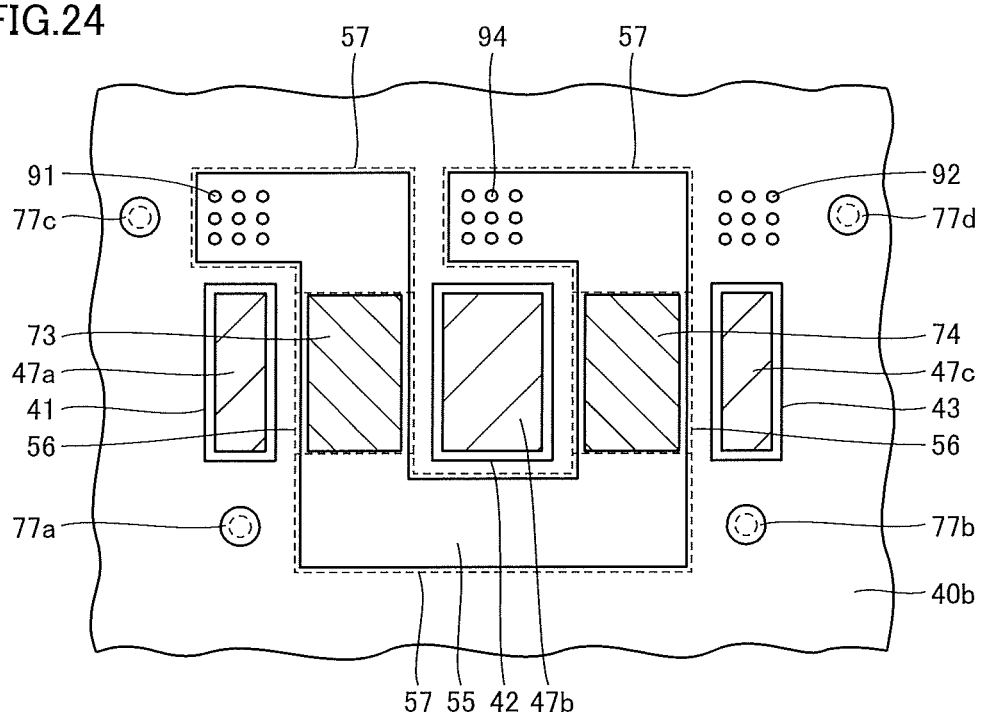
FIG. 24 is a schematic cross-sectional view taken along line XXIV-XXIV shown in FIG. 18 of the circuit device according to the second embodiment of the present invention.

Referring to FIG. 22, FIG. 25, and FIG. 26, the path for dissipating heat generated in the portion of second internal coil pattern 65 that is arranged between first core portion 46 and second core portion 47 to the surrounding atmosphere includes the following first to fourth heat dissipation paths.

The first heat dissipation path includes second internal coil pattern 65, thermal via 94, first coil pattern 50, second heat transfer members 80, 80a, and heat dissipator 6. Heat generated in the portion of second internal coil pattern 65 that is arranged between first core portion 46 and second core portion 47 is spread over the entire second internal coil pattern 65. This heat is transferred to first coil pattern 50 through thermal via 94. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The second heat dissipation path includes second internal coil pattern 65, thermal via 94, first coil pattern 50, and first heat transfer members 70, 71. Heat generated in the portion of second internal coil pattern 65 that is arranged between first core portion 46 and second core portion 47 is spread over the entire second internal coil pattern 65. This heat is transferred to first coil pattern 50 through thermal via 94. Because of first heat transfer members 70, 71, this heat is spread to the entire first coil pattern 50 and first heat transfer members 70, 71 with low thermal resistance. Therefore, this heat is dissipated from the surfaces of first heat transfer members 70, 71 and the surface of first coil pattern 50 to the surrounding atmosphere.

The third heat dissipation path includes second internal coil pattern 65, thermal via 91, first thermal pad 96, second heat transfer member 80a, and heat dissipator 6. Heat generated in the portion of second internal coil pattern 65 that is arranged between first core portion 46 and second core portion 47 is spread over the entire second internal coil pattern 65. This heat is transferred to first thermal pad 96 through thermal via 91. First thermal pad 96 is in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

The fourth heat dissipation path includes second internal coil pattern 65, at least one of thermal vias 91, 94 and printed circuit board 40, second coil pattern 55, and first heat transfer members 73, 74. Heat generated in the portion of second internal coil pattern 65 that is arranged between first core portion 46 and second core portion 47 is spread over the entire second internal coil pattern 65. This heat is transferred to second coil pattern 55 through at least one of thermal vias 91, 94 and printed circuit board 40. Because of first heat transfer members 73, 74, this heat is spread to the entire second coil pattern 55 and first heat transfer members 73, 74 with low thermal resistance. Therefore, this heat is dissipated from the surfaces of first heat transfer members 73, 74 and the surface of second coil pattern 55 to the surrounding atmosphere.

In circuit device 30a of the present embodiment, heat generated in the portion of second internal coil pattern 65 that is arranged between first core portion 46 and second core portion 47 is dissipated to the surrounding atmosphere through a plurality of heat dissipation paths. In circuit device 30a according to the present embodiment, temperature increase of the portion of second internal coil pattern 65 that is arranged between first core portion 46 and second core portion 47 can be suppressed.

The effects of circuit device 30a of the present embodiment will be described. Circuit device 30a of the present embodiment achieves similar effects as in circuit device 30 of the first embodiment but differs mainly in the following points.

In circuit device 30a of the present embodiment, printed circuit board 40 may include first coil pattern 50 and first thermal pad 96 disposed on first main surface 40a spaced away from first coil pattern 50. First thermal pad 96 may be thermally connected to heat dissipator 6. Part of heat generated in first portion 51 of first coil pattern 50 is transferred in the inside of printed circuit board 40. The heat transferred in the inside of printed circuit board 40 is transferred to heat dissipator 6 with low thermal resistance through first thermal pad 96. This heat can be dissipated from heat dissipator 6 to the surrounding atmosphere. In circuit device 30a according to the present embodiment, temperature increase of circuit device 30a can be further suppressed.

In circuit device 30a of the present embodiment, printed circuit board 40 may include at least one of second coil pattern 55 and third coil pattern 60 inside printed circuit board 40. At least one of second coil pattern 55 and third coil pattern 60 may surround the through portion (47b) of core 45 with half a turn or more. Printed circuit board 40 may include thermal via 91. Thermal via 91 may connect at least one of second coil pattern 55 and third coil pattern 60 (second internal coil pattern 65) to first thermal pad 96. At least one of second coil pattern 55 and third coil pattern 60 is thermally connected to heat dissipator 6 through thermal via 91 and first thermal pad 96. Heat generated in at least one of second coil pattern 55 and third coil pattern 60 can be dissipated to the outside of circuit device 30a with low thermal resistance. In circuit device 30a according to the present embodiment, temperature increase of at least one of second coil pattern 55 and third coil pattern 60 can be further suppressed.

Third Embodiment

Referring to FIG. 27 to FIG. 37, a circuit device 30b of a third embodiment will be described. Circuit device 30b of the present embodiment has a similar configuration to circuit device 30a of the second embodiment but differs mainly in the following points.

Figure 27:
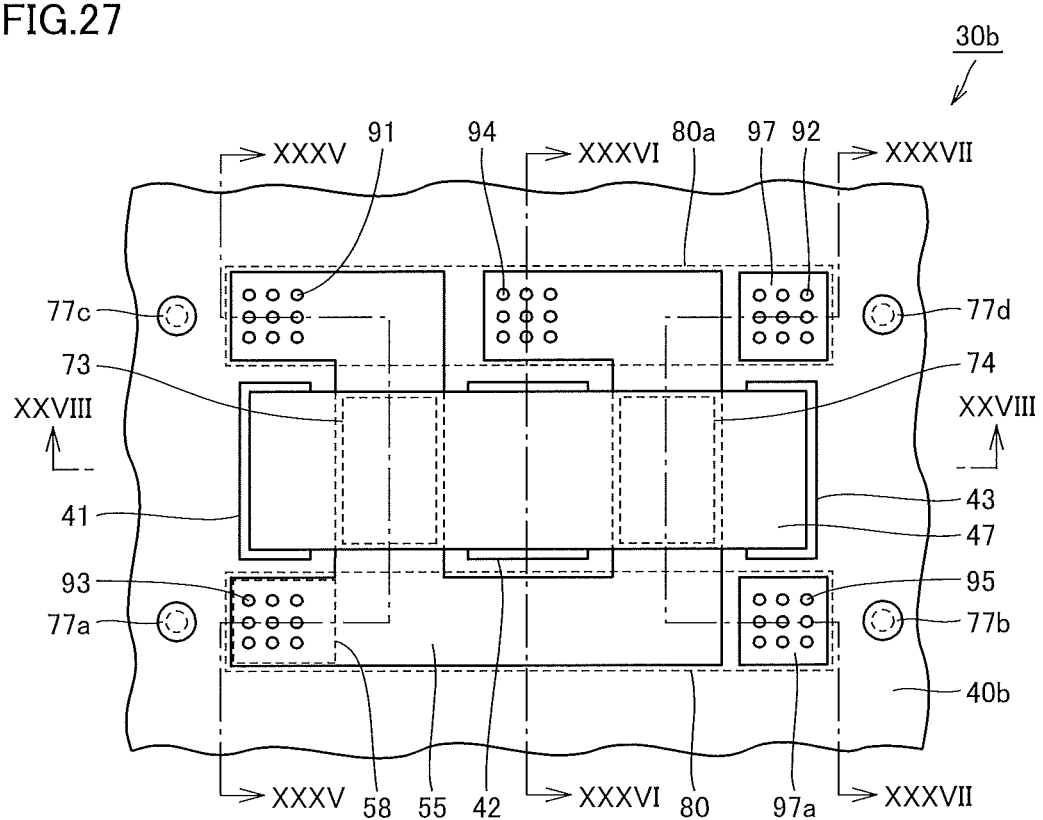
FIG. 27 is a schematic plan view of a circuit device according to a third embodiment of the present invention.
Figure 28:
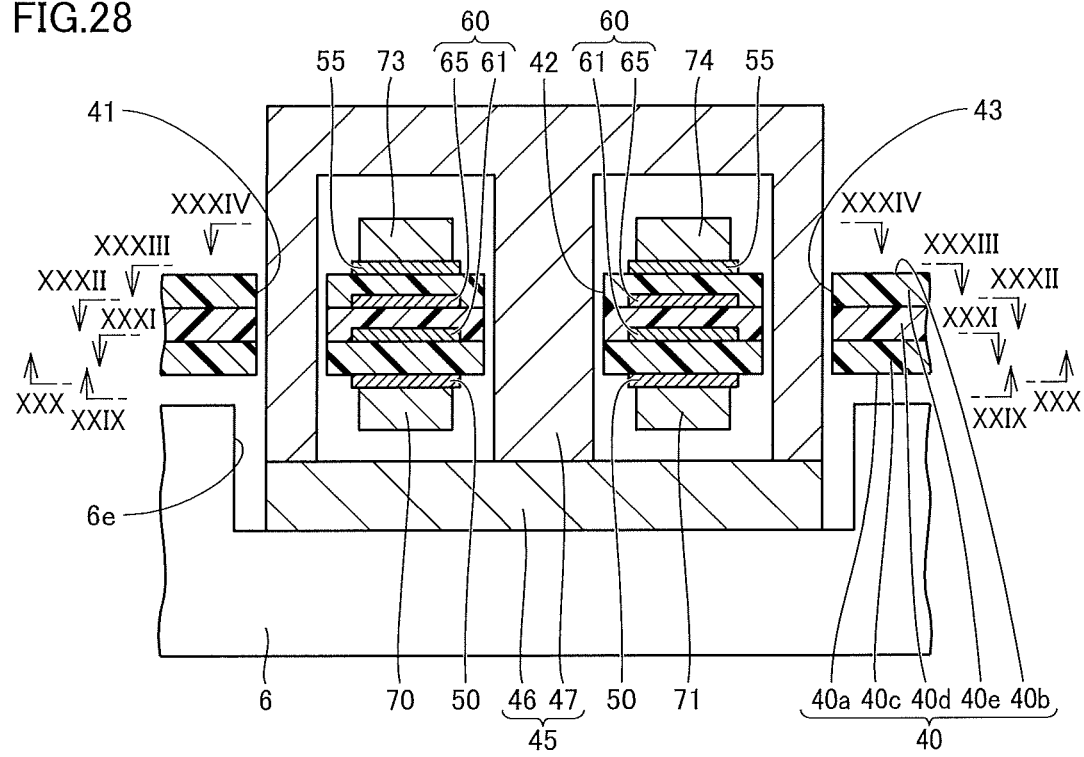
FIG. 28 is a schematic cross-sectional view taken along line XXVIII-XXVIII shown in FIG. 27 of the circuit device according to the third embodiment of the present invention.
Figure 29:
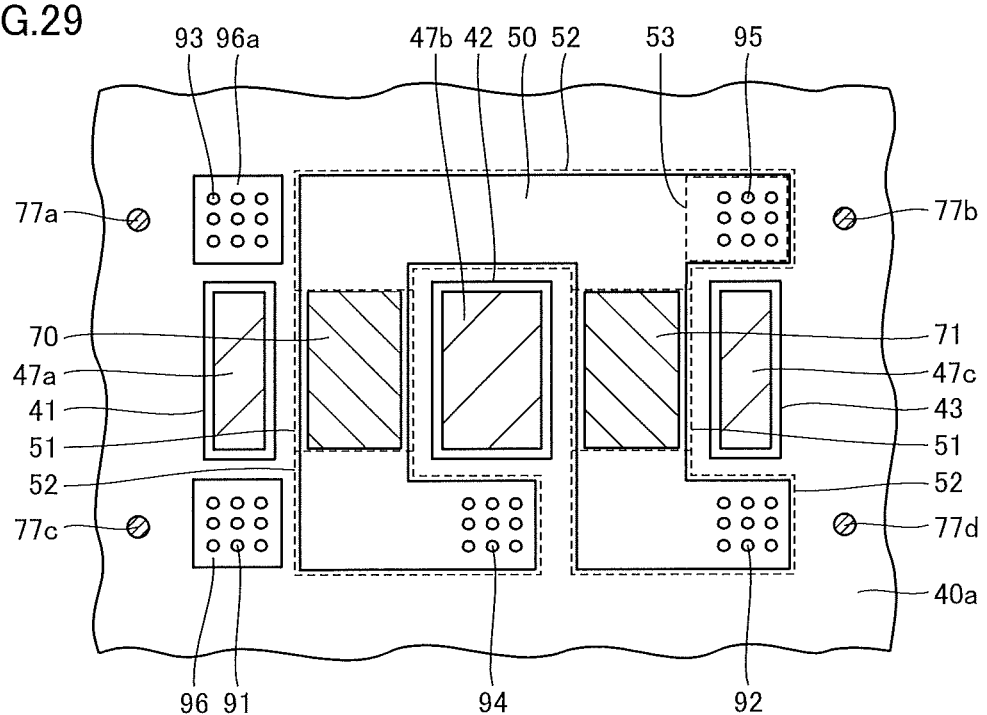
FIG. 29 is a schematic cross-sectional view taken along line XXIX-XXIX shown in FIG. 28 of the circuit device according to the third embodiment of the present invention.
Figure 30:
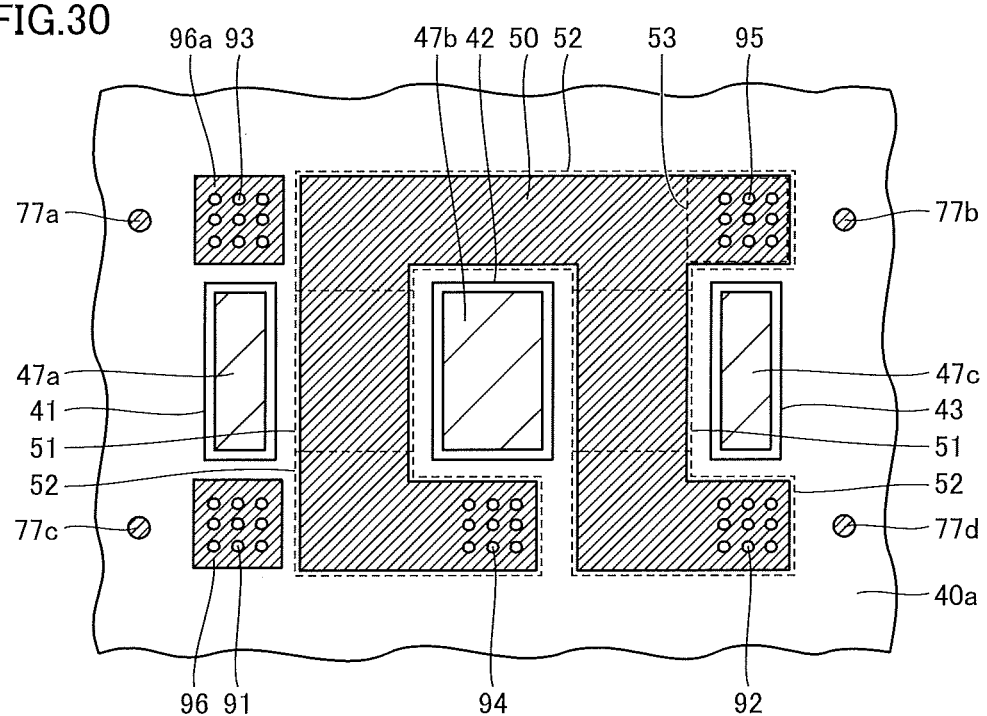
FIG. 30 is a schematic cross-sectional view taken along line XXX-XXX shown in FIG. 28 of the circuit device according to the third embodiment of the present invention.

Referring to FIG. 27, FIG. 29, and FIG. 30, in circuit device 30b of the present embodiment, printed circuit board 40 includes a first thermal pad 96a disposed on first main surface 40a and spaced away from first coil pattern 50, in addition to first thermal pad 96. First thermal pads 96 and 96a may be positioned on both sides of first leg 47a of second core portion 47. First thermal pad 96a is thermally connected to heat dissipator 6. Specifically, first thermal pad 96a is in surface contact with second heat transfer member 80, and second heat transfer member 80 is in surface contact with heat dissipator 6. First thermal pad 96a is thus connected to heat dissipator 6 with low thermal resistance through second heat transfer member 80. First coil pattern 50 includes a first extension portion 53, which is a partially extended portion of first coil pattern 50, at a position outside the current path of first coil pattern 50.

Figure 33:
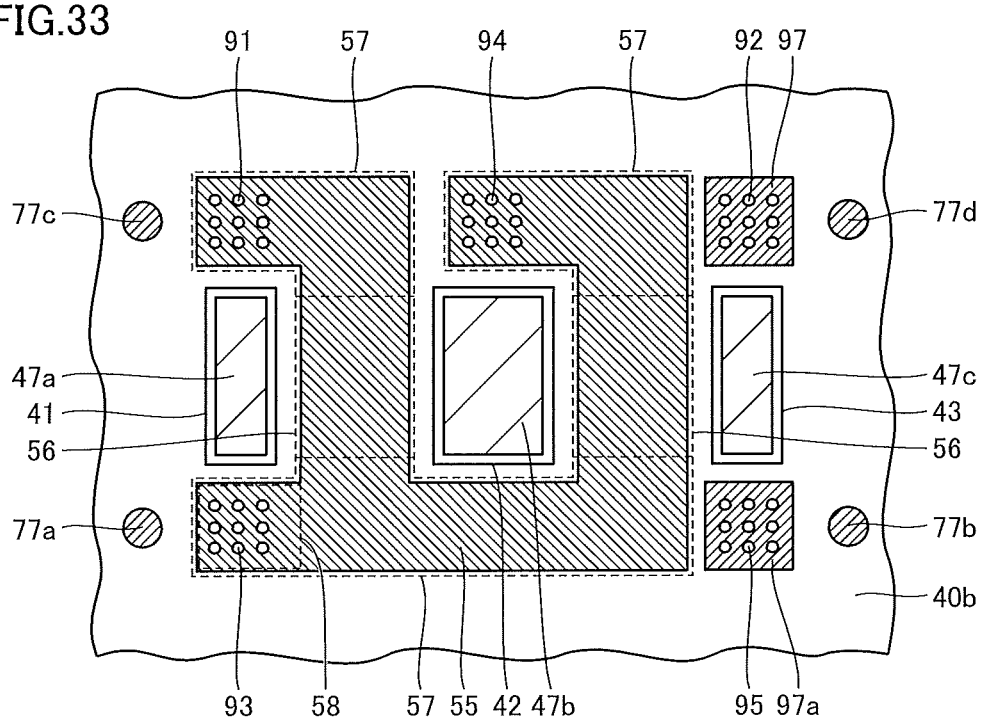
FIG. 33 is a schematic cross-sectional view taken along line XXXIII-XXXIII shown in FIG. 28 of the circuit device according to the third embodiment of the present invention.
Figure 34:
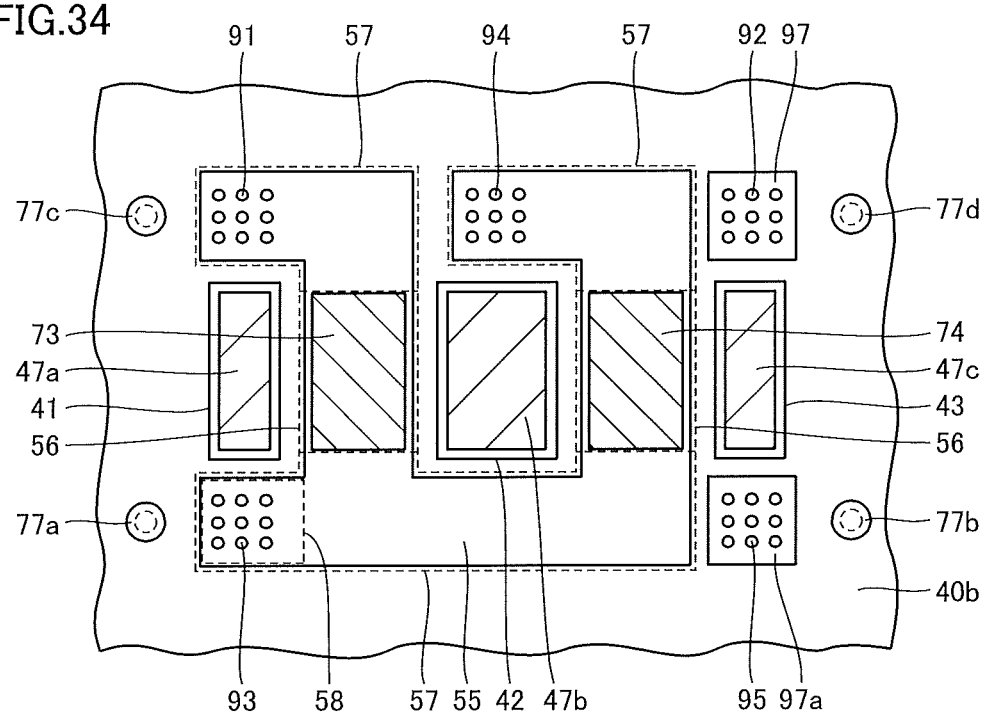
FIG. 34 is a schematic cross-sectional view taken along line XXXIV-XXXIV shown in FIG. 28 of the circuit device according to the third embodiment of the present invention.
Figure 35:
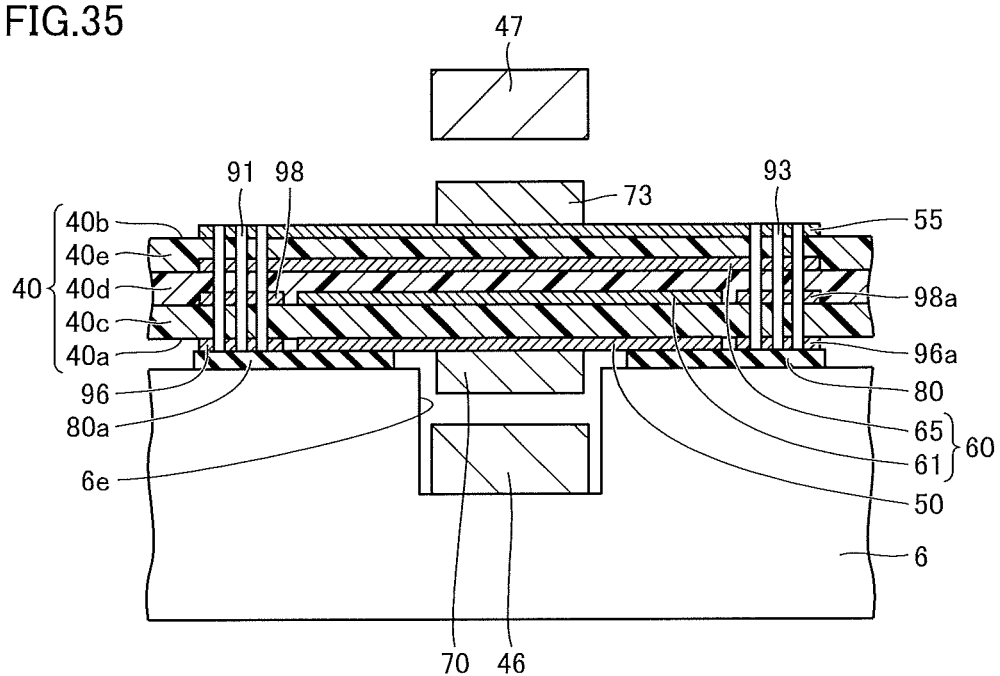
FIG. 35 is a schematic cross-sectional view taken along line XXXV-XXXV shown in FIG. 27 of the circuit device according to the third embodiment of the present invention.
Figure 36:
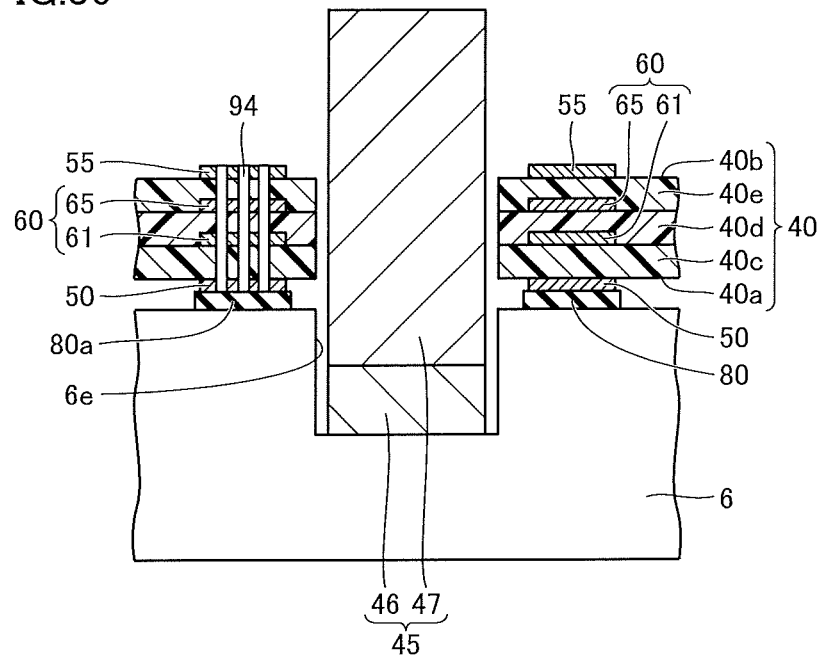
FIG. 36 is a schematic cross-sectional view taken along line XXXVI-XXXVI shown in FIG. 27 of the circuit device according to the third embodiment of the present invention.
Figure 37:
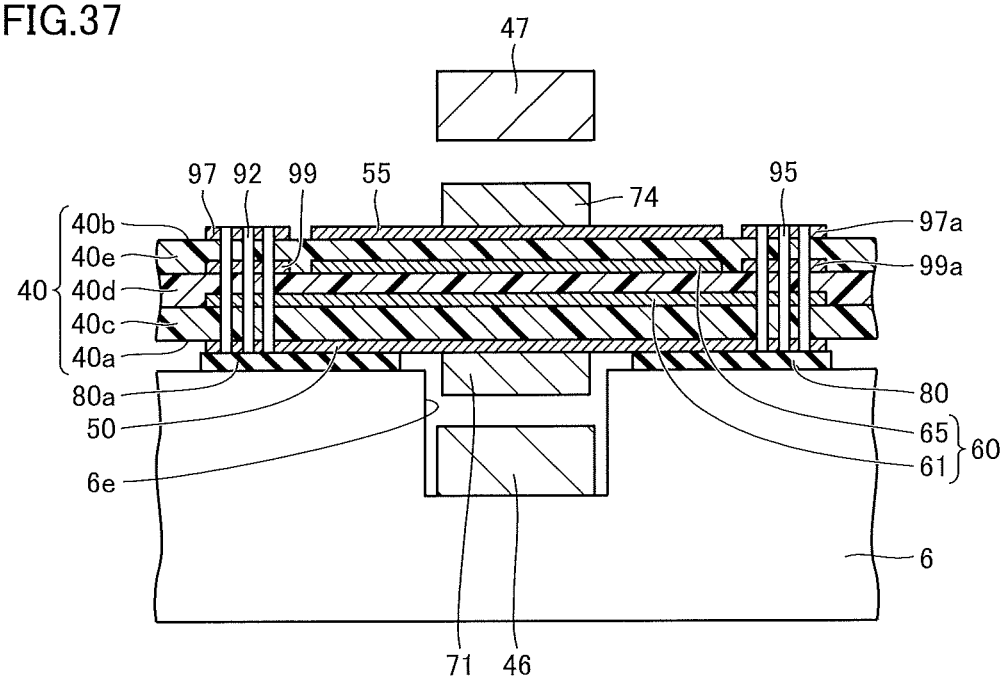
FIG. 37 is a schematic cross-sectional view taken along line XXXVII-XXXVII shown in FIG. 27 of the circuit device according to the third embodiment of the present invention.
Figure 38:
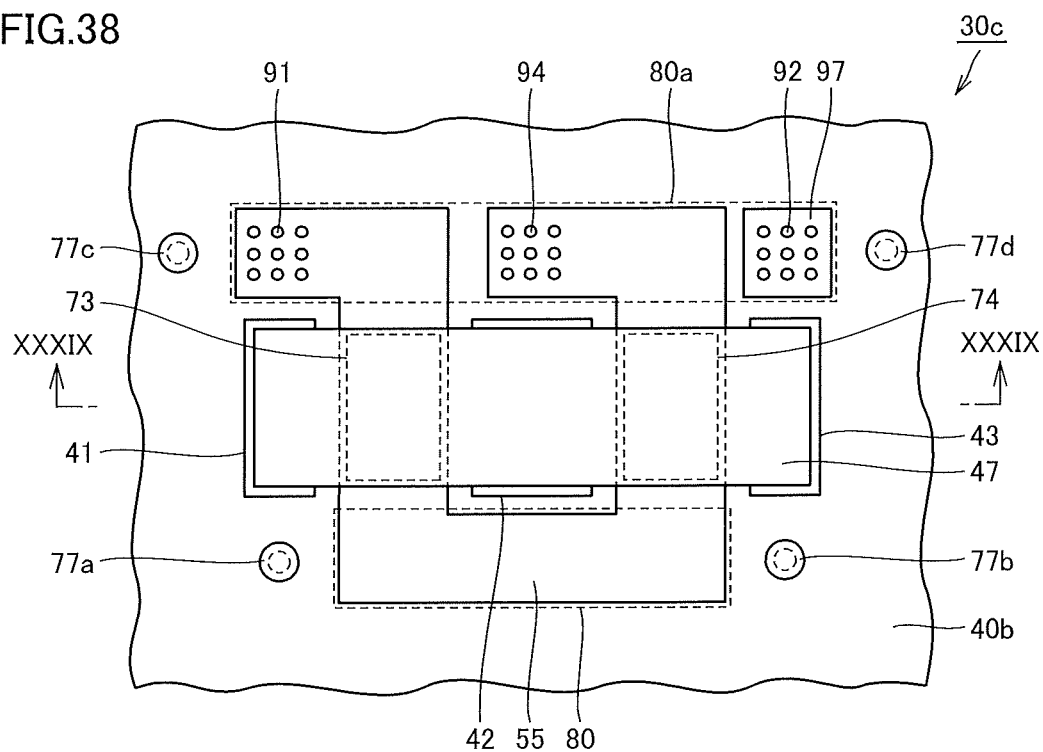
FIG. 38 is a schematic plan view of a circuit device according to a fourth embodiment of the present invention.

Referring to FIG. 33 and FIG. 34, in circuit device 30b, printed circuit board 40 includes second thermal pads 97, 97a disposed on second main surface 40b and spaced away from second coil pattern 55. Second thermal pads 97 and 97a may be positioned on both sides of third leg 47c of second core portion 47. Second coil pattern 55 includes a second extension portion 58, which is a partially extended portion of second coil pattern 55, at a position outside the current path of second coil pattern 55.

Figure 31:
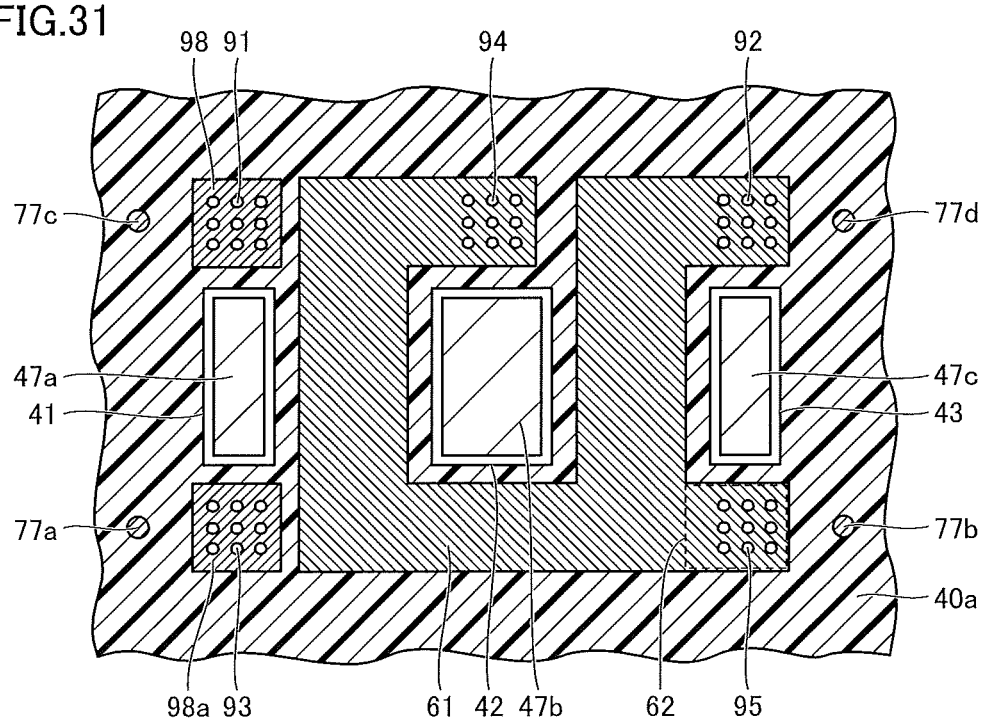
FIG. 31 is a schematic cross-sectional view taken along line XXXI-XXXI shown in FIG. 28 of the circuit device according to the third embodiment of the present invention.

Referring to FIG. 31, in circuit device 30b, printed circuit board 40 includes third thermal pads 98, 98a disposed on the same layer as first internal coil pattern 61 and spaced away from first internal coil pattern 61. Third thermal pads 98 and 98a may be positioned on both sides of first leg 47a of second core portion 47. First internal coil pattern 61 includes a second extension portion 62, which is a partially extended portion of first internal coil pattern 61, at a position outside the current path of first internal coil pattern 61.

Figure 32:
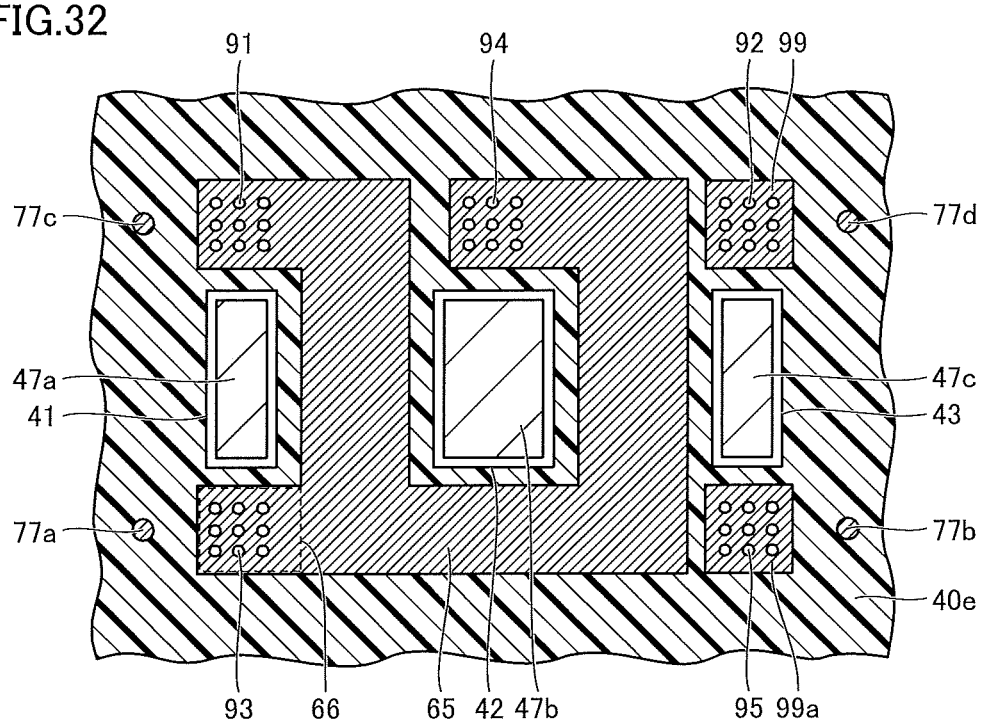
FIG. 32 is a schematic cross-sectional view taken along line XXXII-XXXII shown in FIG. 28 of the circuit device according to the third embodiment of the present invention.

Referring to FIG. 32, in circuit device 30b, printed circuit board 40 includes third thermal pads 99, 99a disposed on the same layer as second internal coil pattern 65 and spaced away from second internal coil pattern 65. Third thermal pads 99 and 99a may be positioned on both sides of third leg 47c of second core portion 47. Second internal coil pattern 65 includes a second extension portion 66, which is a partially extended portion of second internal coil pattern 65, at a position outside the current path of second internal coil pattern 65.

First thermal pad 96a, second thermal pads 97, 97a, and third thermal pads 98, 98a, 99, 99a are formed of a material having a thermal resistivity lower than that of first base layer 40c, second base layer 40d, and third base layer 40e of printed circuit board 40. First thermal pad 96a, second thermal pads 97, 97a, and third thermal pads 98, 98a, 99, 99a may be formed of, for example, copper.

Referring to FIG. 27 and FIG. 29 to FIG. 37, printed circuit board 40 of circuit device 30b of the present embodiment includes thermal vias 93, 95 in addition to thermal vias 91, 92, 94. Each of thermal vias 93, 95 may have a similar configuration to thermal via 81 in the first embodiment. Each of thermal vias 93, 95 may have electrical conductivity and may have electrical insulation properties.

Thermal via 93 may thermally connect second extension portion 58, 66 of at least one of second coil pattern 55 and third coil pattern 60 to first thermal pad 96a. In the present embodiment, thermal via 93 thermally connects first thermal pad 96a, third thermal pad 98a, second extension portion 66 of second internal coil pattern 65, and second extension portion 58 of second coil pattern 55.

Thermal via 95 may thermally connect second extension portion 62 of at least one of second coil pattern 55 and third coil pattern 60 to first extension portion 53 of first coil pattern 50. In the present embodiment, thermal via 95 thermally connects first extension portion 53 of first coil pattern 50, second extension portion 62 of first internal coil pattern 61, third thermal pad 99a, and second thermal pad 97a.

Thermal via 91 thermally connects first thermal pad 96, third thermal pad 98, second internal coil pattern 65, and second coil pattern 55. Thermal via 92 thermally connects first coil pattern 50, first internal coil pattern 61, third thermal pad 99, and second thermal pad 97.

Referring to FIG. 27 and FIG. 29, second heat transfer member 80 may extend along the longitudinal direction of first coil pattern 50 on second portion 52 of first coil pattern 50. Second heat transfer member 80 may extend so as to connect thermal via 93 and thermal via 95. Second heat transfer member 80 may extend so as to connect first thermal pad 96a and first extension portion 53 of first coil pattern 50.

Second heat transfer member 80 is in surface contact with first extension portion 53 of first coil pattern 50 and first thermal pad 96a, in addition to second portion 52 of first coil pattern 50. Second heat transfer member 80a may extend so as to connect thermal via 91 and thermal via 92. Second heat transfer member 80a may extend so as to connect first thermal pad 96 and both ends of first coil pattern 50. Second heat transfer member 80a is in surface contact with first thermal pad 96, in addition to second portion 52 of first coil pattern 50.

Referring to FIG. 29, FIG. 30, and FIG. 35 to FIG. 37, the path for dissipating heat generated in first portion 51 of first coil pattern 50 to the surrounding atmosphere includes the following fourth to sixth heat dissipation paths, in addition to the first to third heat dissipation paths in the second embodiment.

The fourth heat dissipation path includes first extension portion 53 of first coil pattern 50. Because of first heat transfer members 70, 71, heat generated in first portion 51 of first coil pattern 50 is spread to first heat transfer members 70, 71 and the entire first coil pattern 50 with low thermal resistance. This heat is dissipated from the surface of first extension portion 53 of first coil pattern 50 to the surrounding atmosphere.

The fifth heat dissipation path includes first extension portion 53, second heat transfer member 80, and heat dissipator 6. Because of first heat transfer members 70, 71, heat generated in first portion 51 of first coil pattern 50 is spread to first extension portion 53 with low thermal resistance. First extension portion 53 is in surface contact with second heat transfer member 80. Second heat transfer member 80 is in surface contact with heat dissipator 6. Therefore, this heat is transferred with low thermal resistance to heat dissipator 6 and dissipated from heat dissipator 6 to the surrounding atmosphere.

The sixth heat dissipation path includes printed circuit board 40, first thermal pad 96a, second heat transfer member 80, and heat dissipator 6. Part of heat generated in first portion 51 of first coil pattern 50 is transferred in the inside of printed circuit board 40 and further transferred to first thermal pad 96a. First thermal pad 96a is in surface contact with second heat transfer member 80. Second heat transfer member 80 is in surface contact with heat dissipator 6. Therefore, this heat is transferred with low thermal resistance to heat dissipator 6 and dissipated from heat dissipator 6 to the surrounding atmosphere.

In circuit device 30b of the present embodiment, heat generated in first portion 51 of first coil pattern 50 is dissipated to the surrounding atmosphere through a plurality of heat dissipation paths. In circuit device 30b according to the present embodiment, temperature increase of first portion 51 of first coil pattern 50 arranged between first core portion 46 and second core portion 47 can be suppressed.

Referring to FIG. 33 to FIG. 37, the path for dissipating heat generated in third portion 56 of second coil pattern 55 to the surrounding atmosphere includes the following fifth to seventh heat dissipation paths, in addition to the first to fourth heat dissipation paths in the second embodiment.

The fifth heat dissipation path includes second extension portion 58 of second coil pattern 55. Because of first heat transfer members 73, 74, heat generated in third portion 56 of second coil pattern 55 is spread to first heat transfer members 73, 74 and the entire second coil pattern 55 with low thermal resistance. This heat is dissipated from the surface of second extension portion 58 of second coil pattern 55 to the surrounding atmosphere.

The sixth heat dissipation path includes second extension portion 58, thermal via 93, first thermal pad 96a, second heat transfer member 80, and heat dissipator 6. Because of first heat transfer members 73, 74, heat generated in third portion 56 of second coil pattern 55 is spread to second extension portion 58 of second coil pattern 55 with low thermal resistance. This heat is transferred to first thermal pad 96a through thermal via 93. First thermal pad 96a is in surface contact with second heat transfer member 80. Second heat transfer member 80 is in surface contact with heat dissipator 6. Therefore, this heat is transferred with low thermal resistance to heat dissipator 6 and dissipated from heat dissipator 6 to the surrounding atmosphere.

The seventh heat dissipation path includes printed circuit board 40, second thermal pads 97, 97a, thermal vias 92, 95, first coil pattern 50, second heat transfer members 80, 80a, and heat dissipator 6. Part of heat generated in third portion 56 of second coil pattern 55 is transferred in the inside of printed circuit board 40 and further transferred to second thermal pads 97, 97a. This heat is transferred to first coil pattern 50 through thermal vias 92, 95. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

In circuit device 30b of the present embodiment, heat generated in third portion 56 of second coil pattern 55 is dissipated to the surrounding atmosphere through a plurality of heat dissipation paths. In circuit device 30b according to the present embodiment, temperature increase of third portion 56 of second coil pattern 55 arranged between first core portion 46 and second core portion 47 can be suppressed.

Referring to FIG. 31 and FIG. 35 to FIG. 37, the path for dissipating heat generated in the portion of first internal coil pattern 61 that is arranged between first core portion 46 and second core portion 47 to the surrounding atmosphere includes the following fourth to seventh heat dissipation paths, in addition to the first to third heat dissipation paths in the second embodiment.

The fourth heat dissipation path includes second extension portion 62 of first internal coil pattern 61, at least one of thermal via 95 and printed circuit board 40, first coil pattern 50 including first extension portion 53, second heat transfer members 80, 80a, and heat dissipator 6. Heat generated in the portion of first internal coil pattern 61 that is arranged between first core portion 46 and second core portion 47 is also spread to second extension portion 62 of first internal coil pattern 61. This heat is transferred to first coil pattern 50 including first extension portion 53 through at least one of thermal via 95 and printed circuit board 40. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The fifth heat dissipation path includes second extension portion 62 of first internal coil pattern 61, at least one of thermal via 95 and printed circuit board 40, first coil pattern 50 including first extension portion 53, and first heat transfer members 70, 71. Heat generated in the portion of first internal coil pattern 61 that is arranged between first core portion 46 and second core portion 47 is also spread to second extension portion 62 of first internal coil pattern 61. This heat is transferred to first coil pattern 50 including first extension portion 53 through at least one of thermal via 95 and printed circuit board 40. Because of first heat transfer members 70, 71, this heat is spread to the entire first coil pattern 50 and first heat transfer members 70, 71 with low thermal resistance. Therefore, this heat is dissipated from the surfaces of first heat transfer members 70, 71 and the surface of first coil pattern 50 to the surrounding atmosphere.

The sixth heat dissipation path includes printed circuit board 40, third thermal pads 98, 98a, thermal vias 91, 93, first thermal pads 96, 96a, second heat transfer members 80, 80a, and heat dissipator 6. Part of heat generated in the portion of first internal coil pattern 61 that is arranged between first core portion 46 and second core portion 47 is transferred in the inside of printed circuit board 40 and further transferred to third thermal pads 98, 98a. This heat is transferred to first thermal pads 96, 96a through thermal vias 91, 93. First thermal pads 96, 96a are in surface contact with second heat transfer members 80, 80a. Second heat transfer member 80 is in surface contact with heat dissipator 6. Therefore, this heat is transferred with low thermal resistance to heat dissipator 6 and dissipated from heat dissipator 6 to the surrounding atmosphere.

The seventh heat dissipation path includes printed circuit board 40, third thermal pads 98, 98a, thermal vias 91, 93, second coil pattern 55, and first heat transfer members 73, 74. Part of heat generated in the portion of first internal coil pattern 61 that is arranged between first core portion 46 and second core portion 47 is transferred in the inside of printed circuit board 40 and further transferred to third thermal pads 98, 98a. This heat is transferred to transferred to second coil pattern 55 including second extension portion 58 through thermal vias 91, 93. Because of first heat transfer members 73, 74, this heat is spread to the entire second coil pattern 55 and first heat transfer members 73, 74 with low thermal resistance. Therefore, this heat is dissipated from the surfaces of first heat transfer members 73, 74 and the surface of second coil pattern 55 to the surrounding atmosphere.

In circuit device 30b of the present embodiment, heat generated in the portion of first internal coil pattern 61 that is arranged between first core portion 46 and second core portion 47 is dissipated to the surrounding atmosphere through a plurality of heat dissipation paths. In circuit device 30b according to the present embodiment, temperature increase of the portion of first internal coil pattern 61 that is arranged between first core portion 46 and second core portion 47 can be suppressed.

Referring to FIG. 32 and FIG. 35 to FIG. 37, the path for dissipating heat generated in the portion of second internal coil pattern 65 that is arranged between first core portion 46 and second core portion 47 to the surrounding atmosphere includes the following fifth to eighth heat dissipation paths, in addition to the first to fourth heat dissipation paths in the second embodiment.

The fifth heat dissipation path includes second extension portion 66 of second internal coil pattern 65, thermal via 93, first thermal pad 96a, second heat transfer member 80, and heat dissipator 6. Heat generated in the portion of second internal coil pattern 65 that is arranged between first core portion 46 and second core portion 47 is also spread to second extension portion 66 of second internal coil pattern 65. This heat is transferred to first thermal pad 96a through thermal via 93. First thermal pad 96a is in surface contact with second heat transfer member 80. Second heat transfer member 80 is in surface contact with heat dissipator 6. Therefore, this heat is transferred with low thermal resistance to heat dissipator 6 and dissipated from heat dissipator 6 to the surrounding atmosphere.

The sixth heat dissipation path includes second extension portion 66 of second internal coil pattern 65, at least one of thermal via 93 and printed circuit board 40, second coil pattern 55 including second extension portion 58, and first heat transfer members 73, 74. Heat generated in the portion of second internal coil pattern 65 that is arranged between first core portion 46 and second core portion 47 is also spread to second extension portion 66 of second internal coil pattern 65. This heat is transferred to second coil pattern 55 including second extension portion 58 through at least one of thermal via 93 and printed circuit board 40. Because of first heat transfer members 73, 74, this heat is spread to the entire second coil pattern 55 and first heat transfer members 73, 74 with low thermal resistance. Therefore, this heat is dissipated from the surfaces of first heat transfer members 73, 74 and the surface of second coil pattern 55 to the surrounding atmosphere.

The seventh heat dissipation path includes printed circuit board 40, third thermal pads 99, 99a, thermal vias 92, 95, first coil pattern 50, second heat transfer members 80, 80a, and heat dissipator 6. Part of heat generated in the portion of second internal coil pattern 65 that is arranged between first core portion 46 and second core portion 47 is transferred in the inside of printed circuit board 40 and further transferred to third thermal pads 99, 99a. This heat is transferred to first coil pattern 50 including first extension portion 53 through thermal vias 92, 95. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The eighth heat dissipation path includes printed circuit board 40, third thermal pads 99, 99a, thermal vias 92, 95, first coil pattern 50, and first heat transfer members 70, 71. Part of heat generated in the portion of second internal coil pattern 65 that is arranged between first core portion 46 and second core portion 47 is transferred in the inside of printed circuit board 40 and further transferred to third thermal pads 99, 99a. This heat is transferred to first coil pattern 50 including first extension portion 53 through thermal vias 92, 95. Because of first heat transfer members 70, 71, this heat is spread to the entire first coil pattern 50 and first heat transfer members 70, 71 with low thermal resistance. Therefore, this heat is dissipated from the surfaces of first heat transfer members 70, 71 and the surface of first coil pattern 50 to the surrounding atmosphere.

In circuit device 30b of the present embodiment, heat generated in the portion of second internal coil pattern 65 that is arranged between first core portion 46 and second core portion 47 is dissipated to the surrounding atmosphere through a plurality of heat dissipation paths. In circuit device 30b according to the present embodiment, temperature increase of the portion of second internal coil pattern 65 that is arranged between first core portion 46 and second core portion 47 can be suppressed.

The effects of circuit device 30b of the present embodiment will be described. Circuit device 30b of the present embodiment achieves similar effects as in circuit device 30a of the second embodiment but differs mainly in the following points.

In circuit device 30b of the present embodiment, first coil pattern 50 may include first extension portion 53, which is a partially extended portion of first coil pattern 50, at a position outside the current path of first coil pattern 50. Thermal via 95 may connect at least one of second coil pattern 55 and third coil pattern 60 (first internal coil pattern 61) to first extension portion 53 of first coil pattern 50. More specifically, at least one of second coil pattern 55 and third coil pattern 60 (first internal coil pattern 61) includes second extension portion 62, which is a partially extended portion of at least one of second coil pattern 55 and third coil pattern 60 (first internal coil pattern 61), at a position outside the current path of at least one of second coil pattern 55 and third coil pattern 60 (first internal coil pattern 61), and thermal via 95 may connect second extension portion 62 to first extension portion 53 of first coil pattern 50.

Heat generated in at least one of second coil pattern 55 and third coil pattern 60 is thus dissipated to the surrounding atmosphere with low thermal resistance through first extension portion 53 of first coil pattern 50. In circuit device 30b according to the present embodiment, temperature increase of at least one of second coil pattern 55 and third coil pattern 60 can be suppressed.

In circuit device 30b of the present embodiment, at least one of second coil pattern 55 and third coil pattern 60 (second internal coil pattern 65) may include second extension portion 58, 66, which is a partially extended portion of at least one of second coil pattern 55 and third coil pattern 60 (second internal coil pattern 65), at a position outside the current path of at least one of second coil pattern 55 and third coil pattern 60 (second internal coil pattern 65). Thermal via 93 may connect second extension portion 58, 66 of at least one of second coil pattern 55 and third coil pattern 60 (second internal coil pattern 65) to first thermal pad 96a.

Heat generated in at least one of second coil pattern 55 and third coil pattern 60 is transferred to heat dissipator 6 with low thermal resistance through first thermal pad 96a. This heat is dissipated from heat dissipator 6 to the surrounding atmosphere. In circuit device 30b according to the present embodiment, temperature increase of at least one of second coil pattern 55 and third coil pattern 60 can be suppressed.

Fourth Embodiment

Referring to FIG. 19, FIG. 24, and FIG. 38 to FIG. 43, a circuit device 30c of a fourth embodiment will be described. Circuit device 30c of the present embodiment has a similar configuration to circuit device 30a of the second embodiment but differs mainly in the following points.

Printed circuit board 40 of circuit device 30c of the present embodiment includes thermal vias 101a, 101b, 102a, 102b in addition to thermal vias 91, 92, 94. Each of thermal vias 101a, 101b, 102a, 102b may have a similar configuration to thermal via 81 in the first embodiment. Each of thermal vias 101a, 101b, 102a, 102b may have electrical conductivity and may have electrical insulation properties.

Figure 39:
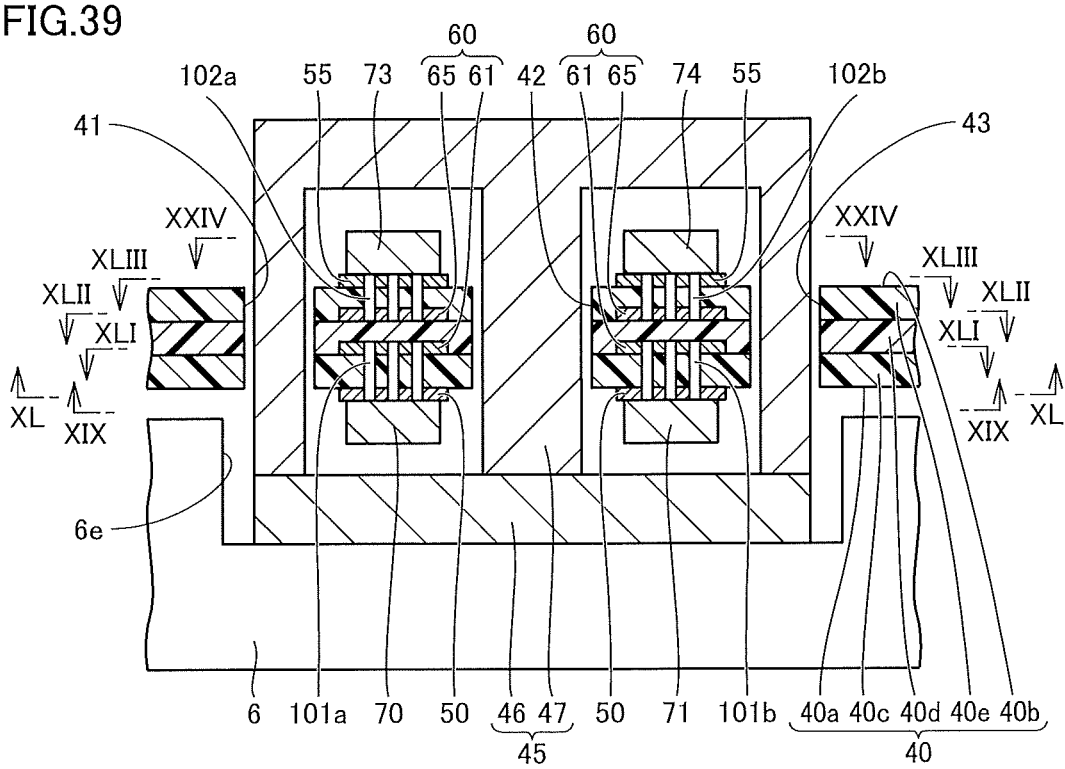
FIG. 39 is a schematic cross-sectional view taken along line XXXIX-XXXIX shown in FIG. 38 of the circuit device according to the fourth embodiment of the present invention.
Figure 40:
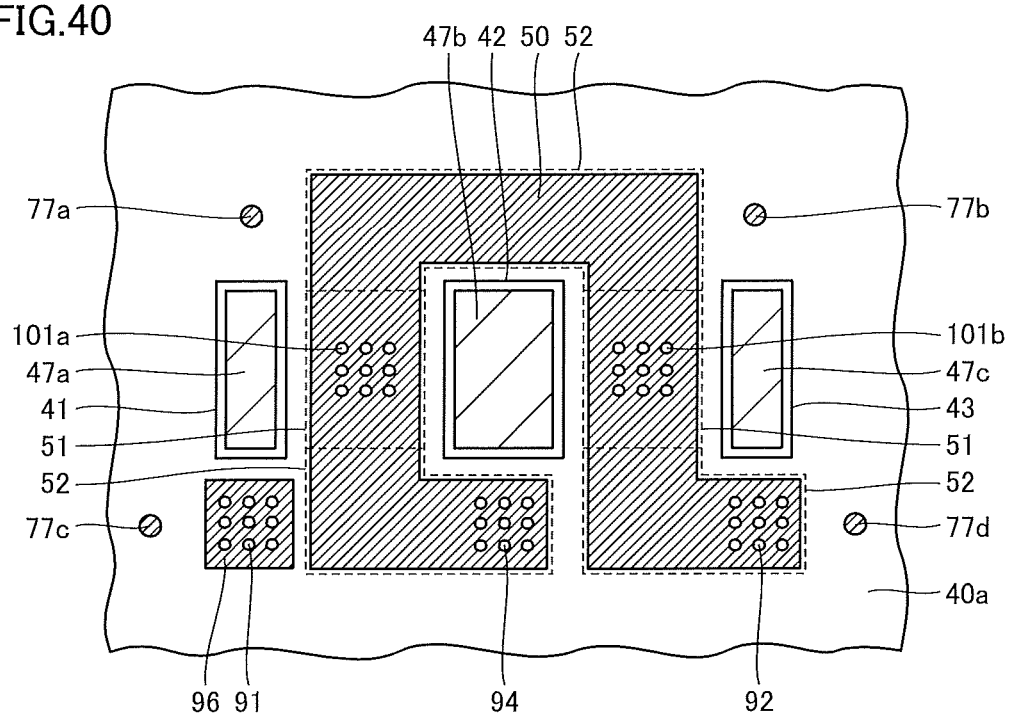
FIG. 40 is a schematic cross-sectional view taken along line XL-XL shown in FIG. 39 of the circuit device according to the fourth embodiment of the present invention.
Figure 41:
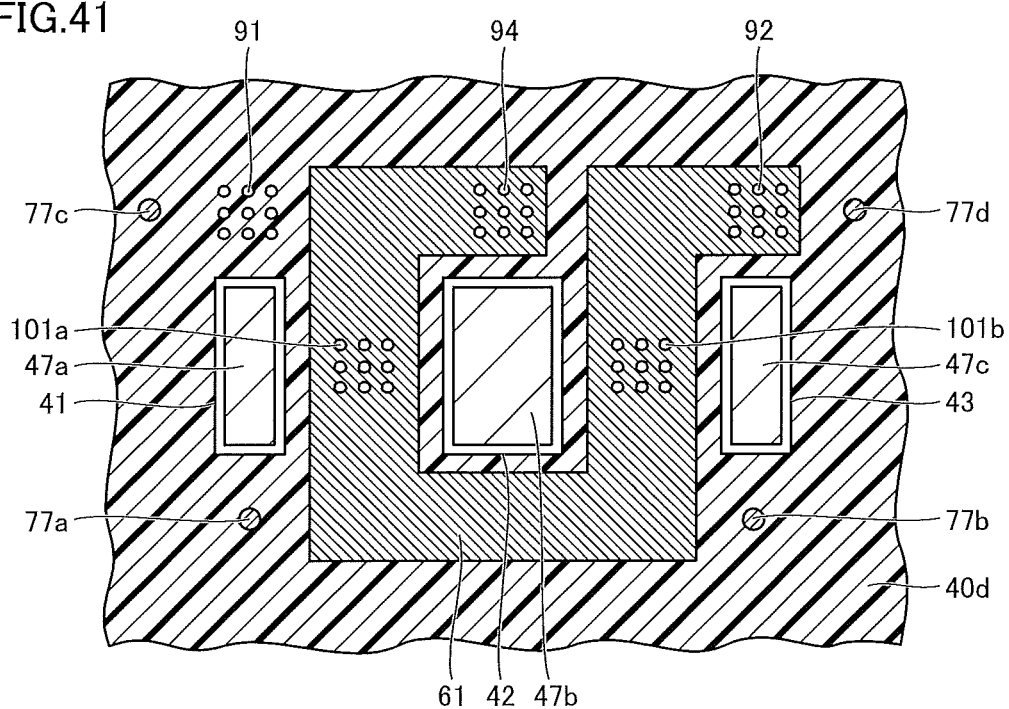
FIG. 41 is a schematic cross-sectional view taken along line XLI-XLI shown in FIG. 39 of the circuit device according to the fourth embodiment of the present invention.

Referring to FIG. 39 to FIG. 41, thermal vias 101a, 101b thermally connect first portion 51 of first coil pattern 50 with the portion of first internal coil pattern 61 that is arranged between first core portion 46 and second core portion 47. Thermal vias 101a, 101b are not connected to second internal coil pattern 65 or second coil pattern 55. In circuit device 30c of the present embodiment, since first coil pattern 50 and first internal coil pattern 61 are electrically connected in parallel with each other through thermal vias 92, 94, thermal vias 101a, 101b may have electrical conductivity.

Figure 42:
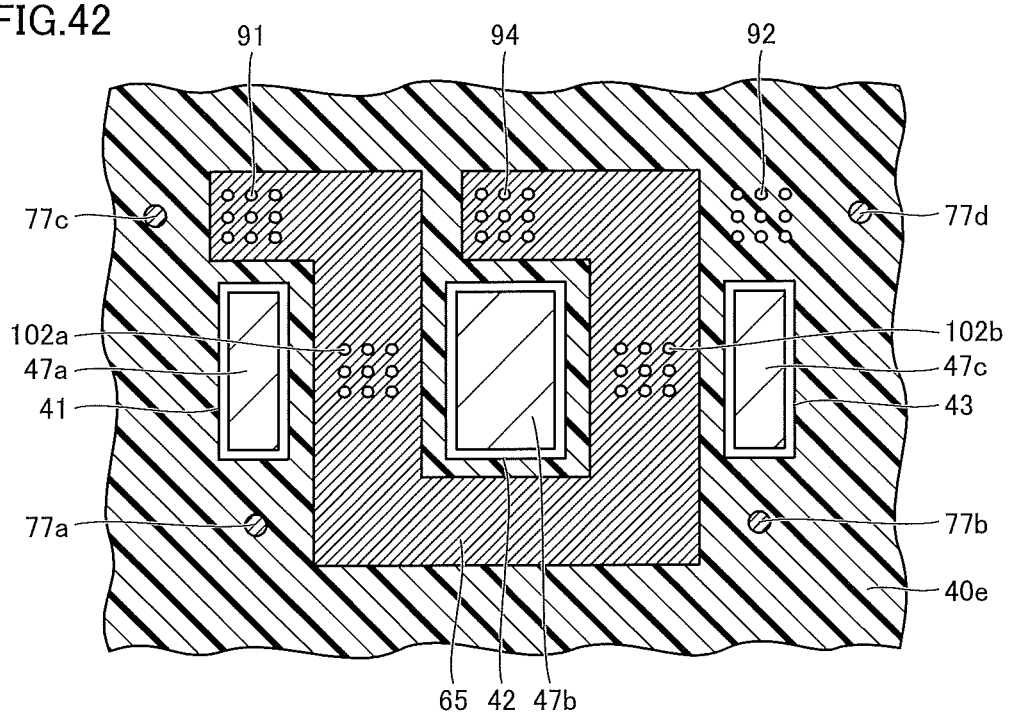
FIG. 42 is a schematic cross-sectional view taken along line XLII-XLII shown in FIG. 39 of the circuit device according to the fourth embodiment of the present invention.
Figure 43:
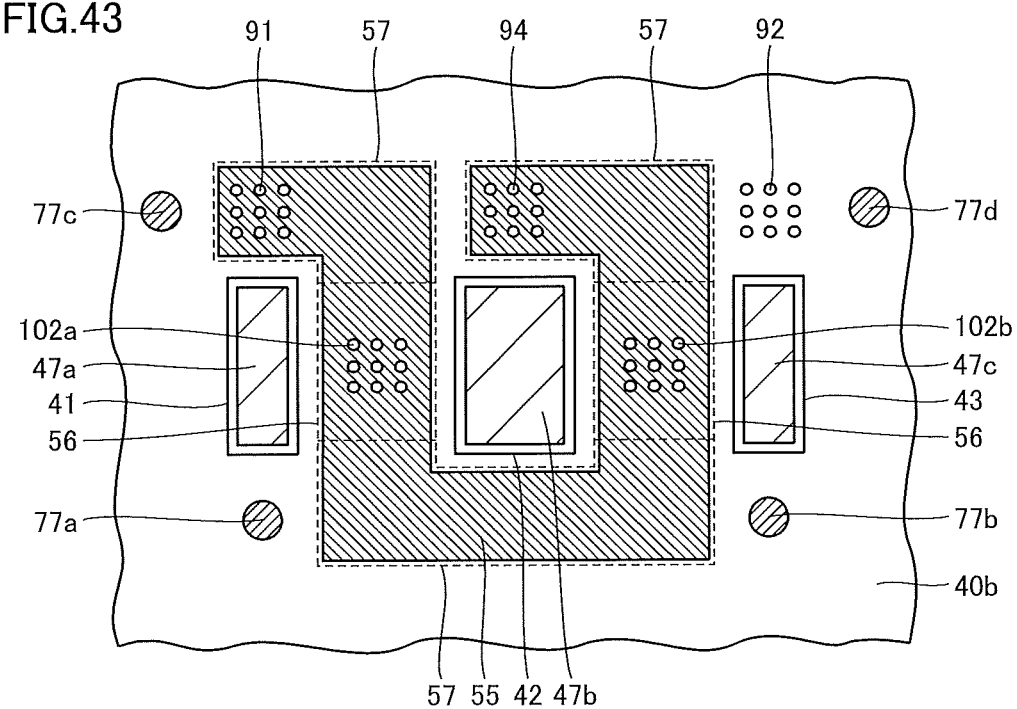
FIG. 43 is a schematic cross-sectional view taken along line XLIII-XLIII shown in FIG. 39 of the circuit device according to the fourth embodiment of the present invention.

Referring to FIG. 39, FIG. 42, and FIG. 43, thermal vias 102a, 102b thermally connect third portion 56 of second coil pattern 55 with the portion of second internal coil pattern 65 that is arranged between first core portion 46 and second core portion 47. Thermal vias 102a, 102b are not connected to first internal coil pattern 61 or first coil pattern 50. In circuit device 30c of the present embodiment, since second coil pattern 55 and second internal coil pattern 65 are electrically connected in parallel with each other through thermal vias 91, 94, thermal vias 102a, 102b may have electrical conductivity.

Referring to FIG. 39 to FIG. 41, the path for dissipating heat generated in the portion of first internal coil pattern 61 that is arranged between first core portion 46 and second core portion 47 to the surrounding atmosphere includes the following fourth and fifth heat dissipation paths, in addition to the first to third heat dissipation paths in the second embodiment.

The fourth heat dissipation path includes thermal vias 101a, 101b, first coil pattern 50, second heat transfer members 80, 80a, and heat dissipator 6. Heat generated in the portion of first internal coil pattern 61 that is arranged between first core portion 46 and second core portion 47 is transferred to first coil pattern 50 through thermal vias 101a, 101b. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The fifth heat dissipation path includes thermal vias 101a, 101b, first coil pattern 50, and first heat transfer members 70, 71. Heat generated in the portion of first internal coil pattern 61 that is arranged between first core portion 46 and second core portion 47 is transferred to first coil pattern 50 through thermal vias 101a, 101b. Because of first heat transfer members 70, 71, this heat is spread to the entire first coil pattern 50 and first heat transfer members 70, 71 with low thermal resistance. Therefore, this heat is dissipated from the surfaces of first heat transfer members 70, 71 and the surface of first coil pattern 50 to the surrounding atmosphere.

In circuit device 30c of the present embodiment, heat generated in the portion of first internal coil pattern 61 that is arranged between first core portion 46 and second core portion 47 is dissipated to the surrounding atmosphere through a plurality of heat dissipation paths. In circuit device 30c according to the present embodiment, temperature increase of the portion of first internal coil pattern 61 that is arranged between first core portion 46 and second core portion 47 can be suppressed.

Referring to FIG. 39, FIG. 42, and FIG. 43, the path for dissipating heat generated in the portion of second internal coil pattern 65 that is arranged between first core portion 46 and second core portion 47 to the surrounding atmosphere includes the following fifth heat dissipation path, in addition to the first to fourth heat dissipation paths in the second embodiment.

The fifth heat dissipation path includes thermal vias 102a, 102b, second coil pattern 55, and first heat transfer members 73, 74. Heat generated in the portion of second internal coil pattern 65 that is arranged between first core portion 46 and second core portion 47 is transferred to second coil pattern 55 through thermal vias 102a, 102b. Because of first heat transfer members 73, 74, this heat is spread to the entire second coil pattern 55 and first heat transfer members 73, 74 with low thermal resistance. Therefore, this heat is dissipated from the surfaces of first heat transfer members 73, 74 and the surface of second coil pattern 55 to the surrounding atmosphere.

In circuit device 30c of the present embodiment, heat generated in the portion of second internal coil pattern 65 that is arranged between first core portion 46 and second core portion 47 is dissipated to the surrounding atmosphere through a plurality of heat dissipation paths. In circuit device 30c according to the present embodiment, temperature increase of the portion of second internal coil pattern 65 that is arranged between first core portion 46 and second core portion 47 can be suppressed.

The effects of circuit device 30c of the present embodiment will be described. Circuit device 30c of the present embodiment achieves the following effects in addition to the effects of circuit device 30a of the second embodiment. Printed circuit board 40 of circuit device 30c of the present embodiment includes thermal vias 101a, 101b, 102a, 102b. Heat generated in third coil pattern 60 is thus dissipated with low thermal resistance to the surrounding atmosphere through thermal vias 101a, 101b, 102a, 102b. In circuit device 30c according to the present embodiment, temperature increase of third coil pattern 60 can be suppressed.

Fifth Embodiment

Referring to FIG. 44 to FIG. 54, a circuit device 30d of a fifth embodiment will be described. Circuit device 30d of the present embodiment has a similar configuration to circuit device 30a of the second embodiment and achieves similar effects, but differs mainly in the following points.

Figure 44:
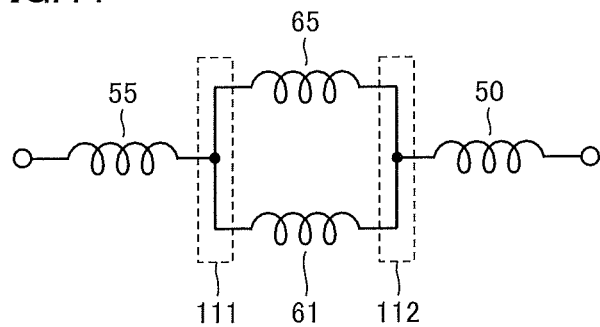
FIG. 44 is a coil connection diagram of a circuit device according to a fifth embodiment of the present invention.

Referring to FIG. 44, the coil pattern in circuit device 30d of the present embodiment has a circuit configuration of three-turn connection. Printed circuit board 40 of circuit device 30d of the present embodiment includes thermal vias 111, 112. Each of thermal vias 111, 112 has a similar configuration to thermal via 81 in the first embodiment. Each of thermal vias 111, 112 has electrical conductivity. First internal coil pattern 61 and second internal coil pattern 65 are electrically connected in parallel through thermal vias 111, 112. Second coil pattern 55 is electrically connected in series with first internal coil pattern 61 and second internal coil pattern 65 through thermal via 111. First coil pattern 50 is electrically connected in series with first internal coil pattern 61 and second internal coil pattern 65 through thermal via 112.

Referring to FIG. 45 and FIG. 47 to FIG. 54, each of thermal vias 111, 112 passes from first main surface 40a to second main surface 40b of printed circuit board 40. Thermal via 111 is electrically and thermally connected to second coil pattern 55, first internal coil pattern 61, and second internal coil pattern 65 but is not electrically and thermally connected to first coil pattern 50. Thermal via 112 is electrically and thermally connected to first coil pattern 50, first internal coil pattern 61, and second internal coil pattern 65 but is not electrically and thermally connected to second coil pattern 55.

Figure 47:
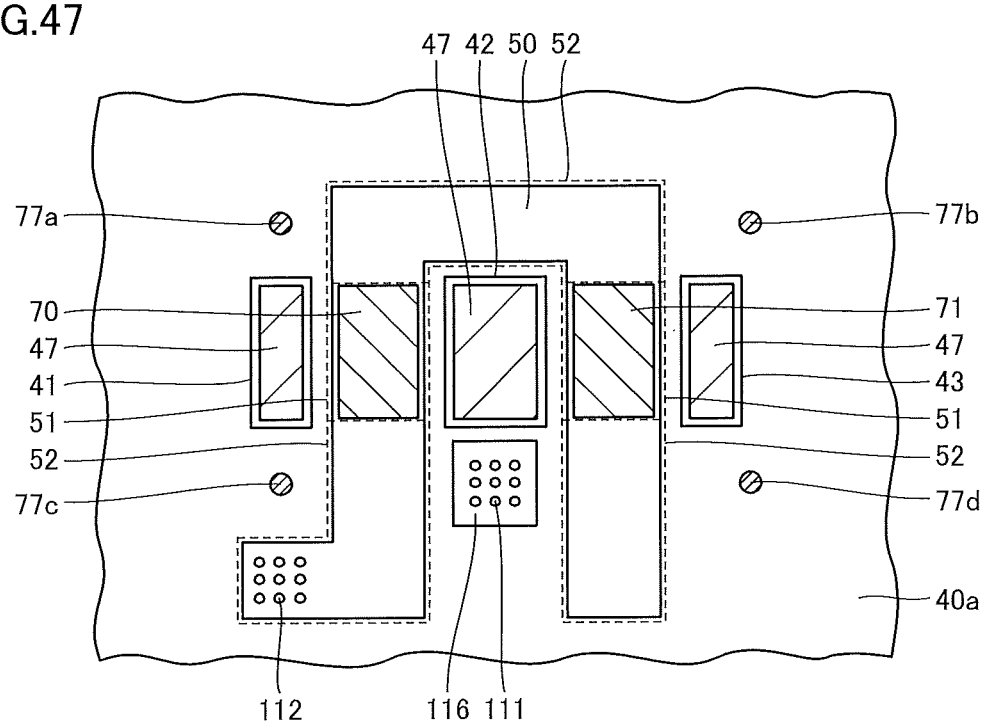
FIG. 47 is a schematic cross-sectional view taken along line XLVII-XLVII shown in FIG. 46 of the circuit device according to the fifth embodiment of the present invention.
Figure 48:
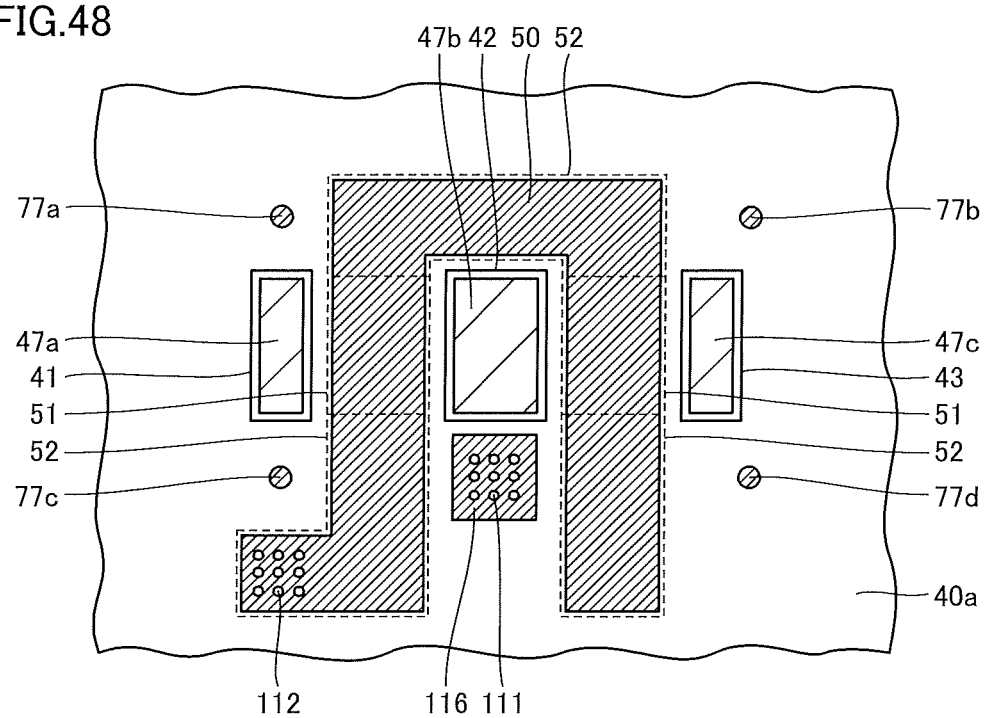
FIG. 48 is a schematic cross-sectional view taken along line XLVIII-XLVIII shown in FIG. 46 of the circuit device according to the fifth embodiment of the present invention.
Figure 54:
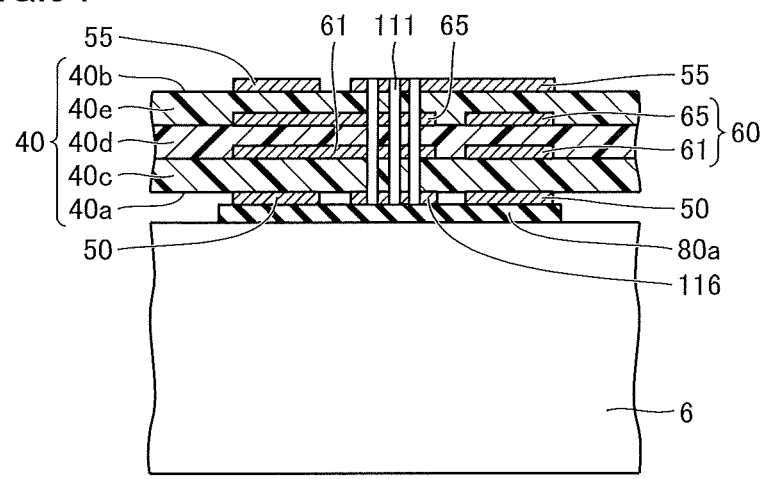
FIG. 54 is a schematic cross-sectional view taken along line LIV-LIV shown in FIG. 45 of the circuit device according to the fifth embodiment of the present invention.

Referring to FIG. 47, FIG. 48, and FIG. 54, printed circuit board 40 includes a first thermal pad 116 disposed on first main surface 40a and spaced away from first coil pattern 50. First thermal pad 116 may be disposed in a region adjacent to the second leg of second core portion 47 and where first coil pattern 50 is not present. Thermal via 111 may thermally connect at least one of second coil pattern 55 and third coil pattern 60 to first thermal pad 116. In the present embodiment, thermal via 111 thermally connects second coil pattern 55, first internal coil pattern 61, and second internal coil pattern 65 to first thermal pad 116.

Figure 45:
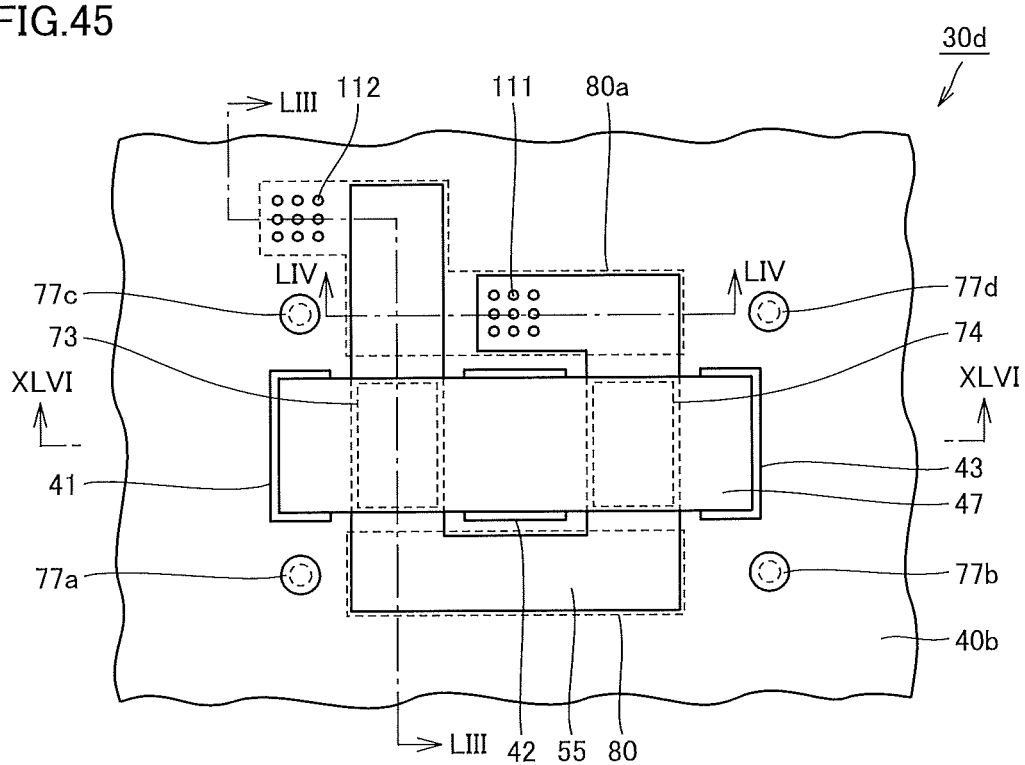
FIG. 45 is a schematic plan view of the circuit device according to the fifth embodiment of the present invention.
Figure 46:
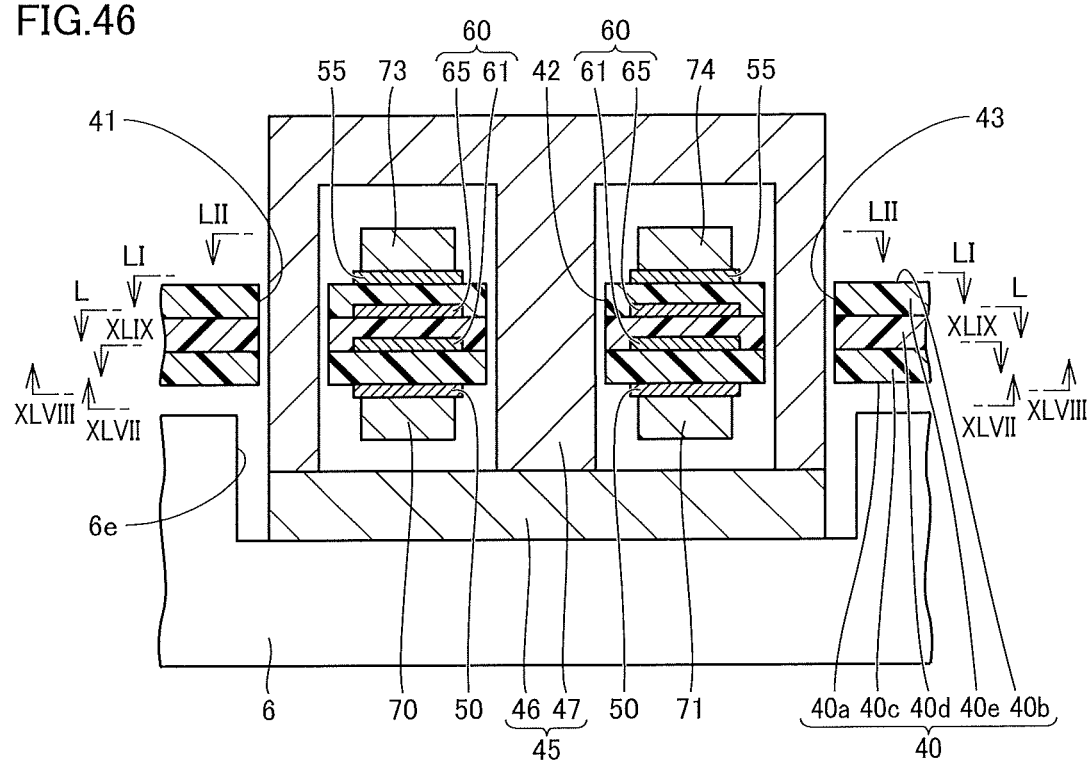
FIG. 46 is a schematic cross-sectional view taken along line XLVI-XLVI shown in FIG. 45 of the circuit device according to the fifth embodiment of the present invention.

Referring to FIG. 45, second heat transfer member 80a may extend so as to connect thermal via 111 and thermal via 112. Second heat transfer member 80a may be in surface contact with first coil pattern 50. First thermal pad 116 is in surface contact with second heat transfer member 80a and thermally connected to second heat transfer member 80a.

Referring to FIG. 47, FIG. 48, FIG. 53, and FIG. 54, the path for dissipating heat generated in first portion 51 of first coil pattern 50 to the surrounding atmosphere includes the following first to third heat dissipation paths.

The first heat dissipation path includes first heat transfer members 70, 71 and first coil pattern 50. Because of first heat transfer members 70, 71, heat generated in first portion 51 of first coil pattern 50 is spread to first heat transfer members 70, 71 and second portion 52 of first coil pattern 50 with low thermal resistance. This heat is dissipated from the surfaces of first heat transfer members 70, 71 and the surface of second portion 52 of first coil pattern 50 to the surrounding atmosphere.

The second heat dissipation path includes first coil pattern 50, second heat transfer members 80, 80a, and heat dissipator 6. Because of first heat transfer members 70, 71, heat generated in first portion 51 of first coil pattern 50 is spread to second portion 52 of first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The third heat dissipation path includes printed circuit board 40, first thermal pad 116, second heat transfer member 80a, and heat dissipator 6. Part of heat generated in first portion 51 of first coil pattern 50 is transferred in the inside of printed circuit board 40 and further transferred to first thermal pad 116. First thermal pad 116 is in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

In circuit device 30d of the present embodiment, heat generated in first portion 51 of first coil pattern 50 is dissipated to the surrounding atmosphere through a plurality of heat dissipation paths. In circuit device 30d according to the present embodiment, temperature increase of first portion 51 of first coil pattern 50 arranged between first core portion 46 and second core portion 47 can be suppressed.

Referring to FIG. 51 to FIG. 54, the path for dissipating heat generated in third portion 56 of second coil pattern 55 to the surrounding atmosphere includes the following first and second heat dissipation paths.

The first heat dissipation path includes first heat transfer members 73, 74 and second coil pattern 55. Because of first heat transfer members 73, 74, heat generated in third portion 56 of second coil pattern 55 is spread to first heat transfer members 73, 74 and fourth portion 57 of second coil pattern 55 with low thermal resistance. This heat is dissipated from the surfaces of first heat transfer members 73, 74 and the surface of fourth portion 57 of second coil pattern 55 to the surrounding atmosphere.

The second heat dissipation path includes second coil pattern 55, thermal via 111, first thermal pad 116, second heat transfer member 80a, and heat dissipator 6. Because of first heat transfer members 73, 74, heat generated in third portion 56 of second coil pattern 55 is spread to fourth portion 57 of second coil pattern 55 with low thermal resistance. This heat is transferred to first thermal pad 116 through thermal via 111. First thermal pad 116 is in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

In circuit device 30d of the present embodiment, heat generated in third portion 56 of second coil pattern 55 is dissipated to the surrounding atmosphere through a plurality of heat dissipation paths. In circuit device 30d according to the present embodiment, temperature increase of third portion 56 of second coil pattern 55 arranged between first core portion 46 and second core portion 47 can be suppressed.

Figure 49:
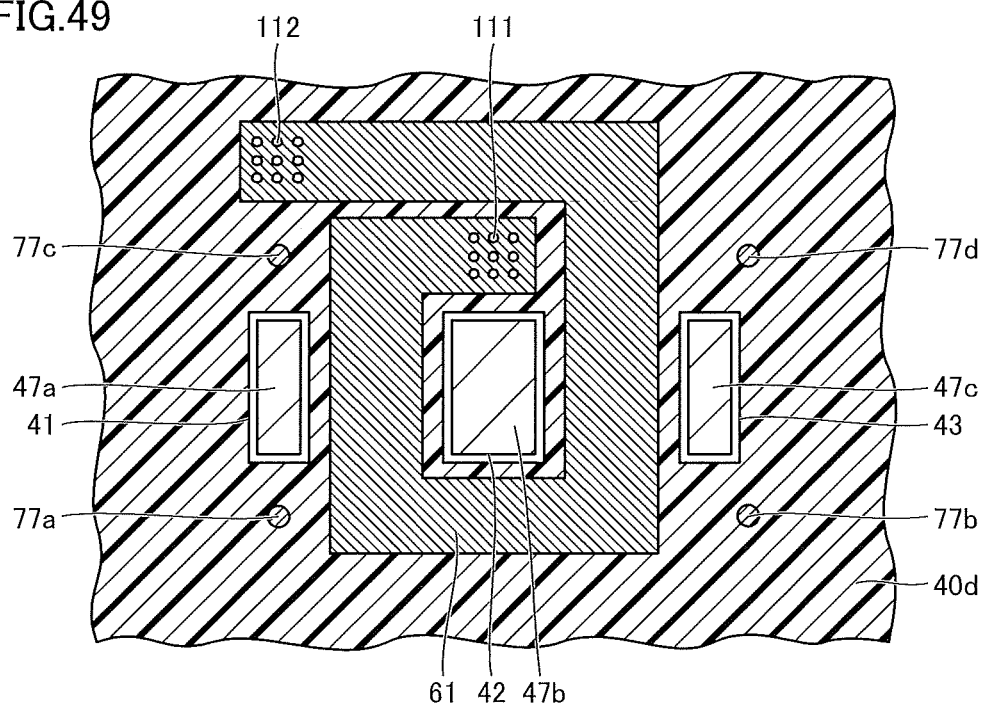
FIG. 49 is a schematic cross-sectional view taken along line XLIX-XLIX shown in FIG. 46 of the circuit device according to the fifth embodiment of the present invention.
Figure 53:
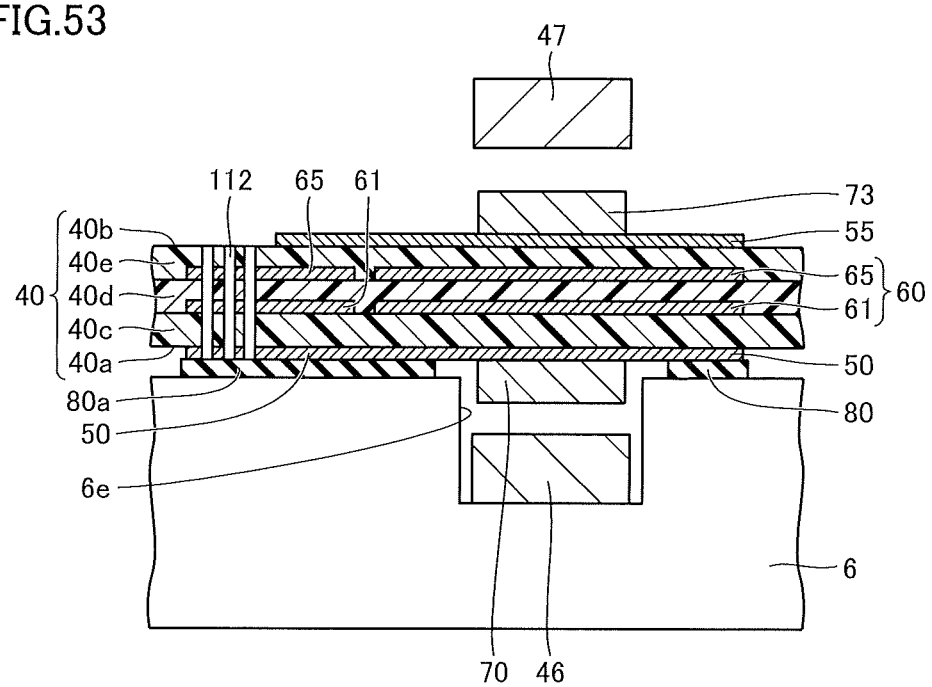
FIG. 53 is a schematic cross-sectional view taken along line LIII-LIII shown in FIG. 45 of the circuit device according to the fifth embodiment of the present invention.

Referring to FIG. 49, FIG. 53, and FIG. 54, the path for dissipating heat generated in the portion of first internal coil pattern 61 that is arranged between first core portion 46 and second core portion 47 to the surrounding atmosphere includes the following first to fourth heat dissipation paths.

The first heat dissipation path includes first internal coil pattern 61, at least one of thermal via 112 and printed circuit board 40, first coil pattern 50, second heat transfer members 80, 80a, and heat dissipator 6. Heat generated in the portion of first internal coil pattern 61 that is arranged between first core portion 46 and second core portion 47 is spread over the entire first internal coil pattern 61. This heat is transferred to first coil pattern 50 through at least one of thermal via 112 and printed circuit board 40. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The second heat dissipation path includes first internal coil pattern 61, at least one of thermal via 112 and printed circuit board 40, first coil pattern 50, and first heat transfer members 70, 71. Heat generated in the portion of first internal coil pattern 61 that is arranged between first core portion 46 and second core portion 47 is spread over the entire first internal coil pattern 61. This heat is transferred to first coil pattern 50 through at least one of thermal via 112 and printed circuit board 40. Because of first heat transfer members 70, 71, this heat is spread to the entire first coil pattern 50 and first heat transfer members 70, 71 with low thermal resistance. Therefore, this heat is dissipated from the surfaces of first heat transfer members 70, 71 and the surface of first coil pattern 50 to the surrounding atmosphere.

The third heat dissipation path includes first internal coil pattern 61, at least one of thermal via 111 and printed circuit board 40, first thermal pad 116, second heat transfer member 80a, and heat dissipator 6. Heat generated in the portion of first internal coil pattern 61 that is arranged between first core portion 46 and second core portion 47 is spread over the entire first internal coil pattern 61. This heat is transferred to first thermal pad 116 through at least one of thermal via 111 and printed circuit board 40. First thermal pad 116 is in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

The fourth heat dissipation path includes first internal coil pattern 61, thermal via 111, second coil pattern 55, and first heat transfer members 73, 74. Heat generated in the portion of first internal coil pattern 61 that is arranged between first core portion 46 and second core portion 47 is spread over the entire first internal coil pattern 61. This heat is transferred to second coil pattern 55 through thermal via 111. Because of first heat transfer members 73, 74, this heat is spread to the entire second coil pattern 55 and first heat transfer members 73, 74 with low thermal resistance. Therefore, this heat is dissipated from the surfaces of first heat transfer members 73, 74 and the surface of second coil pattern 55 to the surrounding atmosphere.

In circuit device 30d of the present embodiment, heat generated in the portion of first internal coil pattern 61 that is arranged between first core portion 46 and second core portion 47 is dissipated to the surrounding atmosphere through a plurality of heat dissipation paths. In circuit device 30d according to the present embodiment, temperature increase of the portion of first internal coil pattern 61 that is arranged between first core portion 46 and second core portion 47 can be suppressed.

Figure 50:
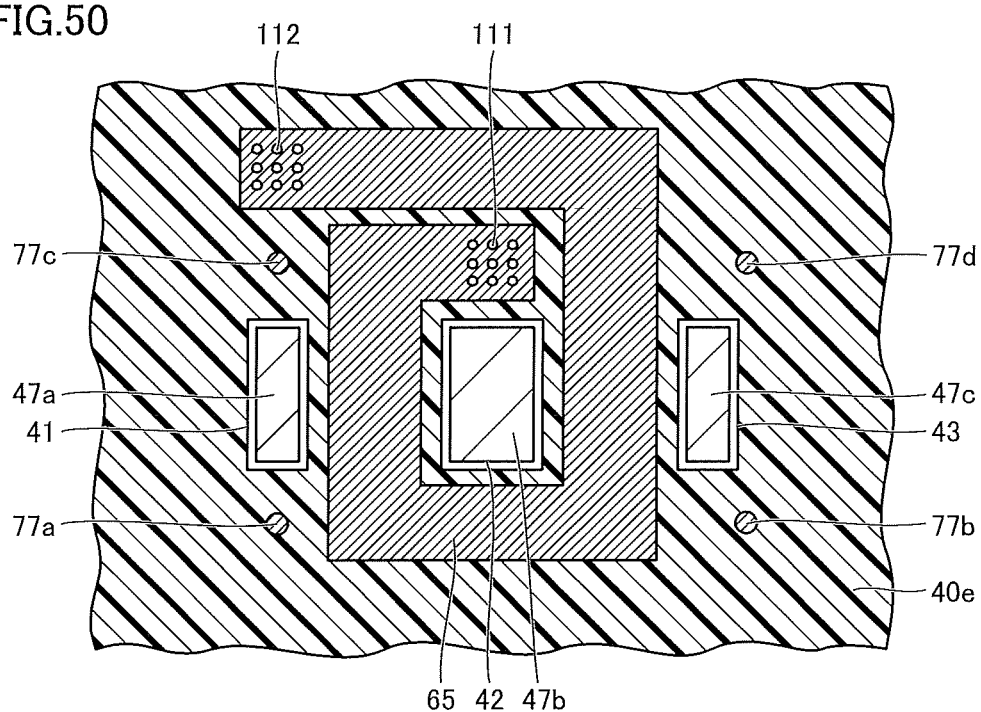
FIG. 50 is a schematic cross-sectional view taken along line L-L shown in FIG. 46 of the circuit device according to the fifth embodiment of the present invention.
Figure 51:
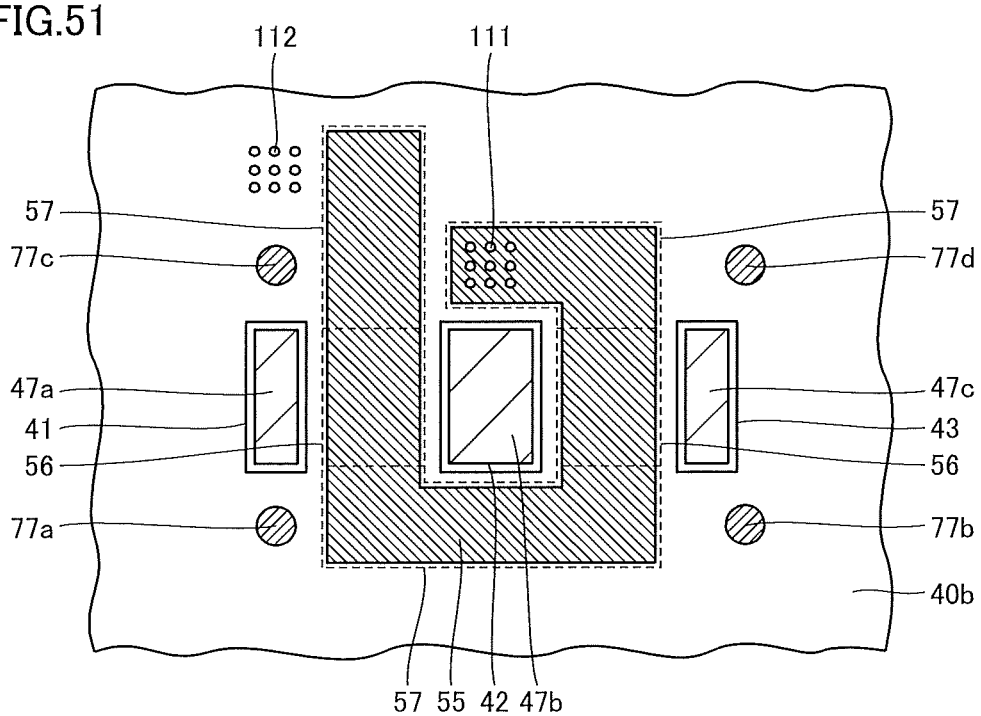
FIG. 51 is a schematic cross-sectional view taken along line LI-LI shown in FIG. 46 of the circuit device according to the fifth embodiment of the present invention.
Figure 52:
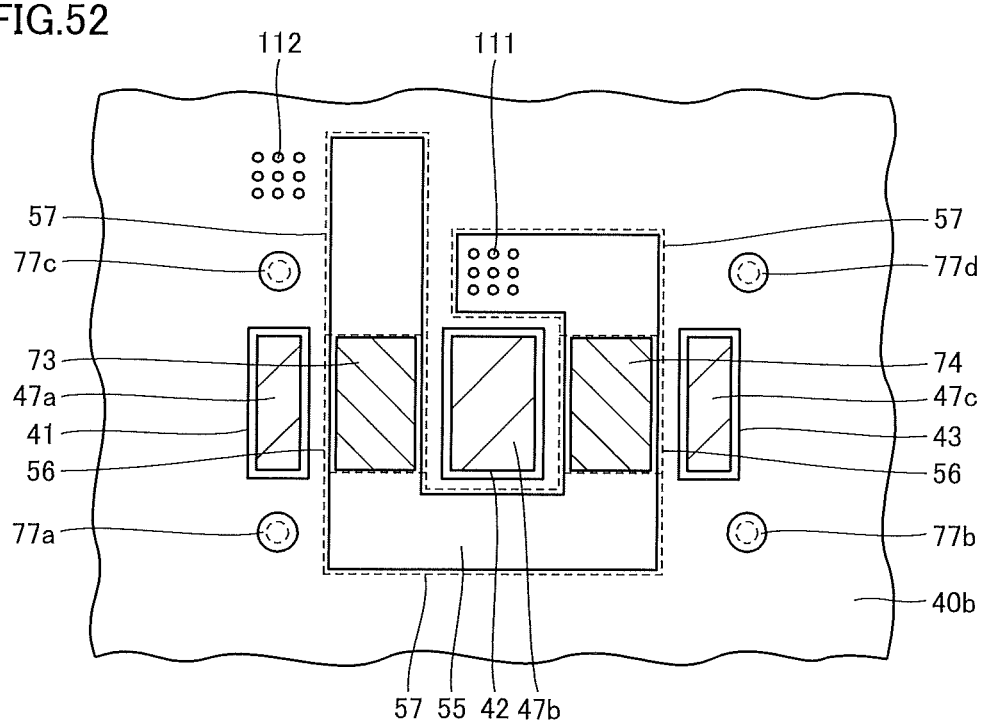
FIG. 52 is a schematic cross-sectional view taken along line LII-LII shown in FIG. 46 of the circuit device according to the fifth embodiment of the present invention.

Referring to FIG. 50, FIG. 53, and FIG. 54, the path for dissipating heat generated in the portion of second internal coil pattern 65 that is arranged between first core portion 46 and second core portion 47 to the surrounding atmosphere includes the following first to fourth heat dissipation paths.

The first heat dissipation path includes second internal coil pattern 65, thermal via 112, first coil pattern 50, second heat transfer members 80, 80a, and heat dissipator 6. Heat generated in the portion of second internal coil pattern 65 that is arranged between first core portion 46 and second core portion 47 is spread over the entire second internal coil pattern 65. This heat is transferred to first coil pattern 50 through thermal via 112. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The second heat dissipation path includes second internal coil pattern 65, thermal via 112, first coil pattern 50, and first heat transfer members 70, 71. Heat generated in the portion of second internal coil pattern 65 that is arranged between first core portion 46 and second core portion 47 is spread over the entire second internal coil pattern 65. This heat is transferred to first coil pattern 50 through thermal via 112. Because of first heat transfer members 70, 71, this heat is spread to the entire first coil pattern 50 and first heat transfer members 70, 71 with low thermal resistance. Therefore, this heat is dissipated from the surfaces of first heat transfer members 70, 71 and the surface of first coil pattern 50 to the surrounding atmosphere.

The third heat dissipation path includes second internal coil pattern 65, thermal via 111, first thermal pad 116, second heat transfer member 80a, and heat dissipator 6. Heat generated in the portion of second internal coil pattern 65 that is arranged between first core portion 46 and second core portion 47 is spread over the entire second internal coil pattern 65. This heat is transferred to first thermal pad 116 through thermal via 111. First thermal pad 116 is in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

The fourth heat dissipation path includes second internal coil pattern 65, at least one of thermal via 111 and printed circuit board 40, second coil pattern 55, and first heat transfer members 73, 74. Heat generated in the portion of second internal coil pattern 65 that is arranged between first core portion 46 and second core portion 47 is spread over the entire second internal coil pattern 65. This heat is transferred to second coil pattern 55 through at least one of thermal via 111 and printed circuit board 40. Because of first heat transfer members 73, 74, this heat is spread to the entire second coil pattern 55 and first heat transfer members 73, 74 with low thermal resistance. Therefore, this heat is dissipated from the surfaces of first heat transfer members 73, 74 and the surface of second coil pattern 55 to the surrounding atmosphere.

In circuit device 30d of the present embodiment, heat generated in the portion of second internal coil pattern 65 that is arranged between first core portion 46 and second core portion 47 is dissipated to the surrounding atmosphere through a plurality of heat dissipation paths. In circuit device 30d according to the present embodiment, temperature increase of the portion of second internal coil pattern 65 that is arranged between first core portion 46 and second core portion 47 can be suppressed.

Sixth Embodiment

Referring to FIG. 55 to FIG. 65, a circuit device 30e of a sixth embodiment will be described. Circuit device 30e of the present embodiment has a similar configuration to circuit device 30a of the second embodiment but differs mainly in the following points.

Figure 55:
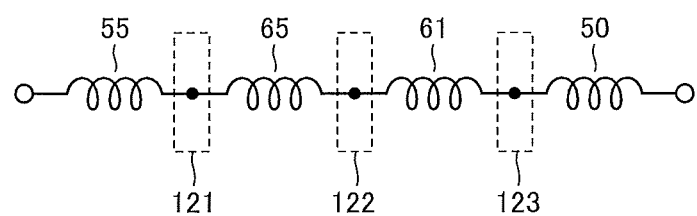
FIG. 55 is a coil connection diagram of a circuit device according to a sixth embodiment of the present invention.

Referring to FIG. 55, the coil pattern in circuit device 30e of the present embodiment has a circuit configuration of four-turn connection. Printed circuit board 40 of circuit device 30e of the present embodiment includes thermal vias 121, 122, 123. Each of thermal vias 121, 122, 123 has a similar configuration to thermal via 81 in the first embodiment. Each of thermal vias 121, 122, 123 has electrical conductivity. Second coil pattern 55 and second internal coil pattern 65 are electrically connected in series through thermal via 121. Second internal coil pattern 65 and first internal coil pattern 61 are electrically connected in series through thermal via 122. First internal coil pattern 61 and first coil pattern 50 are electrically connected in series through thermal via 123.

Referring to FIG. 58 to FIG. 65, each of thermal vias 121, 122, 123 passes from first main surface 40a to second main surface 40b of printed circuit board 40. Thermal via 121 is electrically and thermally connected to second coil pattern 55 and second internal coil pattern 65 but is not electrically and thermally connected to first coil pattern 50 or first internal coil pattern 61. Thermal via 122 is electrically and thermally connected to first internal coil pattern 61 and second internal coil pattern 65 but is not electrically and thermally connected to first coil pattern 50 or second coil pattern 55. Thermal via 123 is electrically and thermally connected to first coil pattern 50 and first internal coil pattern 61 but is not electrically and thermally connected to second coil pattern 55 or second internal coil pattern 65.

A plurality of coil patterns (first coil pattern 50, second coil pattern 55, third coil pattern 60) having substantially different pattern shapes are layered. Each of thermal vias 121, 122, 123 is electrically connected to two coil patterns adjacent to each other, of the coil patterns (first coil pattern 50, second coil pattern 55, third coil pattern 60), but is not electrically connected to the coil patterns, excluding these two coil patterns. A circuit configuration in which a plurality of coil patterns are electrically connected in series with each other is thus obtained.

Figure 58:
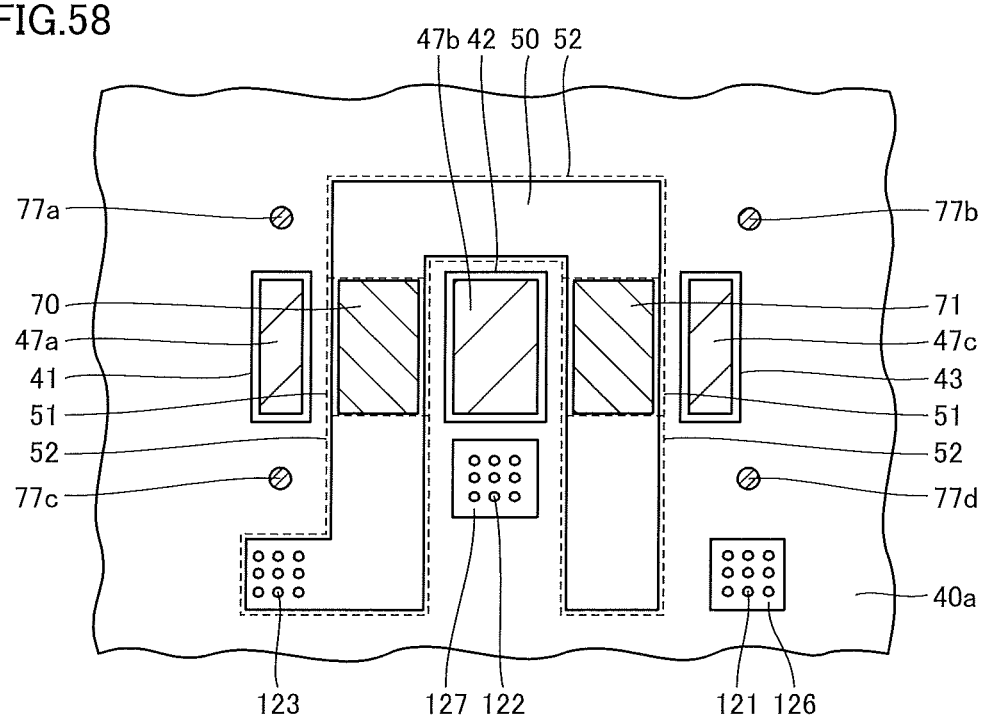
FIG. 58 is a schematic cross-sectional view taken along line LVIII-LVIII shown in FIG. 57 of the circuit device according to the sixth embodiment of the present invention.
Figure 59:
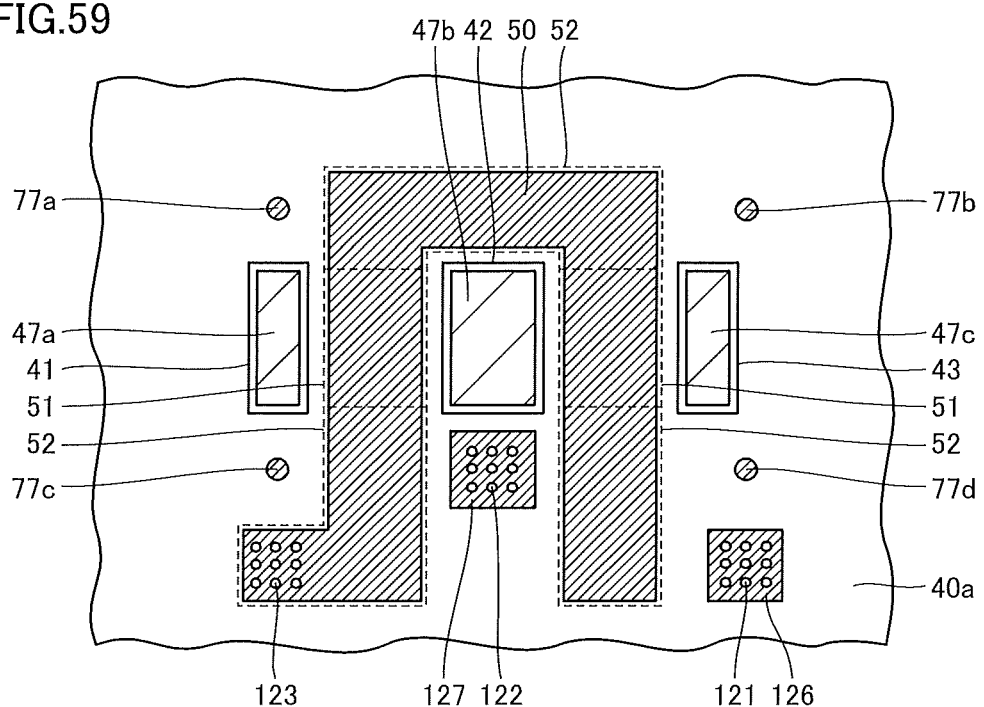
FIG. 59 is a schematic cross-sectional view taken along line LIX-LIX shown in FIG. 57 of the circuit device according to the sixth embodiment of the present invention.
Figure 65:
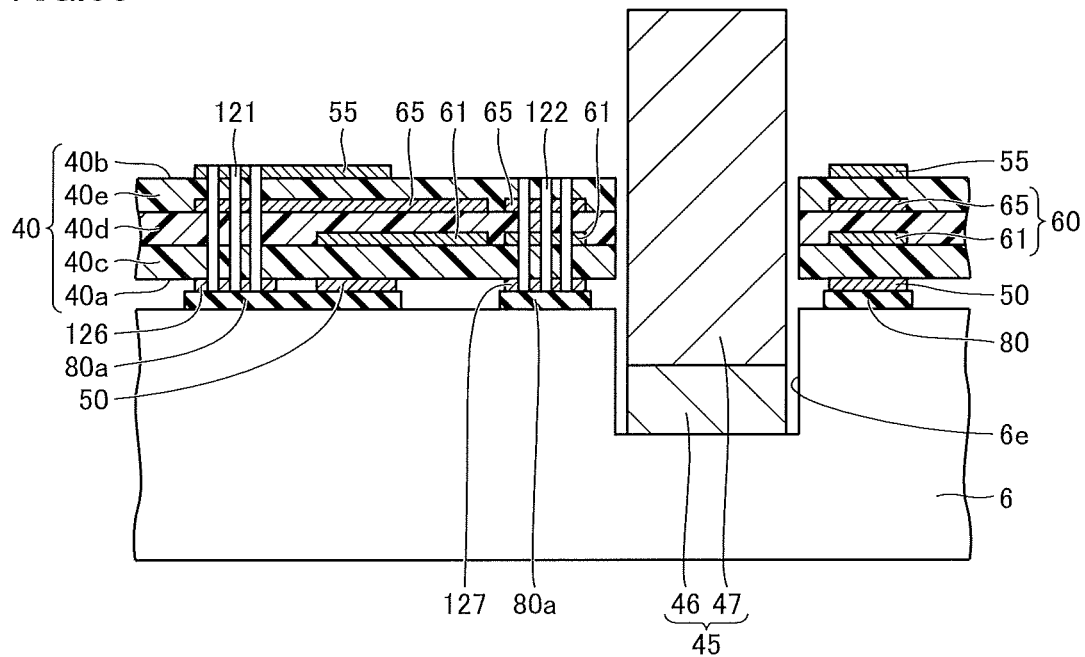
FIG. 65 is a schematic cross-sectional view taken along line LXV-LXV shown in FIG. 56 of the circuit device according to the sixth embodiment of the present invention.

Referring to FIG. 58, FIG. 59, and FIG. 65, printed circuit board 40 includes first thermal pads 126, 127 disposed on first main surface 40a and spaced away from first coil pattern 50. First thermal pad 126 may be disposed adjacent to an end portion of first coil pattern 50. First thermal pad 127 may be disposed in a region adjacent to the second leg of second core portion 47 and where first coil pattern 50 is not present. Thermal via 121 may thermally connect at least one of second coil pattern 55 and third coil pattern 60 to first thermal pad 126. In the present embodiment, thermal via 121 thermally connects second coil pattern 55 and second internal coil pattern 65 to first thermal pad 126. Thermal via 122 may thermally connect at least one of second coil pattern 55 and third coil pattern 60 to first thermal pad 127. In the present embodiment, thermal via 122 thermally connects first internal coil pattern 61 and second internal coil pattern 65 to first thermal pad 127.

Figure 56:
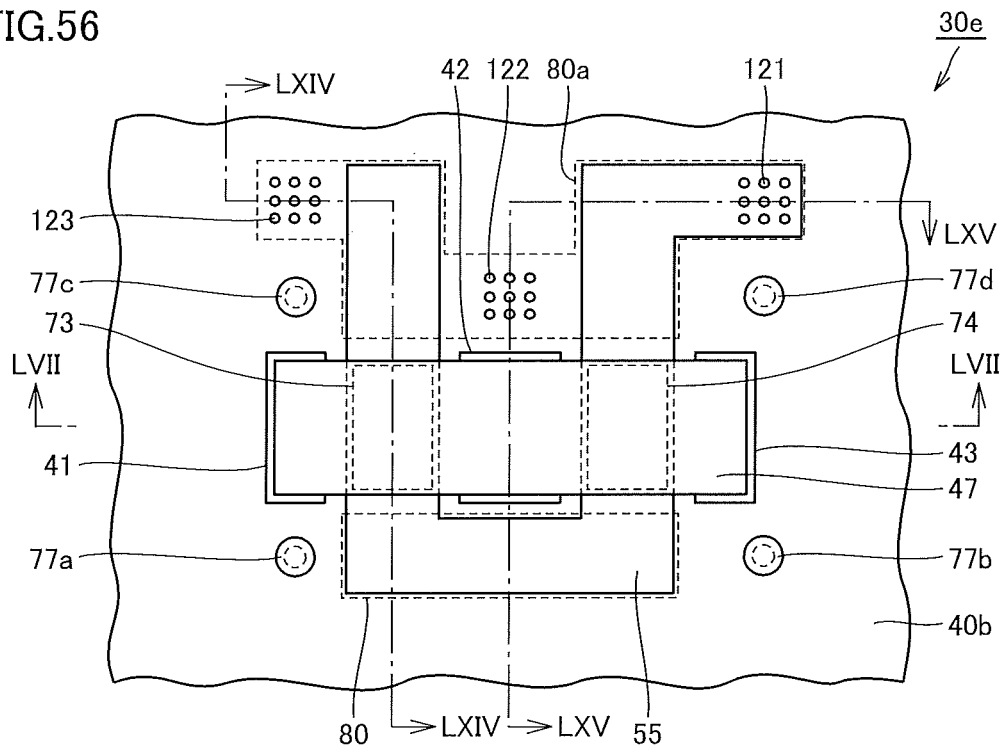
FIG. 56 is a schematic plan view of the circuit device according to the sixth embodiment of the present invention.
Figure 57:
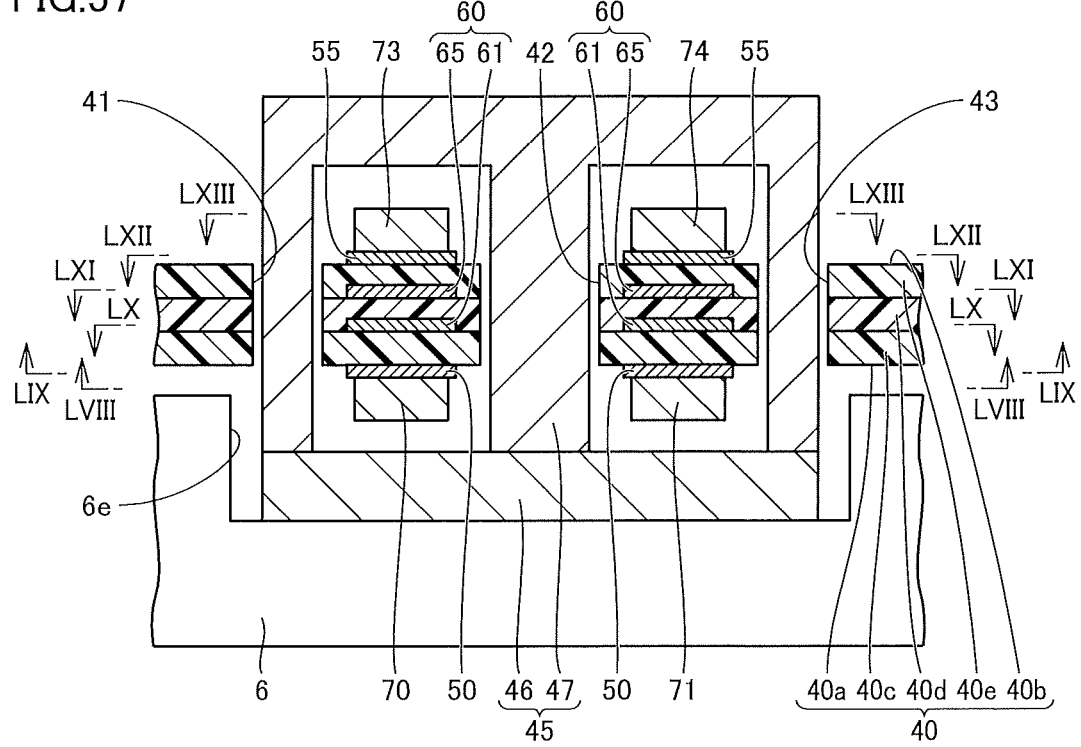
FIG. 57 is a schematic cross-sectional view taken along line LVII-LVII shown in FIG. 56 of the circuit device according to the sixth embodiment of the present invention.

Referring to FIG. 56, second heat transfer member 80a may extend so as to connect thermal vias 121, 122, 123. Second heat transfer member 80a may extend so as to connect both ends of first coil pattern 50. Second heat transfer member 80a may be in surface contact with first coil pattern 50. First thermal pads 126, 127 are in surface contact with second heat transfer member 80a and thermally connected to second heat transfer member 80a.

Referring to FIG. 58, FIG. 59, FIG. 64, and FIG. 65, the path for dissipating heat generated in first portion 51 of first coil pattern 50 to the surrounding atmosphere includes the following first to third heat dissipation paths.

The first heat dissipation path includes first heat transfer members 70, 71 and second portion 52 of first coil pattern 50. Because of first heat transfer members 70, 71, heat generated in first portion 51 of first coil pattern 50 is spread to first heat transfer members 70, 71 and second portion 52 of first coil pattern 50 with low thermal resistance. This heat is dissipated from the surfaces of first heat transfer members 70, 71 and the surface of second portion 52 of first coil pattern 50 to the surrounding atmosphere.

The second heat dissipation path includes first coil pattern 50, second heat transfer members 80, 80a, and heat dissipator 6. Because of first heat transfer members 70, 71, heat generated in first portion 51 of first coil pattern 50 is spread to second portion 52 of first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The third heat dissipation path includes printed circuit board 40, first thermal pads 126, 127, second heat transfer member 80a, and heat dissipator 6. Part of heat generated in first portion 51 of first coil pattern 50 is transferred in the inside of printed circuit board 40 and further transferred to first thermal pads 126, 127. First thermal pads 126, 127 are in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

In circuit device 30e of the present embodiment, heat generated in first portion 51 of first coil pattern 50 is dissipated to the surrounding atmosphere through a plurality of heat dissipation paths. In circuit device 30e according to the present embodiment, temperature increase of first portion 51 of first coil pattern 50 arranged between first core portion 46 and second core portion 47 can be suppressed.

Referring to FIG. 62 to FIG. 65, the path for dissipating heat generated in third portion 56 of second coil pattern 55 to the surrounding atmosphere includes the following first and second heat dissipation paths.

The first heat dissipation path includes first heat transfer members 73, 74 and fourth portion 57 of second coil pattern 55. Because of first heat transfer members 73, 74, heat generated in third portion 56 of second coil pattern 55 is spread to first heat transfer members 73, 74 and fourth portion 57 of second coil pattern 55 with low thermal resistance. This heat is dissipated from the surfaces of first heat transfer members 73, 74 and the surface of fourth portion 57 of second coil pattern 55 to the surrounding atmosphere.

The second heat dissipation path includes second coil pattern 55, thermal via 121, first thermal pad 126, second heat transfer member 80a, and heat dissipator 6. Because of first heat transfer members 73, 74, heat generated in third portion 56 of second coil pattern 55 is spread to fourth portion 57 of second coil pattern 55 with low thermal resistance. This heat is transferred to first thermal pad 126 through thermal via 121. First thermal pad 126 is in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

In circuit device 30e of the present embodiment, heat generated in third portion 56 of second coil pattern 55 is dissipated to the surrounding atmosphere through a plurality of heat dissipation paths. In circuit device 30e according to the present embodiment, temperature increase of third portion 56 of second coil pattern 55 arranged between first core portion 46 and second core portion 47 can be suppressed.

Figure 60:
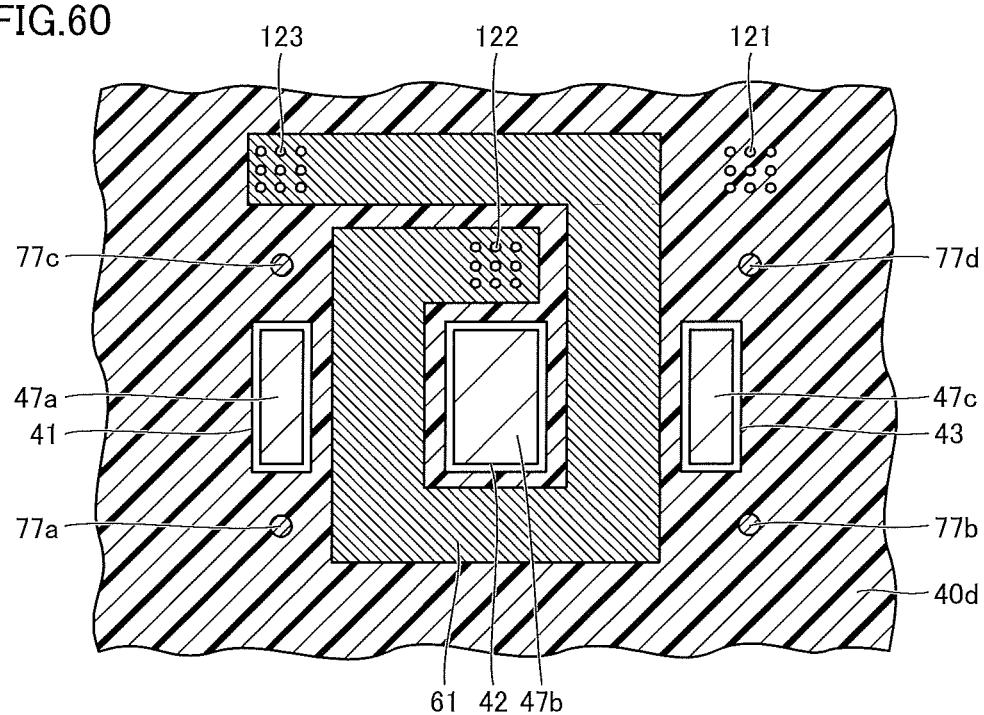
FIG. 60 is a schematic cross-sectional view taken along line LX-LX shown in FIG. 57 of the circuit device according to the sixth embodiment of the present invention.
Figure 64:
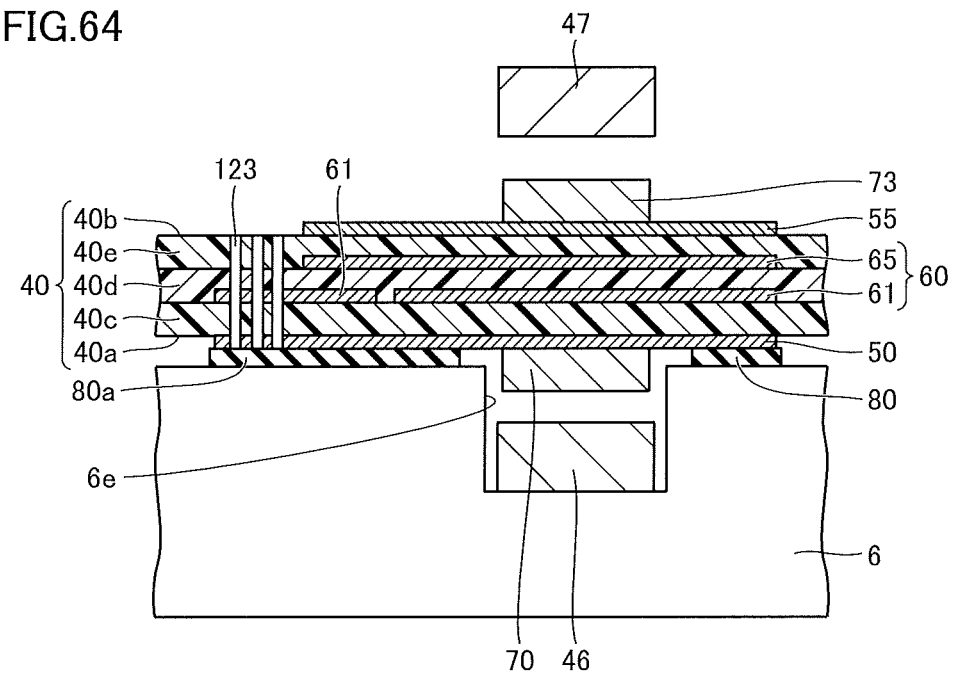
FIG. 64 is a schematic cross-sectional view taken along line LXIV-LXIV shown in FIG. 56 of the circuit device according to the sixth embodiment of the present invention.

Referring to FIG. 60, FIG. 64, and FIG. 65, the path for dissipating heat generated in the portion of first internal coil pattern 61 that is arranged between first core portion 46 and second core portion 47 to the surrounding atmosphere includes the following first to third heat dissipation paths.

The first heat dissipation path includes first internal coil pattern 61, at least one of thermal via 123 and printed circuit board 40, first coil pattern 50, second heat transfer members 80, 80a, and heat dissipator 6. Heat generated in the portion of first internal coil pattern 61 that is arranged between first core portion 46 and second core portion 47 is spread over the entire first internal coil pattern 61. This heat is transferred to first coil pattern 50 through at least one of thermal via 123 and printed circuit board 40. Because of first heat transfer members 70, 71, this heat is spread to the entire first coil pattern 50 with low thermal resistance. First coil pattern 50 is in surface contact with second heat transfer members 80, 80a. Second heat transfer members 80, 80a are in surface contact with heat dissipator 6. Therefore, this heat is transferred with low thermal resistance to heat dissipator 6 and dissipated from heat dissipator 6 to the surrounding atmosphere.

The second heat dissipation path includes first internal coil pattern 61, at least one of thermal via 123 and printed circuit board 40, first coil pattern 50, and first heat transfer members 70, 71. Heat generated in the portion of first internal coil pattern 61 that is arranged between first core portion 46 and second core portion 47 is spread over the entire first internal coil pattern 61. This heat is transferred to first coil pattern 50 through at least one of thermal via 123 and printed circuit board 40. Because of first heat transfer members 70, 71, this heat is spread to the entire first coil pattern 50 and first heat transfer members 70, 71 with low thermal resistance. Therefore, this heat is dissipated from the surfaces of first heat transfer members 70, 71 and the surface of first coil pattern 50 to the surrounding atmosphere.

The third heat dissipation path includes first internal coil pattern 61, at least one of thermal via 122 and printed circuit board 40, first thermal pad 127, second heat transfer member 80a, and heat dissipator 6. Heat generated in the portion of first internal coil pattern 61 that is arranged between first core portion 46 and second core portion 47 is spread over the entire first internal coil pattern 61. This heat is transferred to first thermal pad 127 through at least one of thermal via 122 and printed circuit board 40. First thermal pad 127 is in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

In circuit device 30e of the present embodiment, heat generated in the portion of first internal coil pattern 61 that is arranged between first core portion 46 and second core portion 47 is dissipated to the surrounding atmosphere through a plurality of heat dissipation paths. In circuit device 30e according to the present embodiment, temperature increase of the portion of first internal coil pattern 61 that is arranged between first core portion 46 and second core portion 47 can be suppressed.

Figure 61:
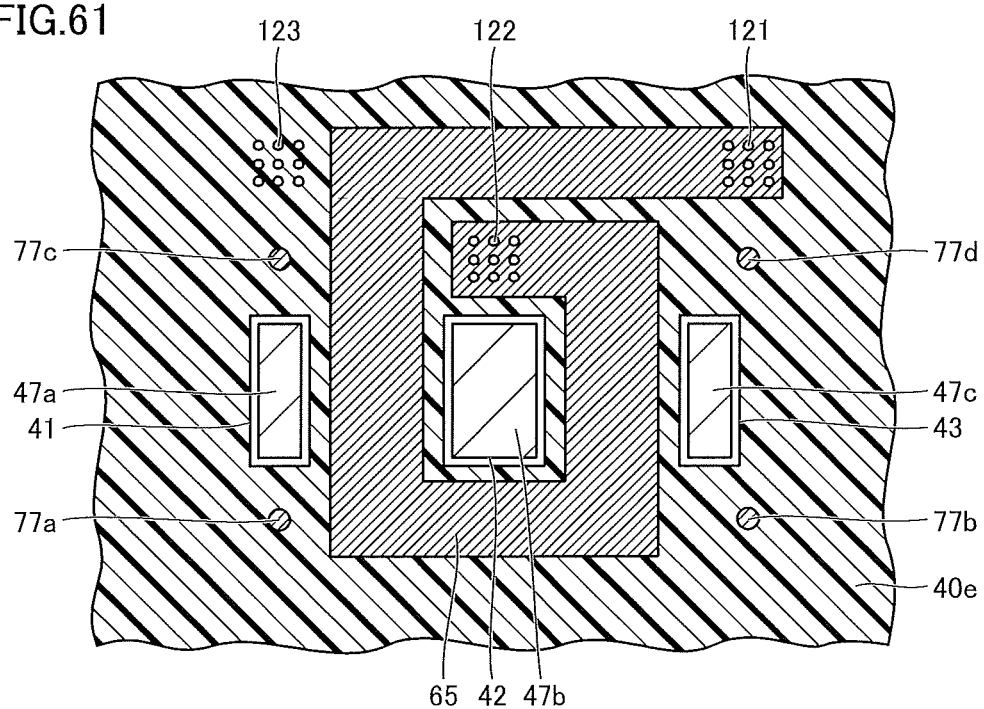
FIG. 61 is a schematic cross-sectional view taken along line LXI-LXI shown in FIG. 57 of the circuit device according to the sixth embodiment of the present invention.
Figure 62:
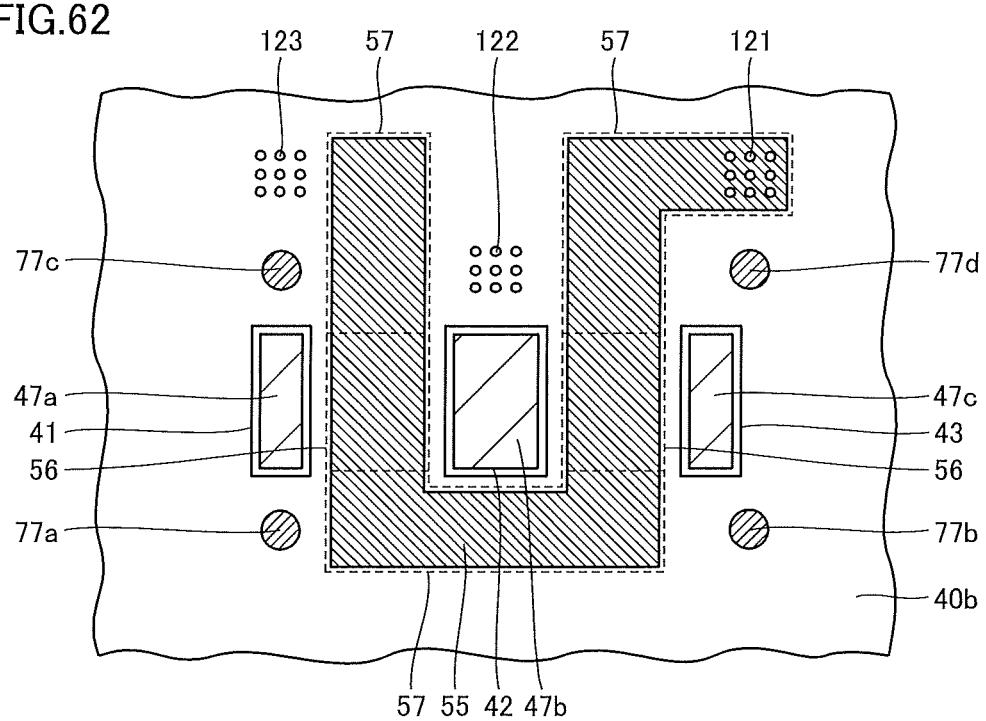
FIG. 62 is a schematic cross-sectional view taken along line LXII-LXII shown in FIG. 57 of the circuit device according to the sixth embodiment of the present invention.
Figure 63:
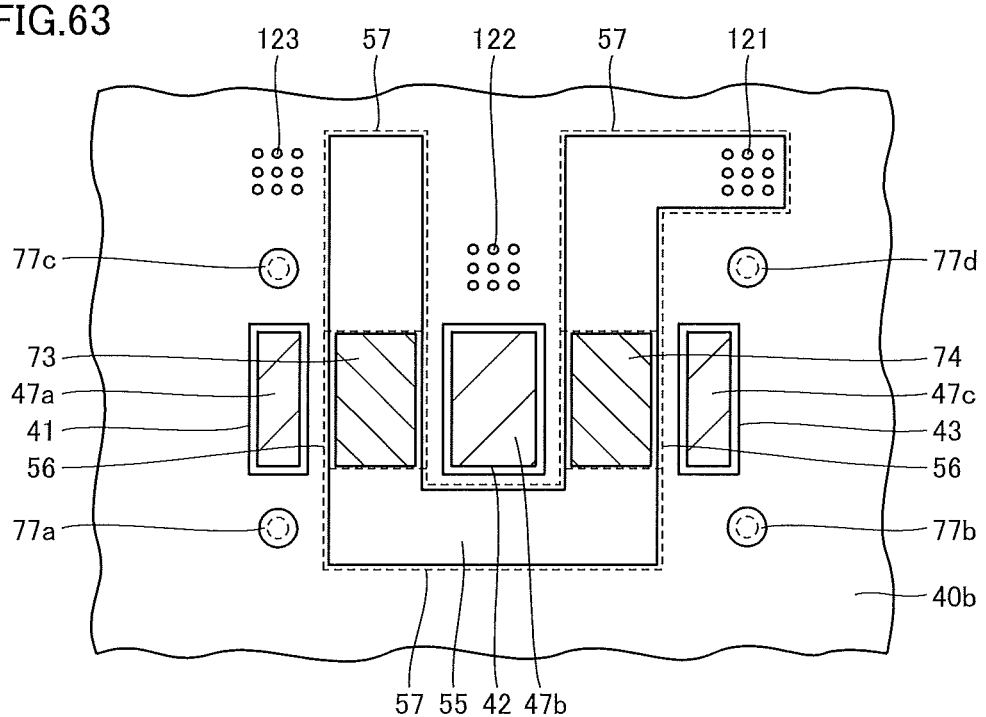
FIG. 63 is a schematic cross-sectional view taken along line LXIII-LXIII shown in FIG. 57 of the circuit device according to the sixth embodiment of the present invention.

Referring to FIG. 61, FIG. 64, and FIG. 65, the path for dissipating heat generated in the portion of second internal coil pattern 65 that is arranged between first core portion 46 and second core portion 47 to the surrounding atmosphere includes the following first to third heat dissipation paths.

The first heat dissipation path includes second internal coil pattern 65, thermal via 121, first thermal pad 126, second heat transfer member 80a, and heat dissipator 6. Heat generated in the portion of second internal coil pattern 65 that is arranged between first core portion 46 and second core portion 47 is spread over the entire second internal coil pattern 65. This heat is transferred to first thermal pad 126 through thermal via 121. First thermal pad 126 is in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

The second heat dissipation path includes second internal coil pattern 65, thermal via 122, first thermal pad 127, second heat transfer member 80a, and heat dissipator 6. Heat generated in the portion of second internal coil pattern 65 that is arranged between first core portion 46 and second core portion 47 is spread over the entire second internal coil pattern 65. This heat is transferred to first thermal pad 127 through thermal via 122. First thermal pad 127 is in surface contact with second heat transfer member 80a. Second heat transfer member 80a is in surface contact with heat dissipator 6. Therefore, this heat is transferred with low thermal resistance to heat dissipator 6 and dissipated from heat dissipator 6 to the surrounding atmosphere.

The third heat dissipation path includes second internal coil pattern 65, at least one of thermal via 121 and printed circuit board 40, second coil pattern 55, and first heat transfer members 73, 74. Heat generated in the portion of second internal coil pattern 65 that is arranged between first core portion 46 and second core portion 47 is spread over the entire second internal coil pattern 65. This heat is transferred to second coil pattern 55 through at least one of thermal via 121 and printed circuit board 40. Because of first heat transfer members 73, 74, this heat is spread to the entire second coil pattern 55 and first heat transfer members 73, 74 with low thermal resistance. Therefore, this heat is dissipated from the surfaces of first heat transfer members 73, 74 and the surface of second coil pattern 55 to the surrounding atmosphere.

In circuit device 30e of the present embodiment, heat generated in the portion of second internal coil pattern 65 that is arranged between first core portion 46 and second core portion 47 is dissipated to the surrounding atmosphere through a plurality of heat dissipation paths. In circuit device 30e according to the present embodiment, temperature increase of the portion of second internal coil pattern 65 that is arranged between first core portion 46 and second core portion 47 can be suppressed.

Circuit device 30e of the present embodiment achieves similar effects as in circuit device 30a of the second embodiment and circuit device 30d of the fifth embodiment.

Seventh Embodiment

Referring to FIG. 7, FIG. 8, FIG. 11, FIG. 12, and FIG. 66 to FIG. 69, a circuit device 30f of a seventh embodiment will be described. Circuit device 30f of the present embodiment has a similar configuration to circuit device 30 of the first embodiment but differs mainly in the following points.

Figure 66:
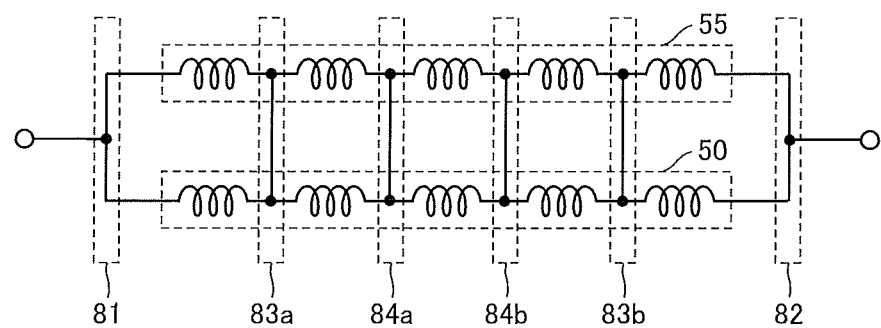
FIG. 66 is a coil connection diagram of a circuit device according to a seventh embodiment of the present invention.
Figure 67:
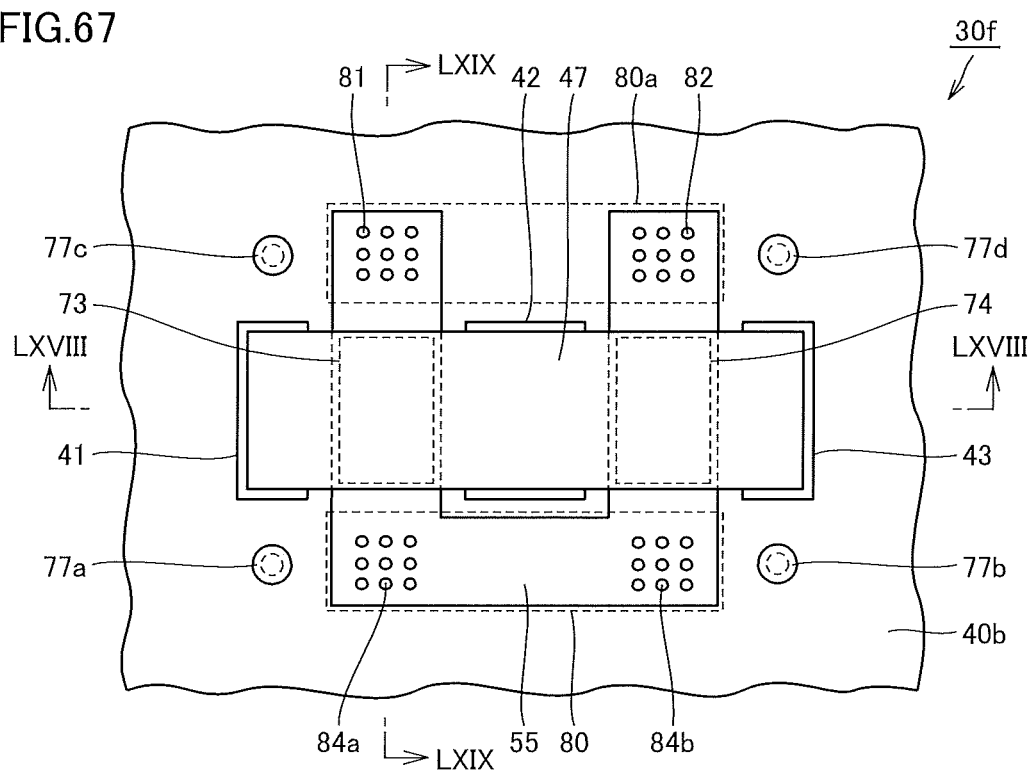
FIG. 67 is a schematic plan view of the circuit device according to the seventh embodiment of the present invention.
Figure 68:
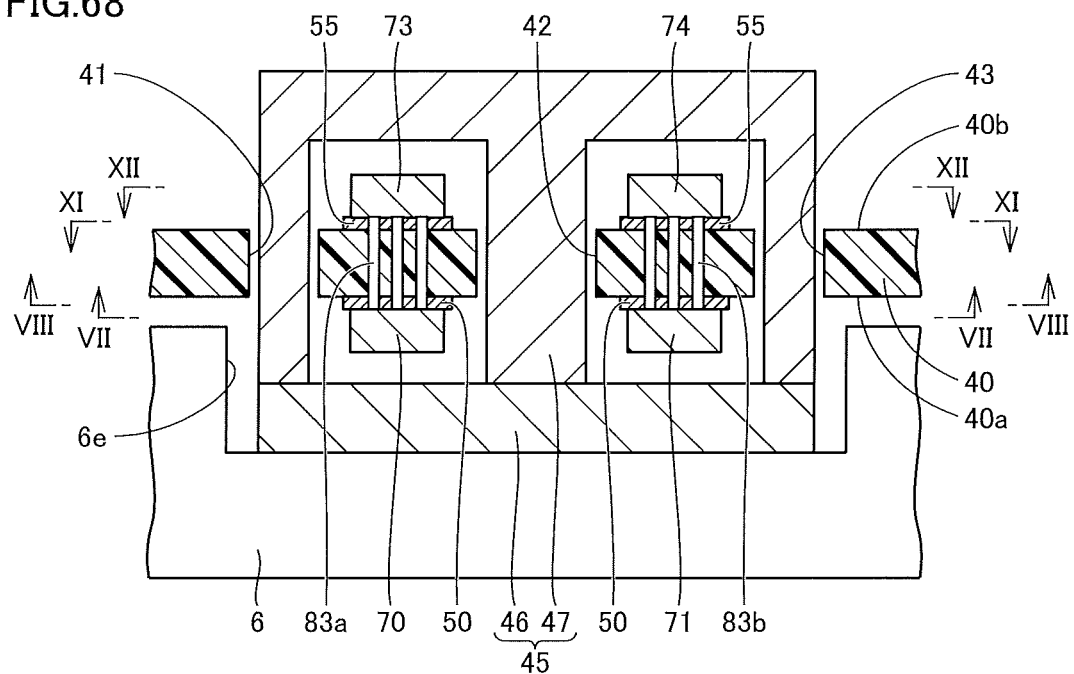
FIG. 68 is a schematic cross-sectional view taken along line LXVIII-LXVIII shown in FIG. 67 of the circuit device according to the seventh embodiment of the present invention.
Figure 69:
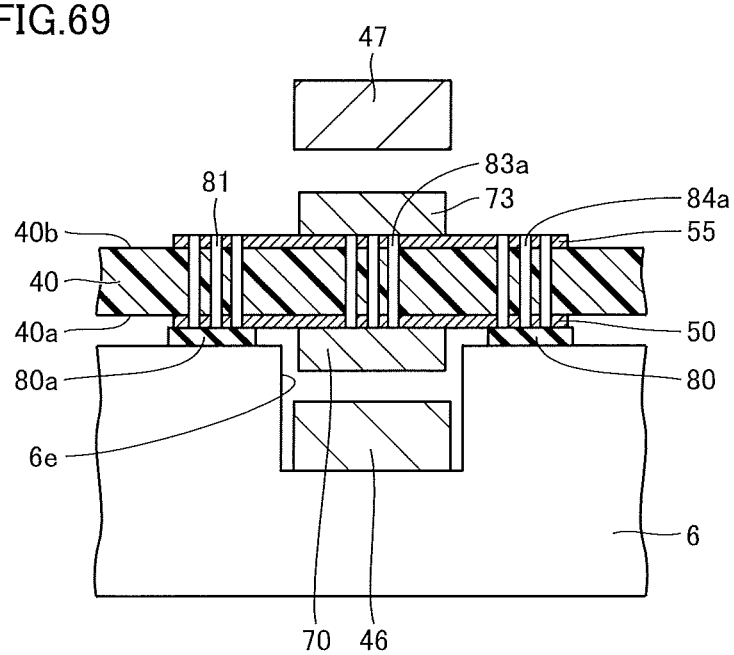
FIG. 69 is a schematic cross-sectional view taken along line LXIX-LXIX shown in FIG. 67 of the circuit device according to the seventh embodiment of the present invention.

Referring to FIG. 66, the coil pattern in circuit device 30f of the present embodiment has a circuit configuration of one-turn two-parallel connection. Circuit device 30f of the present embodiment is configured such that third coil pattern 60 is eliminated from circuit device 30 of the first embodiment. In circuit device 30f of the present embodiment, printed circuit board 40 is formed of a single base layer. In the present embodiment, printed circuit board 40 is a double-sided board in which first coil pattern 50 is disposed on first main surface 40a and second coil pattern 55 is disposed on second main surface 40b.

Circuit device 30f of the present embodiment achieves similar effects as in circuit device 30 of the first embodiment, except the effects achieved by third coil pattern 60.

Eighth Embodiment

Referring to FIG. 70 to FIG. 77, a circuit device 30g of an eighth embodiment will be described. Circuit device 30g of the present embodiment has a similar configuration to circuit device 30f of the seventh embodiment but differs mainly in the following points.

Figure 70:
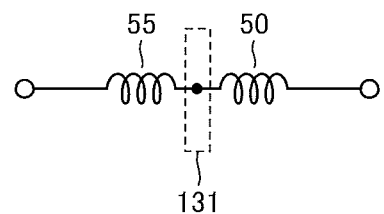
FIG. 70 is a coil connection diagram of a circuit device according to an eighth embodiment of the present invention.
Figure 71:
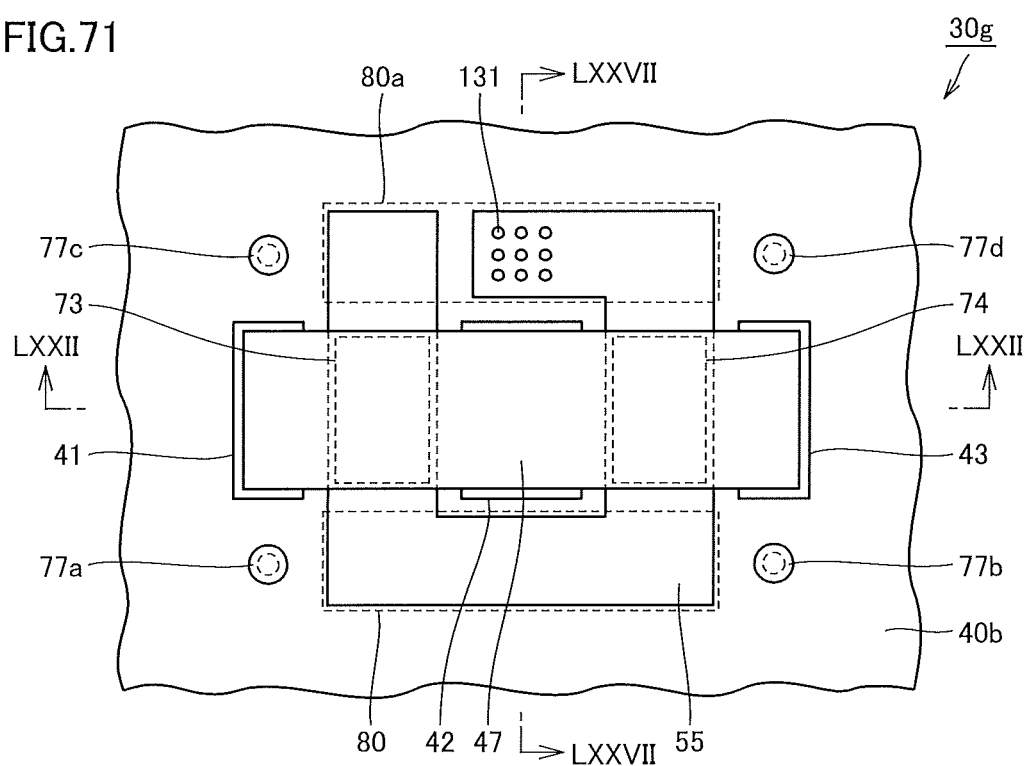
FIG. 71 is a schematic plan view of the circuit device according to the eighth embodiment of the present invention.
Figure 72:
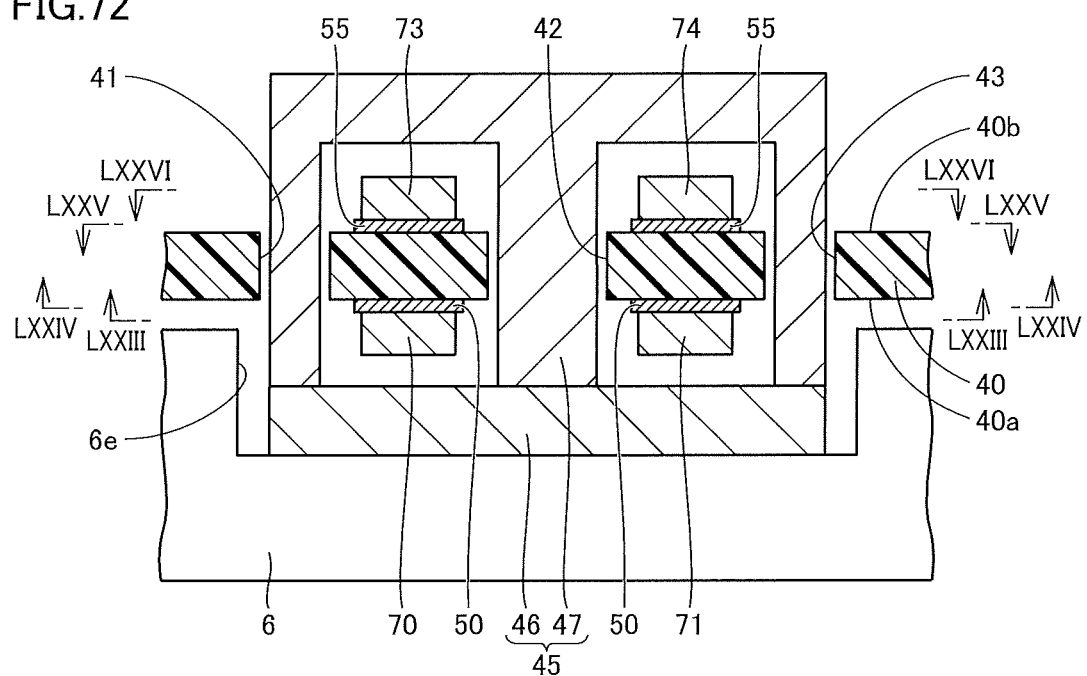
FIG. 72 is a schematic cross-sectional view taken along line LXXII-LXXII shown in FIG. 71 of the circuit device according to the eighth embodiment of the present invention.
Figure 73:
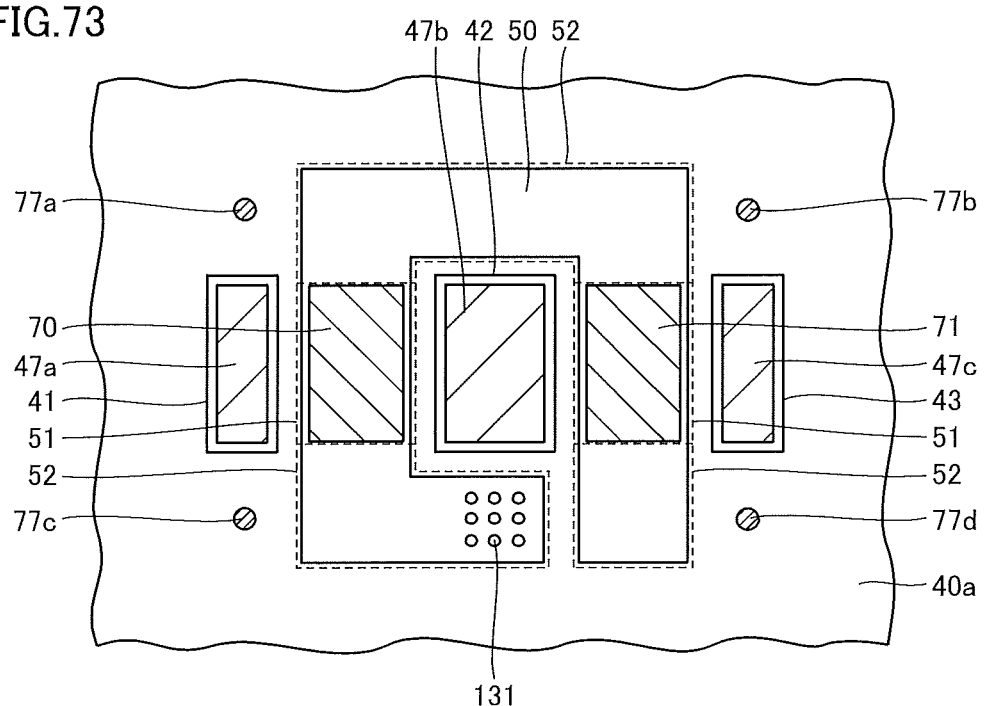
FIG. 73 is a schematic cross-sectional view taken along line LXXIII-LXXIII shown in FIG. 72 of the circuit device according to the eighth embodiment of the present invention.
Figure 74:
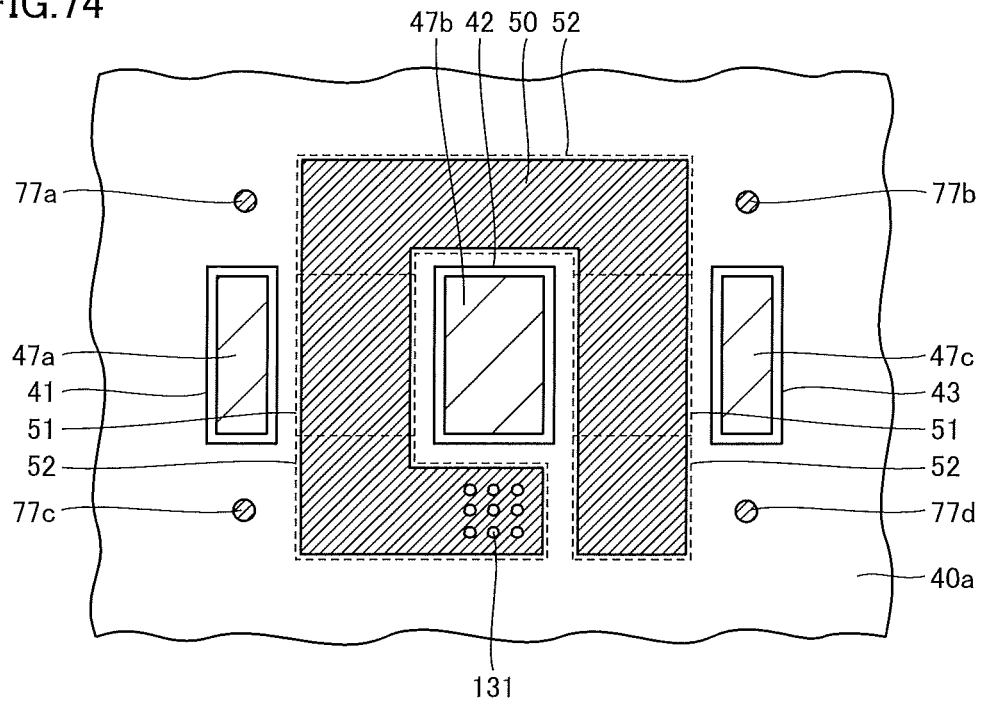
FIG. 74 is a schematic cross-sectional view taken along line LXXIV-LXXIV shown in FIG. 72 of the circuit device according to the eighth embodiment of the present invention.
Figure 75:
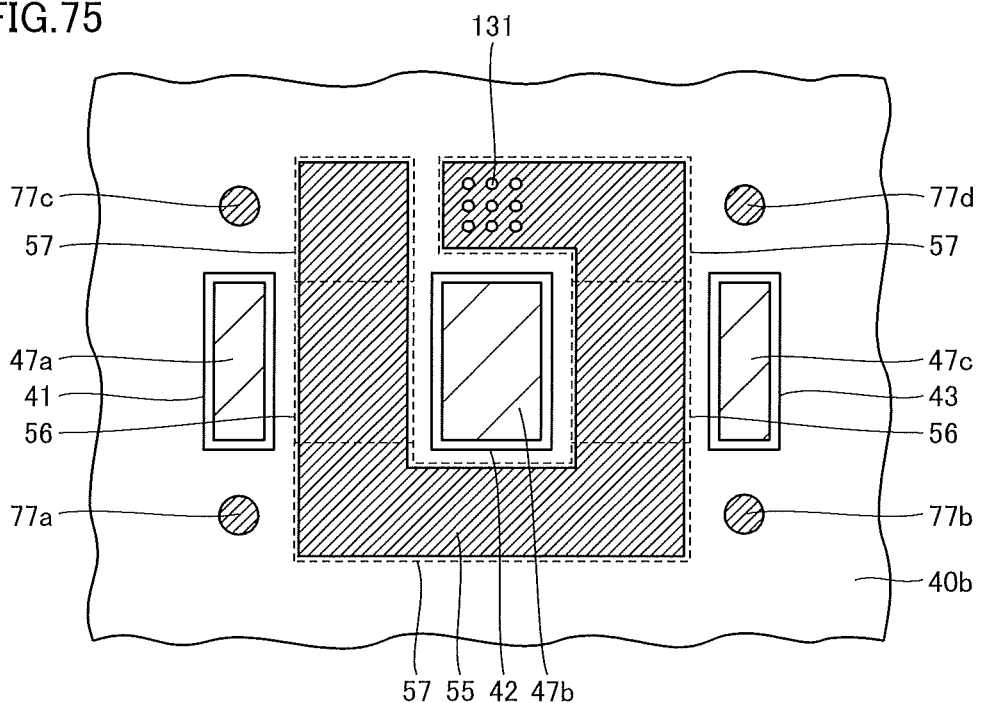
FIG. 75 is a schematic cross-sectional view taken along line LXXV-LXXV shown in FIG. 72 of the circuit device according to the eighth embodiment of the present invention.
Figure 76:
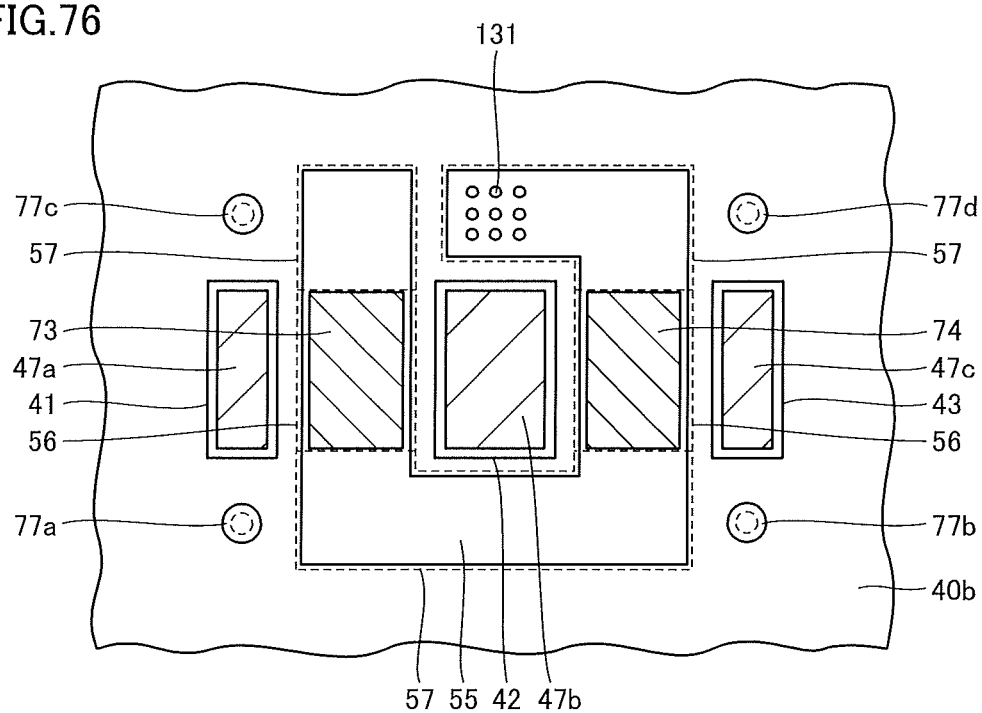
FIG. 76 is a schematic cross-sectional view taken along line LXXVI-LXXVI shown in FIG. 72 of the circuit device according to the eighth embodiment of the present invention.
Figure 77:
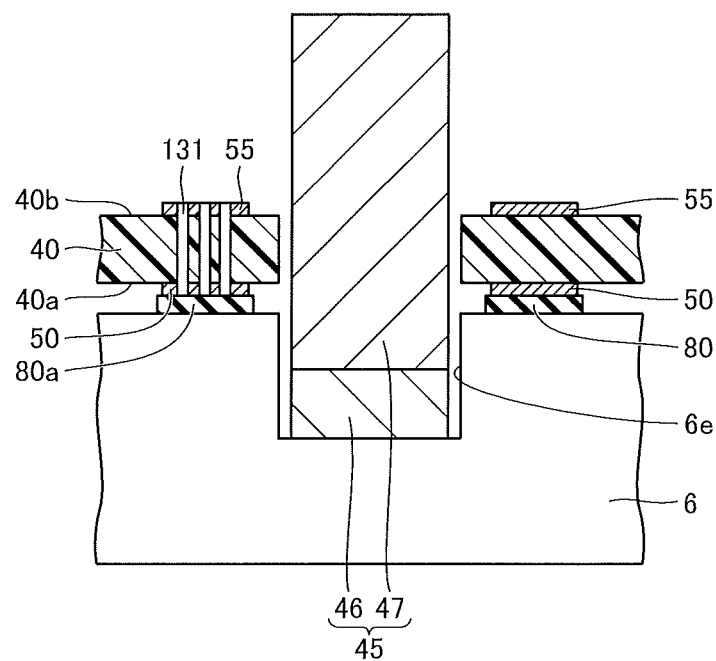
FIG. 77 is a schematic cross-sectional view taken along line LXXVII-LXXVII shown in FIG. 71 of the circuit device according to the eighth embodiment of the present invention.

Referring to FIG. 70, the coil pattern in circuit device 30g of the present embodiment has a circuit configuration of two-turn connection. Printed circuit board 40 of circuit device 30g of the present embodiment includes a thermal via 131. Thermal via 131 has a similar configuration to thermal via 81 in the first embodiment. Thermal via 131 has electrical conductivity. First coil pattern 50 and second coil pattern 55 are electrically connected in series through thermal via 131. Referring to FIG. 71 to FIG. 77, thermal via 131 passes from first main surface 40a to second main surface 40b of printed circuit board 40. Thermal via 131 is electrically and thermally connected to first coil pattern 50 and second coil pattern 55.

The heat dissipation path in circuit device 30g of the present embodiment is similar to the heat dissipation path in circuit device 30f of the seventh embodiment, except that thermal vias 81, 82, 83a, 83b, 84a, 84b in the seventh embodiment are replaced by thermal via 131 in the present embodiment. Circuit device 30g of the present embodiment achieves similar effects as in circuit device 30f of the seventh embodiment.

Ninth Embodiment

Referring to FIG. 78 to FIG. 83, a circuit device 30h of a ninth embodiment will be described. Circuit device 30h of the present embodiment has a similar configuration to circuit device 30g of the eighth embodiment but differs mainly in the following points.

Figure 78:
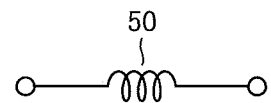
FIG. 78 is a coil connection diagram of a circuit device according to a ninth embodiment of the present invention.
Figure 79:
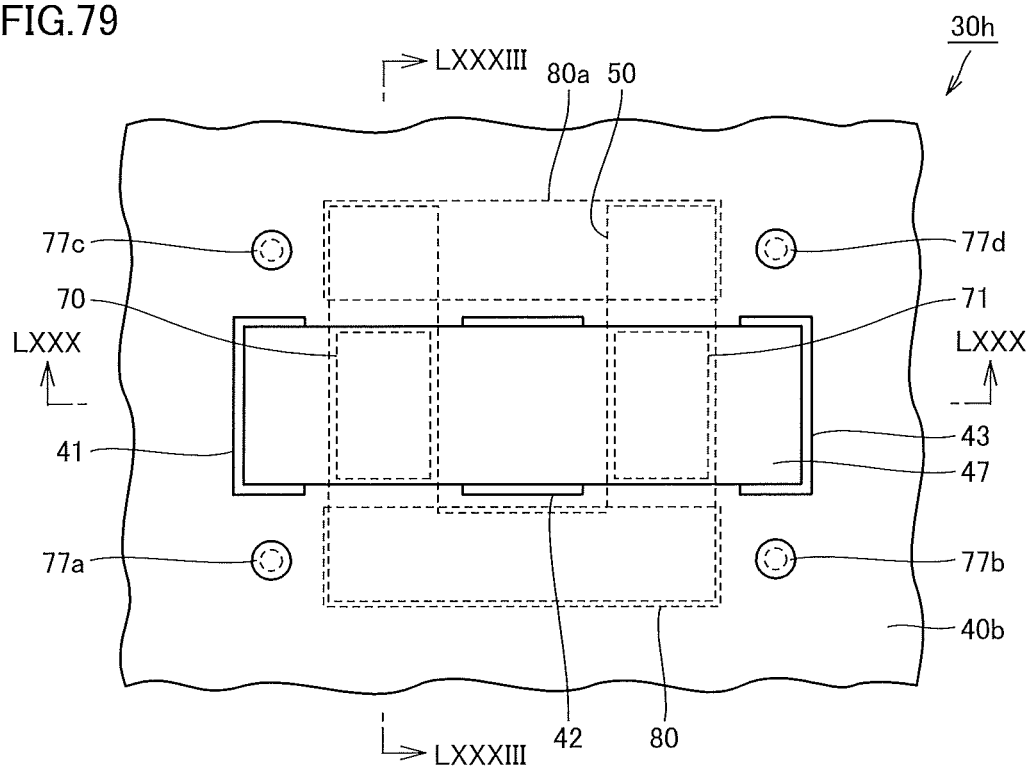
FIG. 79 is a schematic plan view of the circuit device according to the ninth embodiment of the present invention.
Figure 80:
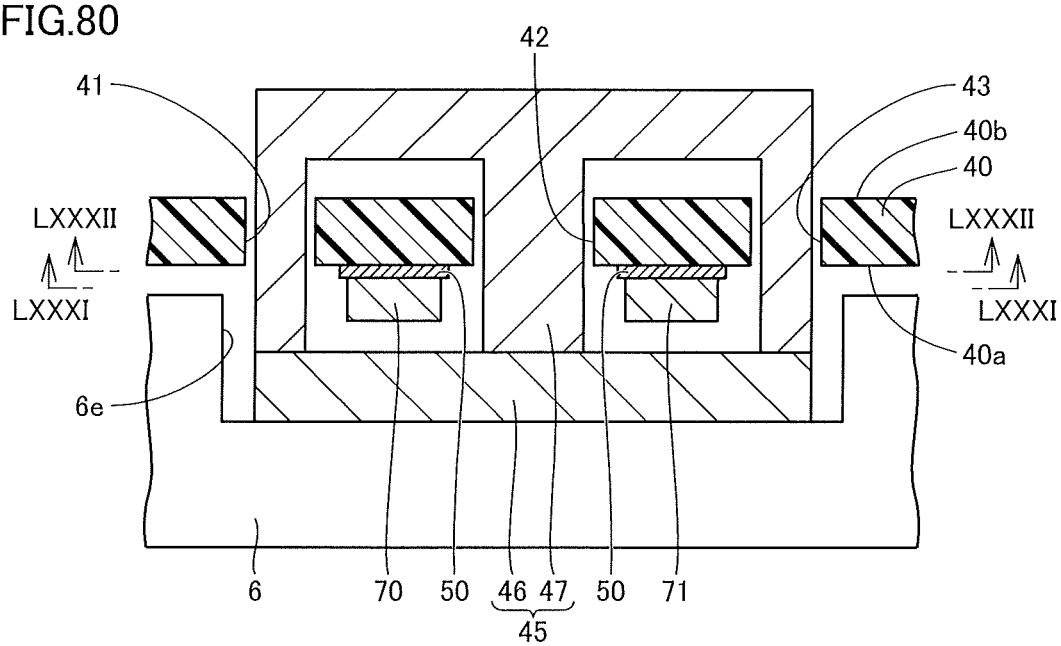
FIG. 80 is a schematic cross-sectional view taken along line LXXX-LXXX shown in FIG. 79 of the circuit device according to the ninth embodiment of the present invention.
Figure 81:
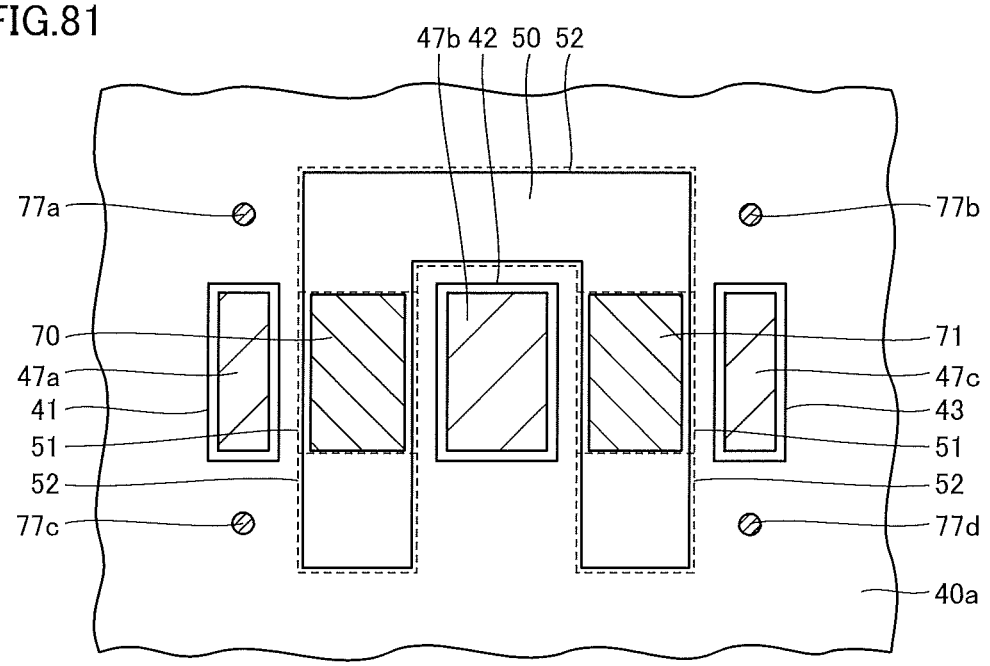
FIG. 81 is a schematic cross-sectional view taken along line LXXXI-LXXXI shown in FIG. 80 of the circuit device according to the ninth embodiment of the present invention.
Figure 82:
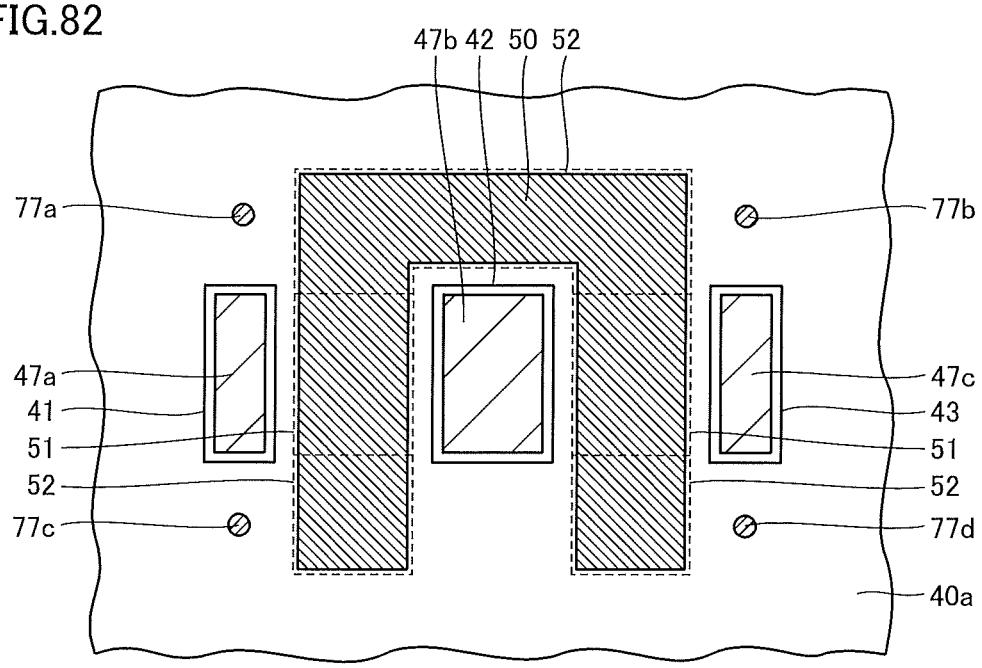
FIG. 82 is a schematic cross-sectional view taken along line LXXXII-LXXXII shown in FIG. 80 of the circuit device according to the ninth embodiment of the present invention.
Figure 83:
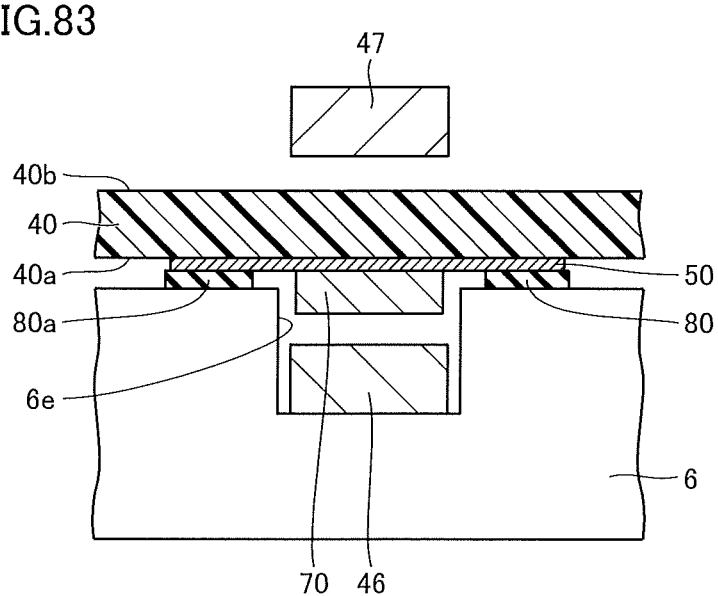
FIG. 83 is a schematic cross-sectional view taken along line LXXXIII-LXXXIII shown in FIG. 79 of the circuit device according to the ninth embodiment of the present invention.

Referring to FIG. 78, the coil pattern in circuit device 30h of the present embodiment has a circuit configuration of one-turn connection. Circuit device 30h of the present embodiment is configured such that first heat transfer members 73, 74, second coil pattern 55, and thermal via 131 are eliminated from circuit device 30g of the eighth embodiment.

Circuit device 30h of the present embodiment achieves similar effects as in circuit device 30g of the eighth embodiment, except the effects achieved by first heat transfer members 73, 74, second coil pattern 55, and thermal via 131.

Tenth Embodiment

Figure 84:
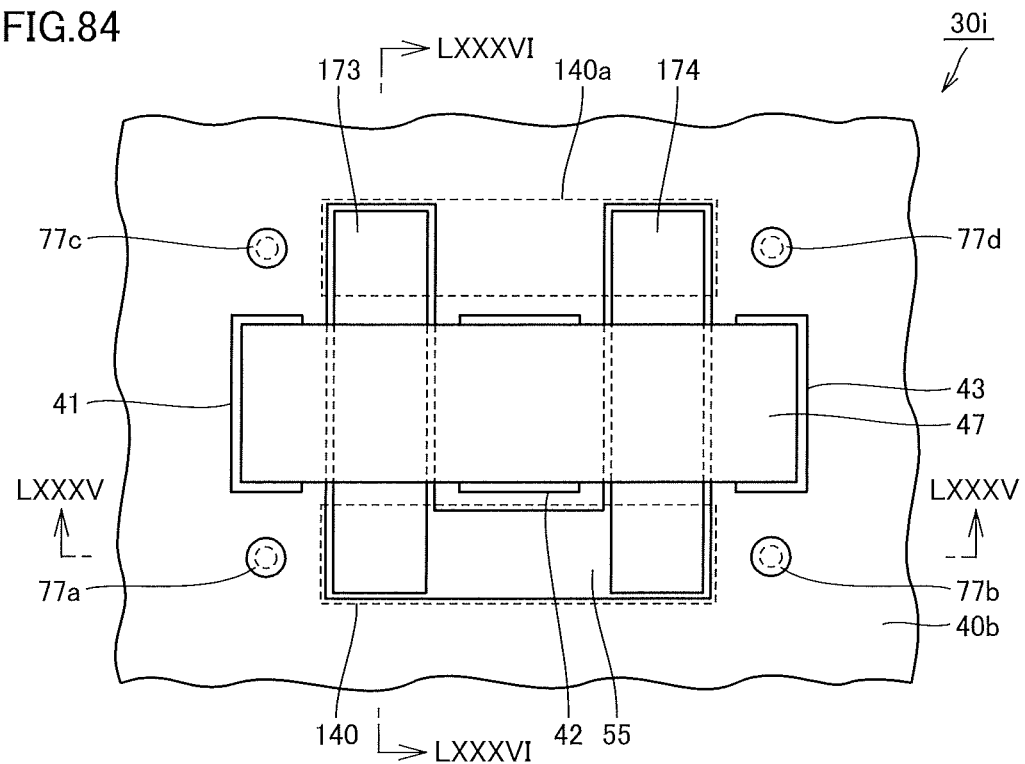
FIG. 84 is a schematic plan view of a circuit device according to a tenth embodiment of the present invention.
Figure 85:
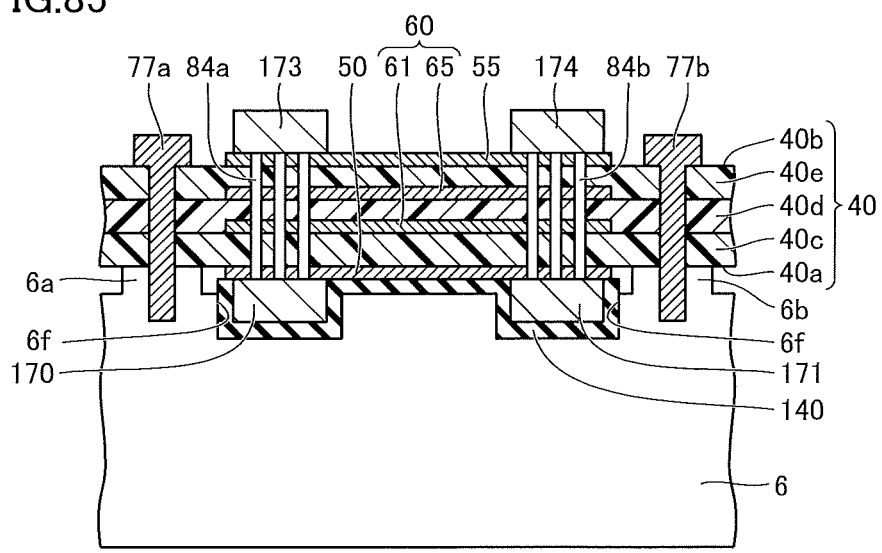
FIG. 85 is a schematic cross-sectional view taken along line LXXXV-LXXXV shown in FIG. 84 of the circuit device according to the tenth embodiment of the present invention.
Figure 86:
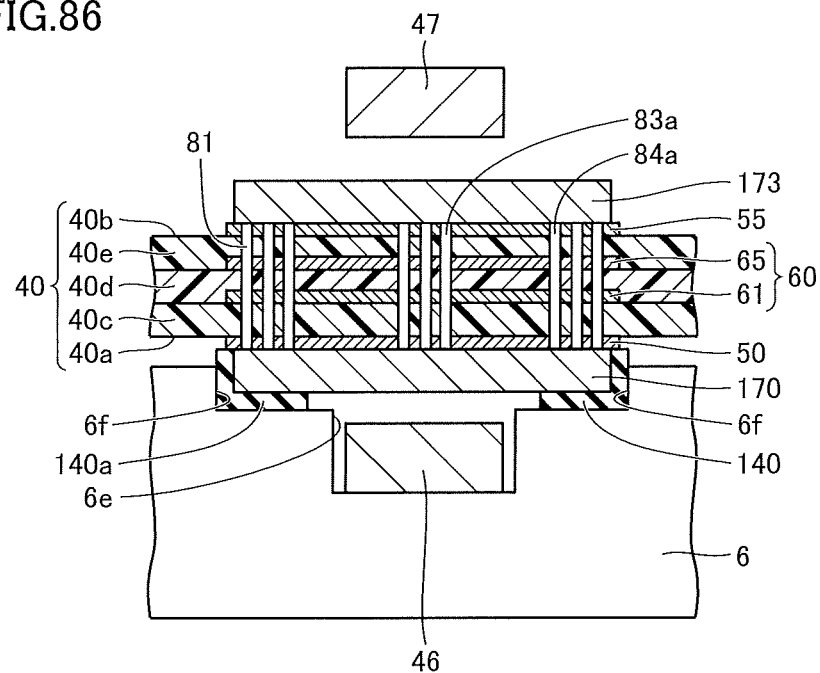
FIG. 86 is a schematic cross-sectional view taken along line LXXXVI-LXXXVI shown in FIG. 84 of the circuit device according to the tenth embodiment of the present invention.
Figure 87:
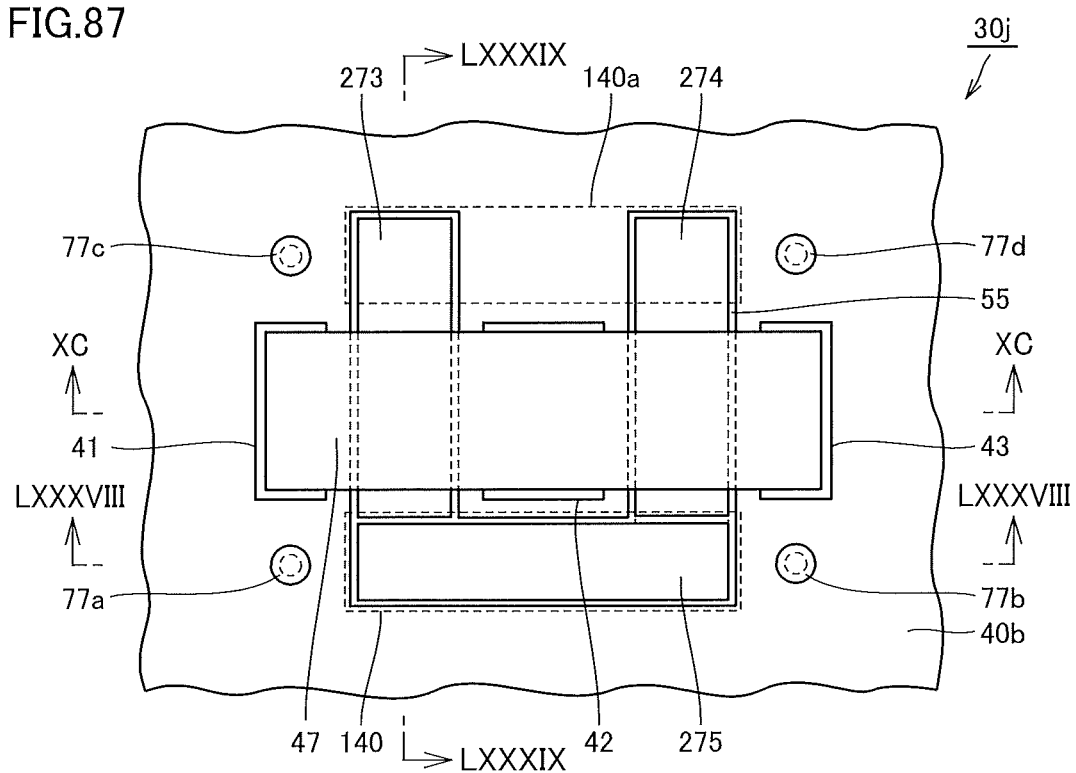
FIG. 87 is a schematic plan view of a circuit device according to an eleventh embodiment of the present invention.
Figure 88:
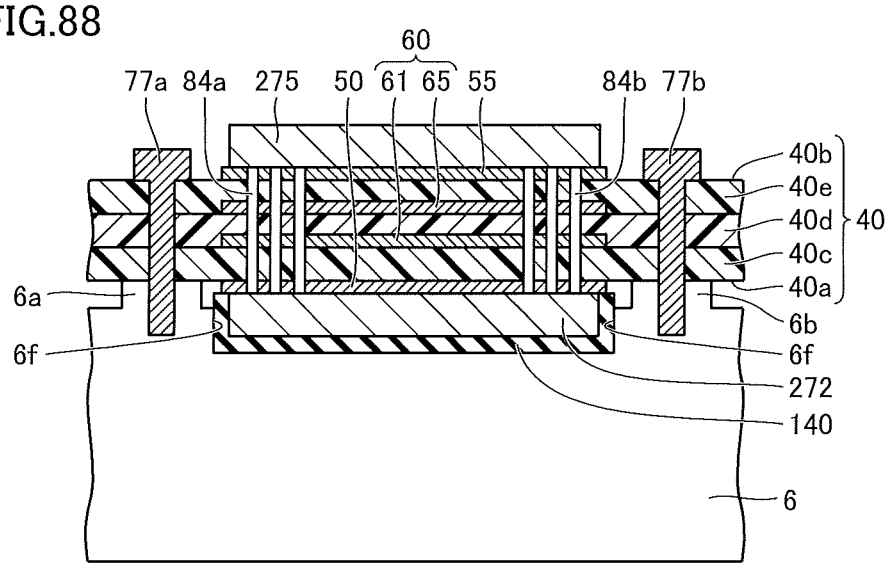
FIG. 88 is a schematic cross-sectional view taken along line LXXXVIII-LXXXVIII shown in FIG. 87 of the circuit device according to the eleventh embodiment of the present invention.
Figure 89:
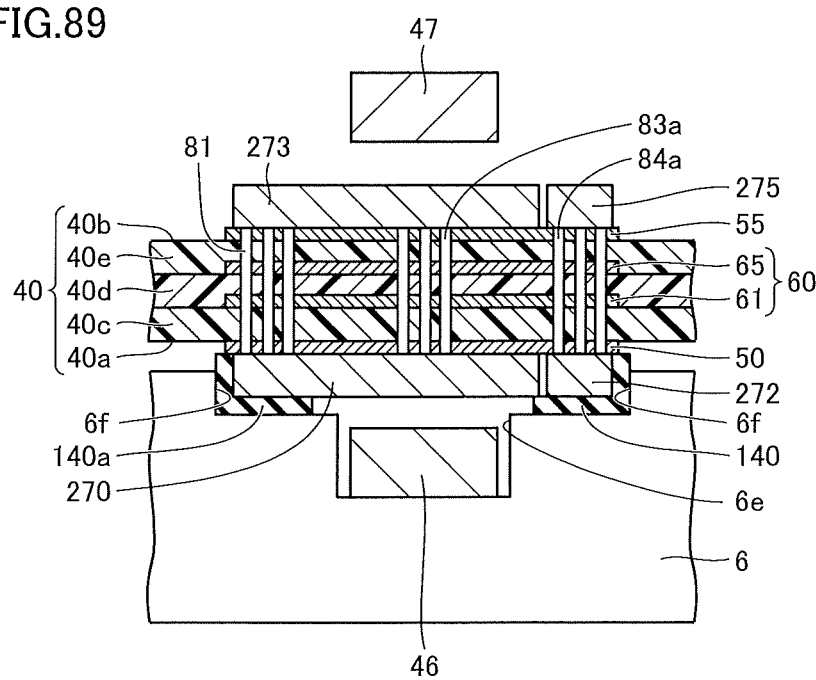
FIG. 89 is a schematic cross-sectional view taken along line LXXXIX-LXXXIX shown in FIG. 87 of the circuit device according to the eleventh embodiment of the present invention.
Figure 90:
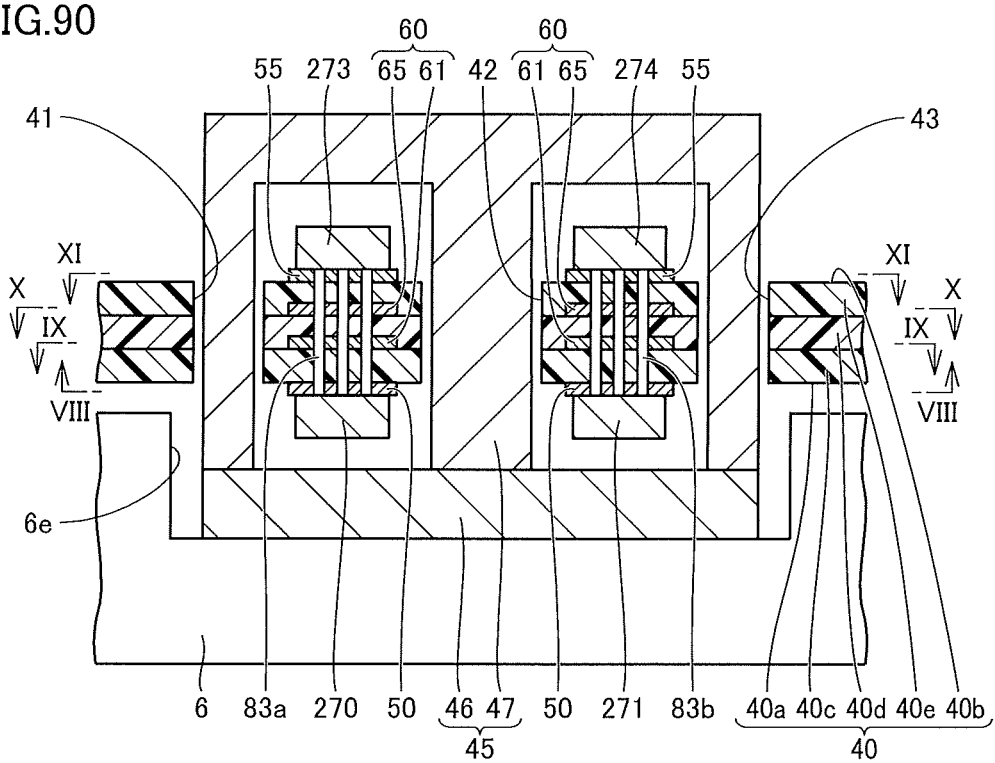
FIG. 90 is a schematic cross-sectional view taken along line XC-XC shown in FIG. 87 of the circuit device according to the eleventh embodiment of the present invention.
Figure 91:
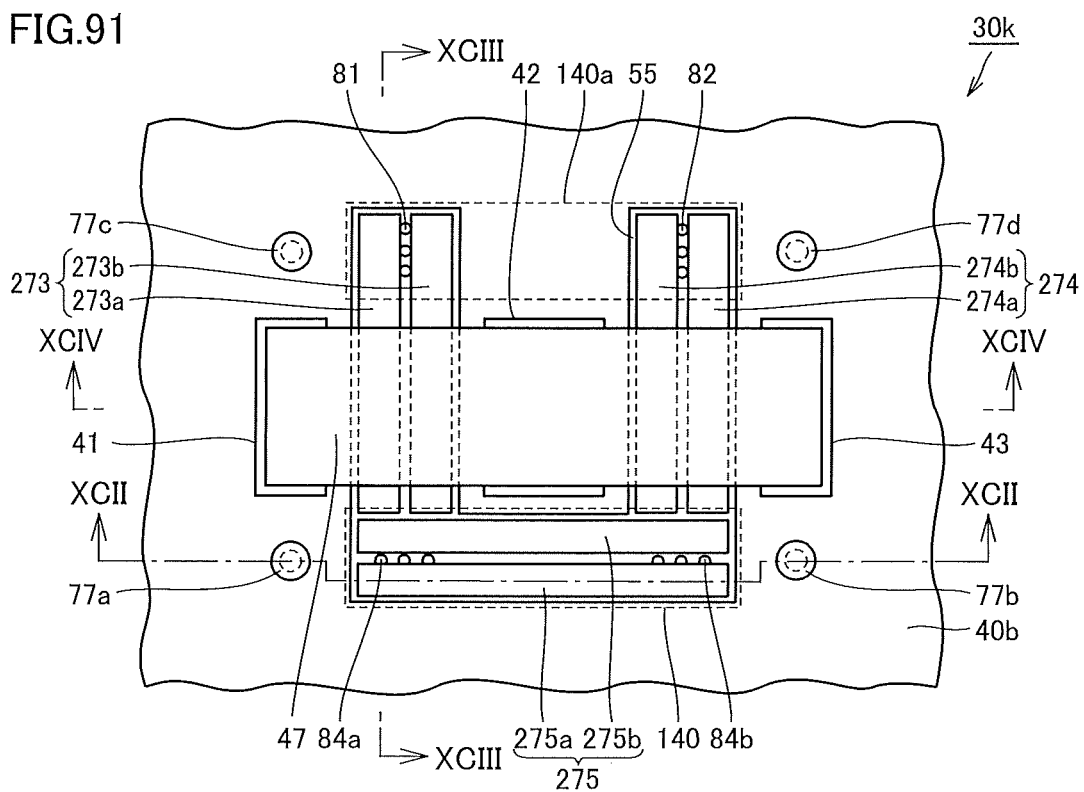
FIG. 91 is a schematic plan view of a circuit device according to a twelfth embodiment of the present invention.
Figure 92:
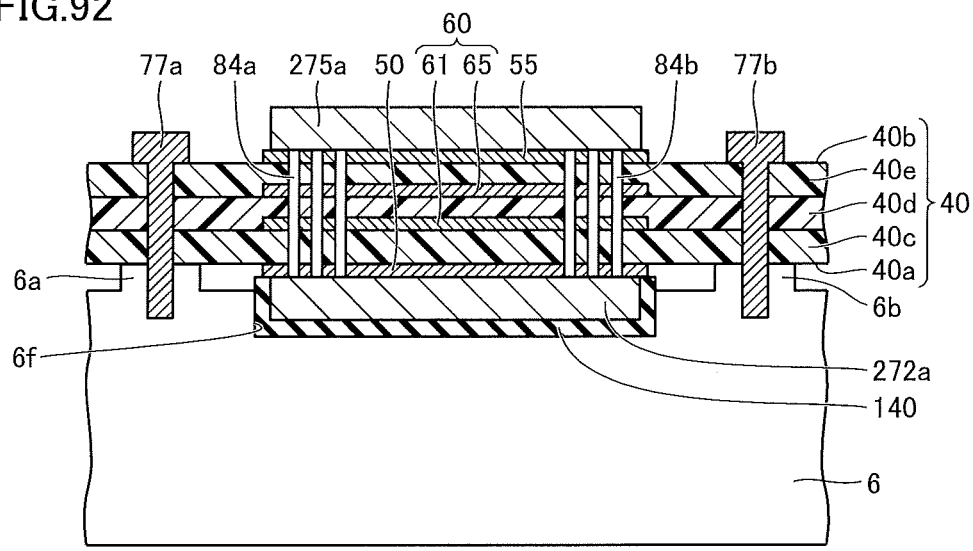
FIG. 92 is a schematic cross-sectional view taken along line XCII-XCII shown in FIG. 91 of the circuit device according to the twelfth embodiment of the present invention.
Figure 93:
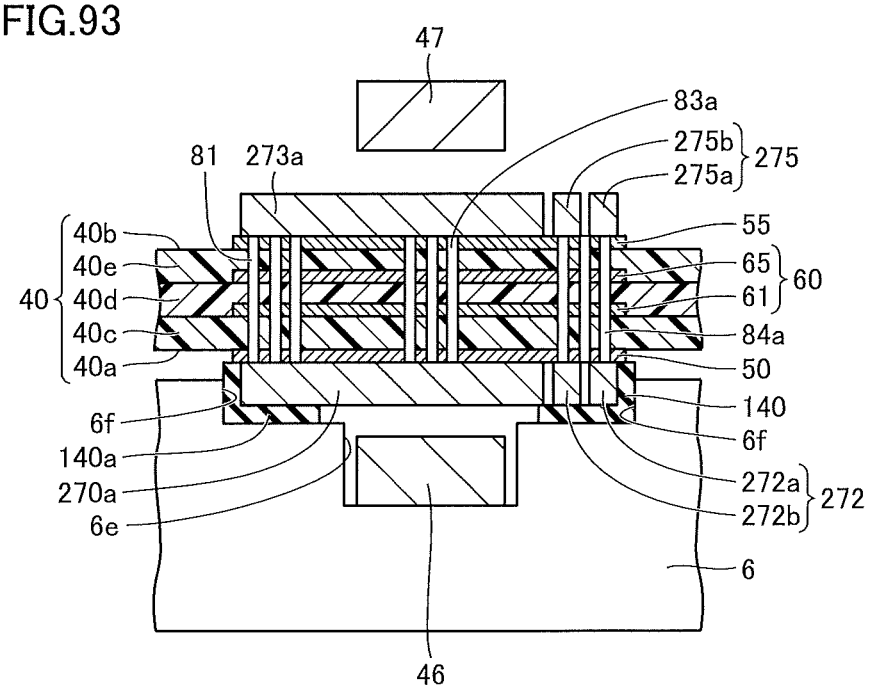
FIG. 93 is a schematic cross-sectional view taken along line XCIII-XCIII shown in FIG. 91 of the circuit device according to the twelfth embodiment of the present invention.
Figure 94:
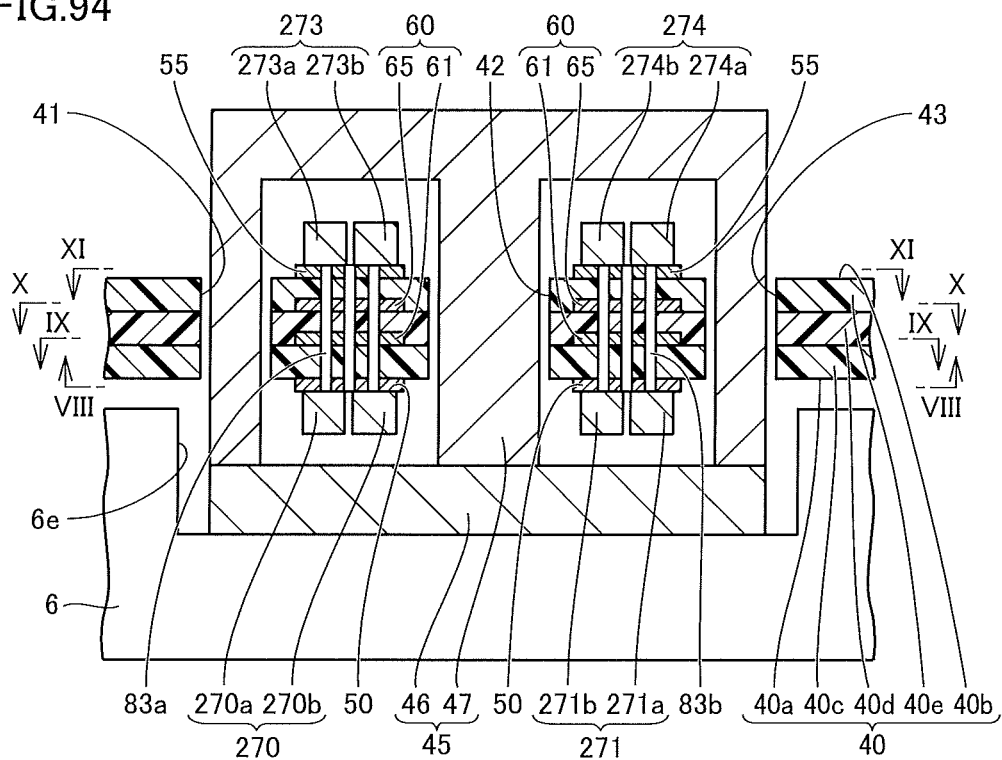
FIG. 94 is a schematic cross-sectional view taken along line XCIV-XCIV shown in FIG. 91 of the circuit device according to the twelfth embodiment of the present invention.
Figure 95:
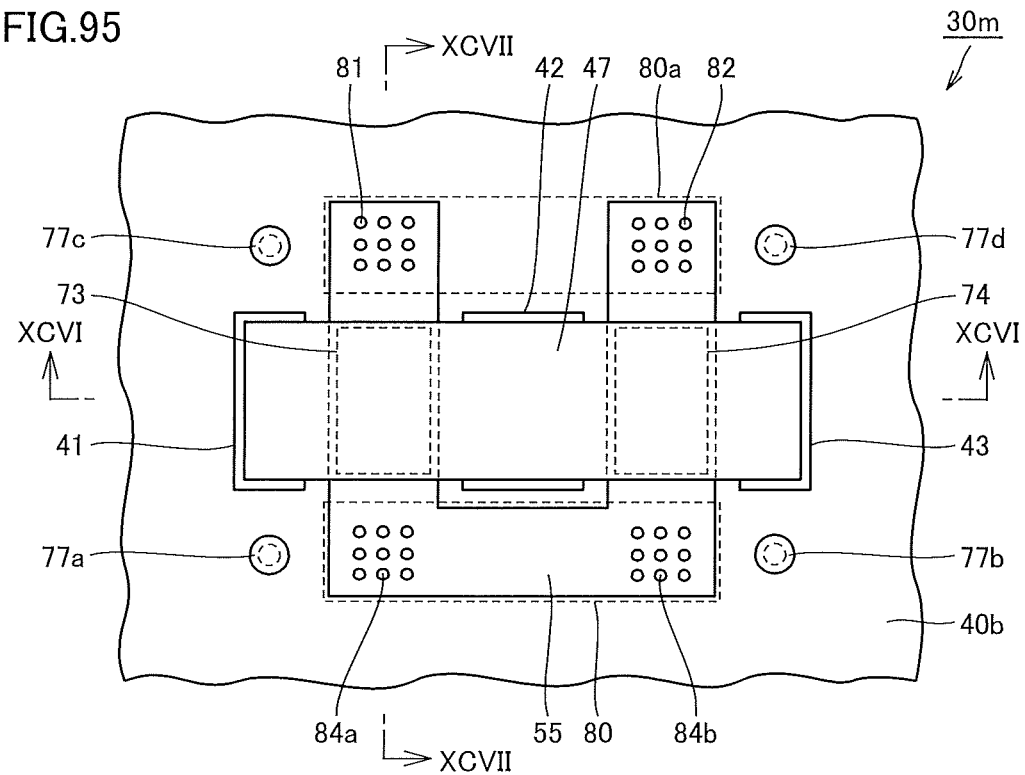
FIG. 95 is a schematic plan view of a circuit device according to a thirteenth embodiment of the present invention.
Figure 96:
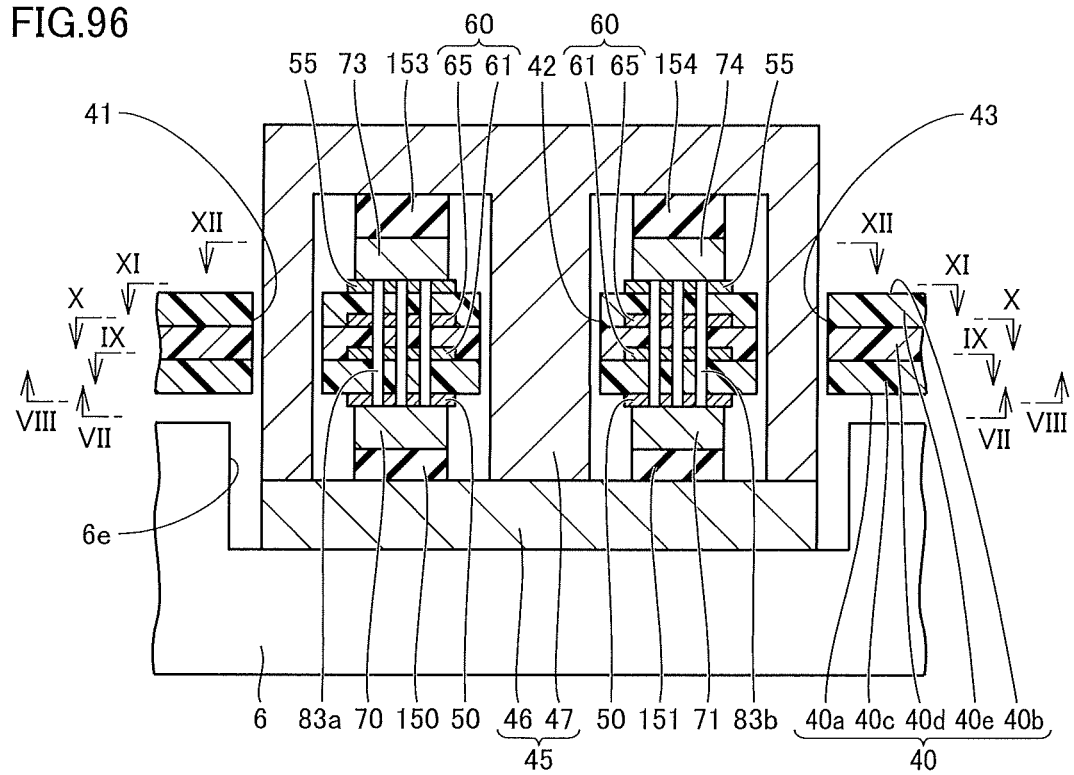
FIG. 96 is a schematic cross-sectional view taken along line XCVI-XCVI shown in FIG. 95 of the circuit device according to the thirteenth embodiment of the present invention.
Figure 97:
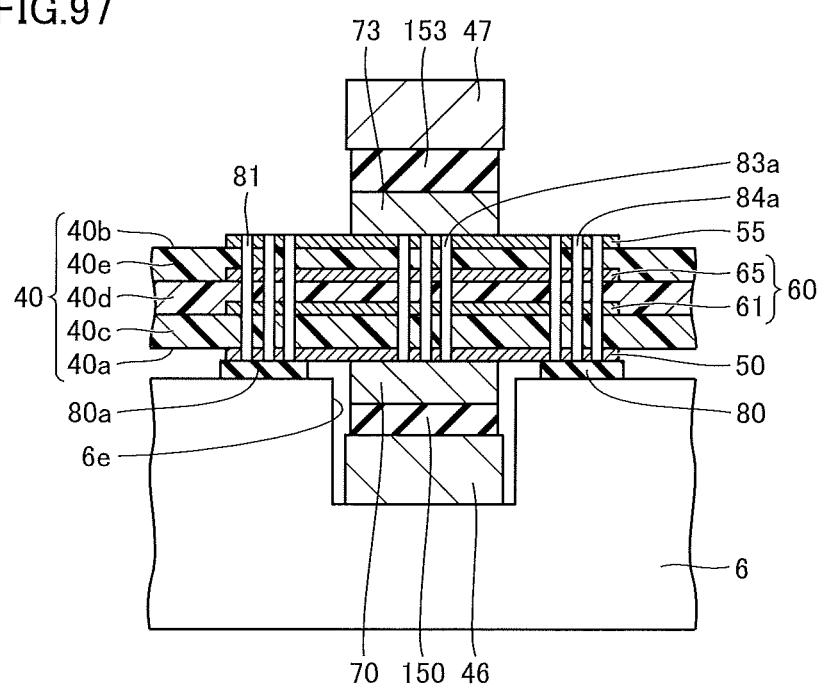
FIG. 97 is a schematic cross-sectional view taken along line XCVII-XCVII shown in FIG. 95 of the circuit device according to the thirteenth embodiment of the present invention.

Referring to FIG. 84 to FIG. 86, a circuit device 30i of a tenth embodiment will be described. Circuit device 30i of the present embodiment has a similar configuration to circuit device 30 of the first embodiment but differs mainly in the following points.

In circuit device 30i of the present embodiment, first heat transfer members 170, 171 are further disposed on second portion 52 of first coil pattern 50, in addition to on first portion 51 of first coil pattern 50. Specifically, first heat transfer member 170 is disposed on first coil pattern 50 so as to connect thermal via 81 and thermal via 84a. First heat transfer member 171 is disposed on first coil pattern 50 so as to connect thermal via 82 and thermal via 84b. Heat dissipator 6 may have a second concave portion 6f accommodating first heat transfer members 170, 171 on second portion 52.

In circuit device 30i of the present embodiment, first heat transfer members 173, 174 are further disposed on fourth portion 57 of second coil pattern 55, in addition to on third portion 56 of second coil pattern 55. Specifically, first heat transfer member 173 is disposed on second coil pattern 55 so as to connect thermal via 81 and thermal via 84a. First heat transfer member 174 is disposed on second coil pattern 55 so as to connect thermal via 82 and thermal via 84b.

Circuit device 30i of the present embodiment may include second heat transfer members 140, 140a having electrical insulation properties between heat dissipator 6 and first coil pattern 50. Second heat transfer members 140, 140a in the present embodiment have a similar configuration to second heat transfer members 80, 80a in the first embodiment but differ mainly in the following points.

Second heat transfer members 140, 140a are disposed not only between heat dissipator 6 and first coil pattern 50 but also between heat dissipator 6 and first heat transfer members 170, 171. Second heat transfer members 140, 140a are in surface contact with heat dissipator 6 and second portion 52 of first coil pattern 50. First coil pattern 50 is thus connected to heat dissipator 6 with low thermal resistance through second heat transfer members 140, 140a. Second heat transfer members 140, 140a are further in surface contact with heat dissipator 6 and first heat transfer members 170, 171. First heat transfer members 170, 171 are thus connected to heat dissipator 6 with low thermal resistance through second heat transfer members 140, 140a. Second heat transfer members 140, 140a may cover the surface of first heat transfer members 170, 171 exposed from first coil pattern 50.

The reason why temperature increase of first portion 51 of first coil pattern 50 arranged between first core portion 46 and second core portion 47 can be further suppressed in circuit device 30i of the present embodiment will be described.

First heat transfer members 170, 171 in the present embodiment are in contact with first coil pattern 50 over an area larger than first heat transfer members 70, 71 in the first embodiment. Therefore, the electrical resistance of the portion including both of first heat transfer members 170, 171 and first coil pattern 50 in the present embodiment is lower than the electrical resistance of the portion including both of first heat transfer members 70, 71 and first coil pattern 50 in the first embodiment. In circuit device 30i according to the present embodiment, heat generated in first portion 51 of first coil pattern 50 arranged between first core portion 46 and second core portion 47 can be further suppressed.

The thermal resistance of the portion including both of first heat transfer members 170, 171 and first coil pattern 50 in the present embodiment is lower than the thermal resistance of the portion including both of first heat transfer members 70, 71 and first coil pattern 50 in the first embodiment. In circuit device 30i according to the present embodiment, heat generated in first portion 51 of first coil pattern 50 is even less likely to be accumulated in first portion 51 of first coil pattern 50 and first heat transfer members 170, 171 and is spread to second portion 52 of first coil pattern 50 with even lower thermal resistance. As a result, in circuit device 30i according to the present embodiment, temperature increase of first portion 51 of first coil pattern 50 arranged between first core portion 46 and second core portion 47 can be further suppressed.

First heat transfer members 170, 171 on first coil pattern 50 may have a surface area larger than first heat transfer members 70, 71 in the first embodiment. First heat transfer members 170, 171 on first coil pattern 50 can spread heat generated in first portion 51 of first coil pattern 50 to second portion 52 of first coil pattern 50 with further lower thermal resistance. Heat generated in first portion 51 of first coil pattern 50 is thus dissipated from the surfaces of first heat transfer members 170, 171 and the surface of first coil pattern 50 to the surrounding atmosphere.

First heat transfer members 170, 171 in the present embodiment are connected to heat dissipator 6 with low thermal resistance. Specifically, first heat transfer members 170, 171 are in surface contact with second heat transfer members 140, 140a, and second heat transfer members 140, 140a are in surface contact with heat dissipator 6. First heat transfer members 170, 171 are thus thermally connected to heat dissipator 6 through second heat transfer members 140, 140a. Heat generated in first portion 51 of first coil pattern 50, therefore, can be transferred to heat dissipator 6 with further lower thermal resistance, through first heat transfer members 170, 171 and second heat transfer members 140, 140a. As a result, in circuit device 30i according to the present embodiment, temperature increase of first portion 51 of first coil pattern 50 arranged between first core portion 46 and second core portion 47 can be further suppressed.

The reason why temperature increase of third portion 56 of second coil pattern 55 arranged between first core portion 46 and second core portion 47 can be further suppressed in circuit device 30*i* of the present embodiment will be described.

First heat transfer members 173, 174 in the present embodiment are in contact with second coil pattern 55 over an area larger than first heat transfer members 73, 74 in the first embodiment. Therefore, the electrical resistance of the portion including both of first heat transfer members 173, 174 and second coil pattern 55 in the present embodiment is lower than the electrical resistance of the portion including both of first heat transfer members 73, 74 and second coil pattern 55 in the first embodiment. In circuit device 30*i* according to the present embodiment, heat generated in third portion 56 of second coil pattern 55 arranged between first core portion 46 and second core portion 47 can be further reduced.

The thermal resistance of the portion including both of first heat transfer members 173, 174 and second coil pattern 55 in the present embodiment is lower than the thermal resistance of the portion including both of first heat transfer members 73, 74 and second coil pattern 55 in the first embodiment. In circuit device 30*i* according to the present embodiment, heat generated in third portion 56 of second coil pattern 55 is even less likely to be accumulated in third portion 56 of second coil pattern 55 and first heat transfer members 173, 174 and is spread to fourth portion 57 of second coil pattern 55 with even lower thermal resistance. As a result, in circuit device 30*i* according to the present embodiment, temperature increase of third portion 56 of second coil pattern 55 arranged between first core portion 46 and second core portion 47 can be further suppressed.

First heat transfer members 173, 174 on second coil pattern 55 may have a surface area larger than first heat transfer members 73, 74 in the first embodiment. First heat transfer members 173, 174 on second coil pattern 55 can spread heat generated in third portion 56 of second coil pattern 55 to fourth portion 57 of second coil pattern 55 with further lower thermal resistance. Heat generated in third portion 56 of second coil pattern 55 is thus dissipated from the surfaces of first heat transfer members 173, 174 and the surface of second coil pattern 55 to the surrounding atmosphere.

As described above, first heat transfer members 170, 171 in the present embodiment are connected to heat dissipator 6 with low thermal resistance. Therefore, heat generated in third portion 56 of second coil pattern 55 can be transferred to heat dissipator 6 with further lower thermal resistance, through thermal vias 81, 82, 83*a*, 83*b*, 84*a*, 84*b*, first heat transfer members 170, 171, and second heat transfer members 140, 140*a*. As a result, in circuit device 30*i* according to the present embodiment, temperature increase of third portion 56 of second coil pattern 55 arranged between first core portion 46 and second core portion 47 can be further suppressed.

The reason why temperature increase of the portion of first internal coil pattern 61 that is arranged between first core portion 46 and second core portion 47 can be further suppressed in circuit device 30*i* of the present embodiment is similar to the reason why temperature increase of first portion 51 of first coil pattern 50 and third portion 56 of second coil pattern 55 can be further suppressed. Specifically, thermal vias 81, 82, 83*a*, 83*b*, 84*a*, 84*b*, first heat transfer members 170, 171, 173, 174, and second heat transfer members 140, 140*a* allow heat generated in the portion of first internal coil pattern 61 that is arranged between first core portion 46 and second core portion 47 to dissipate with further lower thermal resistance from the surfaces of first heat transfer members 170, 171, 173, 174, the surface of first coil pattern 50, the surface of second coil pattern 55, and heat dissipator 6 to the outside of circuit device 30*i*. In circuit device 30*i* according to the present embodiment, temperature increase of the portion of first internal coil pattern 61 that is arranged between first core portion 46 and second core portion 47 can be suppressed.

The reason why temperature increase of the portion of second internal coil pattern 65 that is arranged between first core portion 46 and second core portion 47 can be further suppressed in circuit device 30*i* of the present embodiment is similar to the reason why temperature increase of first portion 51 of first coil pattern 50 and third portion 56 of second coil pattern 55 can be further suppressed. Specifically, thermal vias 81, 82, 83*a*, 83*b*, 84*a*, 84*b*, first heat transfer members 170, 171, 173, 174, and second heat transfer members 140, 140*a* allow heat generated in the portion of second internal coil pattern 65 that is arranged between first core portion 46 and second core portion 47 to dissipate with further lower thermal resistance from the surfaces of first heat transfer members 170, 171, 173, 174, the surface of first coil pattern 50, the surface of second coil pattern 55, and heat dissipator 6 to the outside of circuit device 30*i*. In circuit device 30*i* according to the present embodiment, temperature increase of the portion of second internal coil pattern 65 that is arranged between first core portion 46 and second core portion 47 can be suppressed.

The effects of circuit device 30*i* of the present embodiment will be described. Circuit device 30*i* of the present embodiment achieves similar effects as in circuit device 30 of the first embodiment but differs mainly in the following points.

In circuit device 30*i* of the present embodiment, first heat transfer members 170, 171, 173, 174 may be additionally disposed on at least one of second portion 52 of first coil pattern 50 and the fourth portion. First heat transfer members 170, 171, 173, 174 in the present embodiment are in contact with one of first coil pattern 50 and second coil pattern 55 over an area larger than first heat transfer members 70, 71, 73, 74 in the first embodiment. First heat transfer members 170, 171, 173, 174 may have a surface area larger than first heat transfer members 70, 71, 73, 74 in the first embodiment. In circuit device 30*i* according to the present embodiment, temperature increase of at least one of first portion 51 and third portion 56 can be further suppressed.

Circuit device 30*i* of the present embodiment may further include second heat transfer members 140, 140*a* having electrical insulation properties between heat dissipator 6 and first heat transfer members 170, 171. Therefore, heat generated in first portion 51 of first coil pattern 50 may be transferred to heat dissipator 6 with further lower thermal resistance. In circuit device 30*i* according to the present embodiment, temperature increase of first portion 51 of first coil pattern 50 can be further suppressed. Since heat dissipator 6 is electrically insulated from first heat transfer members 170, 171 by second heat transfer members 140, 140*a*, heat dissipator 6 and first heat transfer members 170, 171 may be formed of a material having high thermal conductivity and high electrical conductivity, such as metal.

Eleventh Embodiment

Referring to FIG. 8 to FIG. 11 and FIG. 87 to FIG. 90, a circuit device 30*j* of an eleventh embodiment will be described. Circuit device 30*j* of the present embodiment has a similar configuration to circuit device 30*i* of the tenth embodiment but differs mainly in the following points.

In circuit device 30*j* of the present embodiment, a first heat transfer member 272 is additionally disposed on second portion 52 of first coil pattern 50. Specifically, first heat transfer member 272 may extend along the longitudinal direction of first coil pattern 50 on second portion 52 of first coil pattern 50. First heat transfer member 272 may be disposed between mounting member 77*a* and mounting member 77*b*. First heat transfer member 272 may be disposed on first coil pattern 50 so as to connect thermal via 84*a* and thermal via 84*b*.

First heat transfer member 270 is disposed on first coil pattern 50 so as to connect one end portion of first coil pattern 50 with first portion 51 of first coil pattern 50. First heat transfer member 270 is disposed on first coil pattern 50 so as to connect thermal via 81 and thermal via 83*a*. In a plain view from a direction vertical to first main surface 40*a*, first heat transfer member 270 may extend beyond core 45 on the thermal via 84*a* side.

First heat transfer member 271 is disposed on first coil pattern 50 so as to connect the other end portion of first coil pattern 50 with first portion 51 of first coil pattern 50. First heat transfer member 271 is disposed on first coil pattern 50 so as to connect thermal via 82 and thermal via 83*b*. In a plain view from a direction vertical to first main surface 40*a*, first heat transfer member 271 may extend beyond core 45 on the thermal via 84*b* side. First heat transfer members 270, 271 on first portion 51 of first coil pattern 50 may be separate from or may be integrated with first heat transfer member 272 on second portion 52 of first coil pattern 50.

In circuit device 30*j* of the present embodiment, a first heat transfer member 275 is additionally disposed on fourth portion 57 of second coil pattern 55. Specifically, first heat transfer member 275 may extend along the longitudinal direction of second coil pattern 55 on fourth portion 57 of second coil pattern 55. First heat transfer member 275 may be disposed between mounting member 77*a* and mounting member 77*b*. First heat transfer member 275 may be disposed on second coil pattern 55 so as to connect thermal via 84*a* and thermal via 84*b*.

First heat transfer member 273 is disposed on second coil pattern 55 so as to connect one end portion of second coil pattern 55 with third portion 56 of second coil pattern 55. First heat transfer member 273 is disposed on second coil pattern 55 so as to connect thermal via 81 and thermal via 83*a*. In a plain view from a direction vertical to second main surface 40*b*, first heat transfer member 273 may extend beyond core 45 on the thermal via 84*a* side.

First heat transfer member 274 is disposed on second coil pattern 55 so as to connect the other end portion of second coil pattern 55 with third portion 56 of second coil pattern 55. First heat transfer member 274 is disposed on second coil pattern 55 so as to connect thermal via 82 and thermal via 83*b*. In a plain view from a direction vertical to second main surface 40*b*, first heat transfer member 274 may extend beyond core 45 on the thermal via 84*b* side. First heat transfer members 273, 274 on third portion 56 of second coil pattern 55 may be separate from or may be integrated with first heat transfer member 275 on fourth portion 57 of second coil pattern 55.

The effects of circuit device 30*j* of the present embodiment will be described. Circuit device 30*j* of the present embodiment achieves similar effects as in circuit device 30*i* of the tenth embodiment but differs mainly in the following points.

In circuit device 30*j* of the present embodiment, first heat transfer members 270, 271, 272, 273, 274, 275 may extend along the direction in which current flows in at least one of first coil pattern 50 and second coil pattern 55, in at least one of second portion 52 and fourth portion 57. First heat transfer members 270, 271, 272, 273, 274, 275 in the present embodiment are in contact with at least one of first coil pattern 50 and second coil pattern 55 over an area larger than first heat transfer members 70, 71, 73, 74 in the first embodiment. First heat transfer members 270, 271, 272, 273, 274, 275 on first coil pattern 50 may have a surface area larger than first heat transfer members 70, 71, 73, 74 in the first embodiment. In circuit device 30*j* according to the present embodiment, temperature increase of at least one of first portion 51 and third portion 56 can be further suppressed.

In circuit device 30*j* of the present embodiment, the longitudinal direction of first heat transfer member 272 and the longitudinal direction of second heat transfer member 140 are along the direction in which current flows in first coil pattern 50. Therefore, when printed circuit board 40 is mounted on heat dissipator 6 using mounting members 77*a*, 77*b*, second heat transfer member 140 can be in contact with first coil pattern 50 over a large area. Furthermore, the repulsion force in the longitudinal direction of second heat transfer member 140 that is received by printed circuit board 40 when printed circuit board 40 is mounted on heat dissipator 6 using mounting members 77*a*, 77*b* is larger than the repulsion force in the lateral direction of second heat transfer member 140. Since first heat transfer member 272 improves the rigidity of printed circuit board 40, first heat transfer member 272 can prevent printed circuit board 40 from receiving repulsion force from second heat transfer member 140 and being warped. This further ensures that second heat transfer member 80 is in contact with first coil pattern 50 over a large area. In circuit device 30*j* according to the present embodiment, temperature increase of first coil pattern 50 can be further suppressed.

When printed circuit board 40 is mounted on heat dissipator 6 using mounting members 77*a*, 77*b*, second heat transfer member 140 can be crushed by printed circuit board 40 having rigidity improved by first heat transfer member 272. Second heat transfer member 140 crushed by printed circuit board 40 has further lower thermal resistance. In circuit device 30*j* according to the present embodiment, temperature increase of first coil pattern 50 can be further suppressed.

In circuit device 30*j* of the present embodiment, first heat transfer member 272 on second portion 52 of first coil pattern 50 may be separate from first heat transfer members 270, 271 on first portion 51 of first coil pattern 50. Even when first coil pattern 50 has a complicated shape, and first heat transfer members 270, 271 and first heat transfer member 272 have a simple shape, such as a rectangular parallelepiped, first heat transfer members 270, 271 and first heat transfer member 272 can be in contact with first coil pattern 50 over a wide area by combining first heat transfer members 270, 271 and first heat transfer member 272 separate from each other.

In circuit device 30*j* of the present embodiment, first heat transfer member 275 on fourth portion 57 of second coil pattern 55 may be separate from first heat transfer members 273, 274 on third portion 56 of second coil pattern 55. Even when second coil pattern 55 has a complicated shape, and first heat transfer members 273, 274 and first heat transfer member 275 have a simple shape, such as a rectangular parallelepiped, first heat transfer members 273, 274 and first heat transfer member 275 can be in contact with second coil pattern 55 over a wide area by combining first heat transfer members 273, 274 and first heat transfer member 275 separate from each other.

Twelfth Embodiment

Referring to FIG. 8 to FIG. 11 and FIG. 91 to FIG. 94, a circuit device 30k of a twelfth embodiment will be described. Circuit device 30k of the present embodiment has a similar configuration to circuit device 30j of the eleventh embodiment but differs mainly in the following points.

In circuit device 30k of the present embodiment, a first heat transfer member 270 is formed with a plurality of heat transfer portions 270a, 270b. Specifically, first heat transfer member 270 is divided into a plurality of heat transfer portions 270a, 270b along the longitudinal direction of first coil pattern 50. Heat transfer portion 270a is positioned outside (on the first leg 47a side), and heat transfer portion 270b is positioned inside (on the second leg 47b side).

In circuit device 30k of the present embodiment, a first heat transfer member 271 is formed with a plurality of heat transfer portions 271a, 271b. Specifically, first heat transfer member 271 is divided into a plurality of heat transfer portions 271a, 271b along the longitudinal direction of first coil pattern 50. Heat transfer portion 271a is positioned outside (on the third leg 47c side), and heat transfer portion 271b is positioned inside (on the second leg 47b side).

In circuit device 30k of the present embodiment, a first heat transfer member 272 is formed with a plurality of heat transfer portions 272a, 272b. Specifically, first heat transfer member 272 is divided into a plurality of heat transfer portions 272a, 272b along the longitudinal direction of first coil pattern 50. Heat transfer portion 272a is positioned outside, and heat transfer portion 272b is positioned inside (on the second leg 47b side).

In circuit device 30k of the present embodiment, a first heat transfer member 273 is formed with a plurality of heat transfer portions 273a, 273b. Specifically, first heat transfer member 273 is divided into a plurality of heat transfer portions 273a, 273b along the longitudinal direction of first coil pattern 50. Heat transfer portion 273a is positioned outside (on the first leg 47a side), and heat transfer portion 273b is positioned inside (on the second leg 47b side).

In circuit device 30k of the present embodiment, a first heat transfer member 274 is formed with a plurality of heat transfer portions 274a, 274b. Specifically, first heat transfer member 274 is divided into a plurality of heat transfer portions 274a, 274b along the longitudinal direction of first coil pattern 50. Heat transfer portion 274a is positioned outside (on the third leg 47c side), and heat transfer portion 274b is positioned inside (on the second leg 47b side).

In circuit device 30k of the present embodiment, a first heat transfer member 275 is formed with a plurality of heat transfer portions 275a, 275b. Specifically, first heat transfer member 275 is divided into a plurality of heat transfer portions 275a, 275b along the longitudinal direction of first coil pattern 50. Heat transfer portion 275a is positioned outside, and heat transfer portion 275b is positioned inside (on the second leg 47b side).

A plurality of heat transfer portions 270a, 270b, 271a, 271b, 272a, 272b may be mounted on first coil pattern 50 using solder. A plurality of heat transfer portions 273a, 273b, 274a, 274b, 275a, 275b may be mounted on second coil pattern 55 using solder.

The effects of circuit device 30k of the present embodiment will be described. Circuit device 30k of the present embodiment achieves similar effects as in circuit device 30j of the eleventh embodiment but differs mainly in the following points. In circuit device 30k of the present embodiment, first heat transfer member 270 is formed with a plurality of heat transfer portions 270a, 270b. Since the volume of each of heat transfer portions 270a, 270b in the present embodiment is smaller than the volume of first heat transfer member 270 in the eleventh embodiment, the thermal capacity of each of heat transfer portions 270a, 270b in the present embodiment is smaller than the thermal capacity of first heat transfer member 270 in the eleventh embodiment. Therefore, the temperature of the surrounding atmosphere can be reduced when a plurality of heat transfer portions 270a, 270b are soldered on first coil pattern 50. In circuit device 30k according to the present embodiment, damage to printed circuit board 40, core 45, and components on printed circuit board 40 by heat during solder reflow can be prevented, and destruction of printed circuit board 40, core 45, and components on printed circuit board 40 by the heat can be prevented.

When first heat transfer member 270 is soldered on first coil pattern 50, flux contained in solder is vaporized into gas. The gas stays in the solder to form a void in the solder. The void reduces the bonding strength between first heat transfer member 270 and first coil pattern 50 and increases the thermal resistance between first heat transfer member 270 and first coil pattern 50. In circuit device 30k of the present embodiment, first heat transfer member 270 is formed with a plurality of heat transfer portions 270a, 270b. Therefore, this gas escapes from between heat transfer portion 270a and heat transfer portion 270b to the surrounding atmosphere. Circuit device 30k of the present embodiment can suppress formation of a void in the solder. Circuit device 30k of the present embodiment can suppress reduction in bonding strength between first heat transfer member 270 and first coil pattern 50 and can suppress increase in thermal resistance between first heat transfer member 270 and first coil pattern 50. In circuit device 30k according to the present embodiment, temperature increase of first portion 51 of first coil pattern 50 arranged between first core portion 46 and second core portion 47 can be suppressed.

First heat transfer member 271 is faulted with a plurality of heat transfer portions 271a, 271b. First heat transfer member 272 is formed with a plurality of heat transfer portions 272a, 272b. First heat transfer member 273 is formed with a plurality of heat transfer portions 273a, 273b. First heat transfer member 274 is formed with a plurality of heat transfer portions 274a, 274b. First heat transfer member 275 is formed with a plurality of heat transfer portions 275a, 275b. A plurality of heat transfer portions 271a, 271b, 272a, 272b, 273a, 273b, 274a, 274b, 275a, 275b achieve similar effects as in a plurality of heat transfer portions 270a, 270b.

Thirteenth Embodiment

Referring to FIG. 7 to FIG. 12 and FIG. 95 to FIG. 97, a circuit device 30m of a thirteenth embodiment will be described. Circuit device 30m of the present embodiment has a similar configuration to circuit device 30 of the first embodiment and achieves similar effects, but differs mainly in the following points.

Circuit device 30m of the present embodiment further includes third heat transfer members 150, 151 between core 45 and first heat transfer members 70, 71. Third heat transfer members 150, 151 have a thermal conductivity higher than first base layer 40c, second base layer 40d, and third base layer 40e of printed circuit board 40. Third heat transfer members 150, 151 may have a thermal conductivity twice or more, further preferably four times or more the thermal conductivity of first base layer 40c, second base layer 40d, and third base layer 40e of printed circuit board 40. Third heat transfer members 150, 151 may be crushed by core 45 and first heat transfer members 70, 71. Third heat transfer members 150, 151 crushed by core 45 and first heat transfer members 70, 71 have further lower thermal resistance. Third heat transfer members 150, 151 may be silicone rubber sheets. Third heat transfer members 150, 151 may have electrical insulation properties. Third heat transfer members 150, 151 may be formed of the same material as second heat transfer members 80, 80a.

Because of loss, such as eddy current loss and hysteresis loss, in core 45, heat is generated in core 45 during operation of circuit device 30m. Third heat transfer members 150, 151 disposed between core 45 and first heat transfer members 70, 71 allow heat generated in core 45 to be transferred to first heat transfer members 70, 71, 73, 74, first coil pattern 50, second coil pattern 55, and heat dissipator 6 with low thermal resistance. In circuit device 30m according to the present embodiment, temperature increase of core 45 can be suppressed during operation of circuit device 30m.

Circuit device 30m of the present embodiment further includes third heat transfer members 153, 154 between core 45 and first heat transfer members 73, 74. Third heat transfer members 153, 154 have a thermal conductivity higher than first base layer 40c, second base layer 40d, and third base layer 40e of printed circuit board 40. Third heat transfer members 153, 154 may have a thermal conductivity twice or more, further preferably four times or more the first base layer 40c, second base layer 40d, and third base layer 40e of printed circuit board 40. Third heat transfer members 153, 154 may be crushed by core 45 and first heat transfer members 73, 74. Third heat transfer members 153, 154 crushed by core 45 and first heat transfer members 73, 74 have further lower thermal resistance. Third heat transfer members 153, 154 may be silicone rubber sheets. Third heat transfer members 153, 154 may have electrical insulation properties. Third heat transfer members 153, 154 may be formed of the same material as second heat transfer members 80, 80a.

Because of loss, such as eddy current loss and hysteresis loss, in core 45, heat is generated in core 45 during operation of circuit device 30m. Third heat transfer members 153, 154 disposed between core 45 and first heat transfer members 73, 74 allow heat generated in core 45 to be transferred to first heat transfer members 70, 71, 73, 74, first coil pattern 50, second coil pattern 55, and heat dissipator 6 with low thermal resistance. In circuit device 30m according to the present embodiment, temperature increase of core 45 can be suppressed during operation of circuit device 30m.

It should be understood that the embodiments disclosed here are illustrative and not limitative in all respects. For example, at least two of the technical matters disclosed here may be combined without contradiction. The circuit configuration of the coil pattern may be changed as desired. Although second core portion 47 is disposed on first core portion 46 in the first to thirteenth embodiments, first core portion 46 may be disposed on second core portion 47. The scope of the present invention is shown not in the foregoing description but in the claims, and it is intended that all modifications and equivalents thereof within the scope of the claims are embraced here.

REFERENCE SIGNS LIST 1 power conversion device, 6 heat dissipator, 6a, 6b, 6c, 6d convex portion, 6e first concave portion, 6f second concave portion, 10 input terminal, 11 inverter circuit, 12A, 12B, 12C, 12D primary-side switching element, 14 rectifying circuit, 15A, 15B, 15C, 15D secondary-side switching element, 16 smoothing circuit, 17 smoothing coil, 18 capacitor, 19 transformer, 19A primary-side coil conductor, 19B secondary-side coil conductor, 20 output terminal, 30, 30a, 30b, 30c, 30d, 30e, 30f, 30g, 30h, 30i, 30j, 30k, 30m circuit device, 40 printed circuit board, 40a first main surface, 40b second main surface, 40c first base layer, 40d second base layer, 40e third base layer, 40h, 40i, 40j, 40k hole, 41 first through hole, 42 second through hole, 43 third through hole, 45 core, 46 first core portion, 47 second core portion, 47a first leg, 47b second leg, 47c third leg, 50 first coil pattern, 51 first portion, 52 second portion, 53 first extension portion, 55 second coil pattern, 56 third portion, 57 fourth portion, 58, 62, 66 second extension portion, 60 third coil pattern, 61 first internal coil pattern, 65 second internal coil pattern, 70, 71, 73, 74, 170, 171, 173, 174, 270, 271, 272, 273, 274, 275 first heat transfer member, 77a, 77b, 77c, 77d mounting member, 80, 80a, 140, 140a second heat transfer member, 81, 82, 83a, 83b, 84a, 84b, 91, 92, 93, 94, 95, 101a, 101b, 102a, 102b, 111, 112, 121, 122, 123, 131 thermal via, 81c heat transfer film, 81c1 heat transfer element, 81h through hole, 96, 96a, 116, 126, 127 first thermal pad, 97, 97a second thermal pad, 98, 98a, 99, 99a third thermal pad, 150, 151, 153, 154 third heat transfer member, 270a, 270b, 271a, 271b, 272a, 272b, 273a, 273b, 274a, 274b, 275a, 275b heat transfer portion.

The invention claimed is:

1. A circuit device comprising:
a printed circuit board having a first main surface and a second main surface opposite to the first main surface;
a core, the core including a first core portion positioned over the first main surface and spaced away from the first main surface and a second core portion positioned over the second main surface and spaced away from the second main surface, the core including a through portion passing between the first main surface and the second main surface,
the printed circuit board including at least one of a first coil pattern disposed on the first main surface and a second coil pattern disposed on the second main surface, the at least one of the first coil pattern and the second coil pattern surrounding the through portion of the core with half a turn or more,
the first coil pattern including a first portion arranged between the first core portion and the second core portion and a second portion exposed from at least one of the first core portion and the second core portion in a plain view from a direction vertical to the first main surface,
the second coil pattern including a third portion arranged between the first core portion and the second core portion and a fourth portion exposed from at least one of the first core portion and the second core portion in a plain view from a direction vertical to the second main surface; and
a first heat transfer member on at least one of the first portion and the third portion,
the first heat transfer member being mounted on the at least one of the first portion and the third portion,
the first heat transfer member being electrically connected to the at least one of the first portion and the third portion,
the first heat transfer member having a cross-sectional area larger than the at least one of the first portion and the third portion in a cross section crossing a direction in which current flows in the at least one of the first coil pattern and the second coil pattern, the first heat transfer member having an electrical resistance lower than the at least one of the first portion and the third portion and being spaced away from the core.

2. The circuit device according to claim 1, wherein the first heat transfer member is further disposed on at least one of the second portion and the fourth portion.

3. The circuit device according to claim 2, wherein the first heat transfer member extends along the direction in which the current flows in the at least one of the first coil pattern and the second coil pattern, in the at least one of the second portion and the fourth portion.

4. The circuit device according to claim 1, wherein the first heat transfer member is formed with a plurality of heat transfer portions.

5. The circuit device according to claim 1, further comprising a heat dissipator thermally connected to at least one of the second portion and the fourth portion.

6. The circuit device according to claim 5, wherein the heat dissipator forms a part of a housing accommodating the printed circuit board.

7. The circuit device according to claim 5, further comprising a second heat transfer member having electrical insulation properties, wherein the printed circuit board includes the first coil pattern, and the second heat transfer member is disposed between the heat dissipator and the first coil pattern.

8. The circuit device according to claim 5, further comprising a second heat transfer member having electrical insulation properties between the heat dissipator and the first heat transfer member.

9. The circuit device according to claim 7, further comprising a plurality of mounting members configured to mount the printed circuit board on the heat dissipator, wherein the plurality of mounting members are disposed along a longitudinal direction of the second heat transfer member such that the second heat transfer member is arranged therebetween, and the longitudinal direction of the second heat transfer member is along the direction in which the current flows in the first coil pattern.

10. The circuit device according to claim 1, wherein the printed circuit board includes the first coil pattern and at least one of the second coil pattern and a third coil pattern, the third coil pattern being inside the printed circuit board, the at least one of the second coil pattern and the third coil pattern surrounding the through portion of the core with half a turn or more, the printed circuit board includes a thermal via, and the thermal via connects the at least one of the second coil pattern and the third coil pattern to the first coil pattern.

11. The circuit device according to claim 10, wherein the thermal via connects the at least one of the second coil pattern and the third coil pattern to the first portion of the first coil pattern.

12. The circuit device according to claim 10, wherein the first coil pattern includes a first extension portion at a position outside a current path of the first coil pattern, the first extension portion being a partially extended portion of the first coil pattern, and the thermal via connects the at least one of the second coil pattern and the third coil pattern to the first extension portion of the first coil pattern.

13. The circuit device according to claim 12, wherein the at least one of the second coil pattern and the third coil pattern includes a second extension portion at a position outside a current path of the at least one of the second coil pattern and the third coil pattern, the second extension portion being a partially extended portion of the at least one of the second coil pattern and the third coil pattern, and the thermal via connects the second extension portion of the at least one of the second coil pattern and the third coil pattern to the first extension portion of the first coil pattern.

14. The circuit device according to claim 5, wherein the printed circuit board includes the first coil pattern and a first thermal pad that is disposed on the first main surface and spaced away from the first coil pattern, and the first thermal pad is thermally connected to the heat dissipator.

15. The circuit device according to claim 14, wherein the printed circuit board includes at least one of the second coil pattern and a third coil pattern, the third coil pattern being inside the printed circuit board, the at least one of the second coil pattern and the third coil pattern surrounding the through portion of the core with half a turn or more, the printed circuit board includes a thermal via, and the thermal via connects the at least one of the second coil pattern and the third coil pattern to the first thermal pad.

16. The circuit device according to claim 15, wherein the at least one of the second coil pattern and the third coil pattern includes a second extension portion at a position outside a current path of the at least one of the second coil pattern and the third coil pattern, the second extension portion being a partially extended portion of the at least one of the second coil pattern and the third coil pattern, and the thermal via connects the second extension portion of the at least one of the second coil pattern and the third coil pattern to the first thermal pad.

17. The circuit device according to claim 1, further comprising a third heat transfer member between the core and the first heat transfer member.

18. A power conversion device comprising:
the circuit device of claim 1; and
a switching element connected to the circuit device.

* * * * *